(12) United States Patent
Ware et al.

(10) Patent No.: US 11,836,099 B2
(45) Date of Patent: *Dec. 5, 2023

(54) MEMORY SYSTEM WITH CACHED MEMORY MODULE OPERATIONS

(71) Applicant: Rambus Inc., San Jose, CA (US)

(72) Inventors: Frederick A. Ware, Los Altos Hills, CA (US); Kenneth L. Wright, Sunnyvale, CA (US); John Eric Linstadt, Palo Alto, CA (US); Craig Hampel, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/548,510

(22) Filed: Dec. 11, 2021

(65) Prior Publication Data

US 2022/0171721 A1 Jun. 2, 2022

Related U.S. Application Data

(63) Continuation of application No. 16/888,551, filed on May 29, 2020, now Pat. No. 11,210,242, which is a
(Continued)

(51) Int. Cl.
*G06F 13/16* (2006.01)
*G06F 12/0868* (2016.01)
(Continued)

(52) U.S. Cl.
CPC ........ *G06F 13/1678* (2013.01); *G06F 3/0604* (2013.01); *G06F 3/0613* (2013.01);
(Continued)

(58) Field of Classification Search
None
See application file for complete search history.

(56) References Cited

U.S. PATENT DOCUMENTS

| 6,889,304 B2 | 5/2005 | Perego et al. |
| 7,269,708 B2 | 9/2007 | Ware |

(Continued)

FOREIGN PATENT DOCUMENTS

| CN | 101689145 A | 3/2010 |
| CN | 102508787 A | 6/2012 |

(Continued)

OTHER PUBLICATIONS

Ashok K. Sharma, "ApplicationSpecific DRAM Architectures and Designs," in Advanced Semiconductor Memories: Architectures, Designs, and Applications, IEEE, 2003, pp. 237-317, doi: 10.1109/9780470544136.ch4. (Year: 2003).*

(Continued)

*Primary Examiner* — Daniel F. McMahon
(74) *Attorney, Agent, or Firm* — Lance Kreisman; Peninsula Patent Group

(57) ABSTRACT

Memory controllers, devices, modules, systems and associated methods are disclosed. In one embodiment, a memory module includes a pin interface for coupling to a bus. The bus has a first width. The module includes at least one storage class memory (SCM) component and at least one DRAM component. The memory module operates in a first mode that utilizes all of the first width, and in a second mode that utilizes less than all of the first width.

20 Claims, 52 Drawing Sheets

Related U.S. Application Data continuation of application No. 15/761,746, filed as application No. PCT/US2016/051141 on Sep. 9, 2016, now Pat. No. 10,678,719.

(60) Provisional application No. 62/271,551, filed on Dec. 28, 2015, provisional application No. 62/235,660, filed on Oct. 1, 2015.

(51) Int. Cl.
| | |
|---|---|
| *G06F 12/0888* | (2016.01) |
| *G11C 7/10* | (2006.01) |
| *G06F 3/06* | (2006.01) |
| *G06F 11/10* | (2006.01) |
| *G06F 12/0895* | (2016.01) |
| *G06F 13/28* | (2006.01) |
| *G11C 29/52* | (2006.01) |

(52) U.S. Cl.
CPC .......... *G06F 3/0619* (2013.01); *G06F 3/0634* (2013.01); *G06F 3/0656* (2013.01); *G06F 3/0673* (2013.01); *G06F 11/1004* (2013.01); *G06F 11/1068* (2013.01); *G06F 12/0868* (2013.01); *G06F 12/0888* (2013.01); *G06F 12/0895* (2013.01); *G06F 13/28* (2013.01); *G11C 7/10* (2013.01); *G11C 29/52* (2013.01); *G06F 2212/1016* (2013.01); *G06F 2212/1032* (2013.01); *G06F 2212/403* (2013.01)

(56) References Cited

U.S. PATENT DOCUMENTS

| | | | |
|---|---|---|---|
| 8,397,013 B1 | 3/2013 | Rosenband et al. | |
| 8,427,891 B2 | 4/2013 | Best | |
| 8,745,315 B2 | 6/2014 | Ware et al. | |
| 8,874,827 B2 | 10/2014 | Guo et al. | |
| 8,874,831 B2 | 10/2014 | Lee et al. | |
| 8,914,568 B2 | 12/2014 | Chinnaswamy et al. | |
| 9,165,639 B2 | 10/2015 | Ware et al. | |
| 2003/0061447 A1 | 3/2003 | Perego et al. | |
| 2004/0213058 A1* | 10/2004 | Shimizu | G11C 29/4401 365/201 |
| 2004/0256638 A1 | 12/2004 | Perego et al. | |
| 2007/0058410 A1 | 3/2007 | Rajan | |
| 2007/0195613 A1 | 8/2007 | Rajan et al. | |
| 2008/0256417 A1 | 10/2008 | Andersson | |
| 2010/0115191 A1 | 5/2010 | Hampel et al. | |
| 2011/0047440 A1* | 2/2011 | Blackmon | G06F 11/141 714/764 |
| 2011/0205796 A1* | 8/2011 | Kim | G11C 29/82 365/185.17 |
| 2012/0137055 A1 | 5/2012 | Lee et al. | |
| 2012/0204079 A1* | 8/2012 | Takefman | G06F 12/0246 710/308 |
| 2013/0268728 A1 | 10/2013 | Ramanujan et al. | |
| 2014/0040550 A1 | 2/2014 | Nale et al. | |
| 2014/0047155 A1* | 2/2014 | Zheng | G11C 11/4076 710/310 |
| 2014/0050039 A1* | 2/2014 | Park | G11C 11/4091 365/230.03 |
| 2014/0101382 A1* | 4/2014 | Kaviani | G06F 3/0683 711/105 |
| 2014/0149775 A1 | 5/2014 | Ware | |
| 2014/0192583 A1 | 7/2014 | Rajan et al. | |
| 2014/0208156 A1 | 7/2014 | Muralimanohar et al. | |
| 2014/0321186 A1* | 10/2014 | Ware | G11C 29/808 365/51 |
| 2014/0351629 A1* | 11/2014 | Ware | G06F 11/1068 714/6.13 |
| 2015/0046631 A1 | 2/2015 | Prather | |
| 2015/0103479 A1 | 4/2015 | Ware et al. | |
| 2015/0201016 A1 | 7/2015 | Golander et al. | |
| 2015/0248327 A1* | 9/2015 | Ware | G06F 11/1048 714/773 |
| 2016/0179718 A1* | 6/2016 | Morris | G06F 13/28 710/308 |
| 2017/0289850 A1 | 10/2017 | Nale et al. | |
| 2020/0004627 A1 | 1/2020 | Sharon et al. | |
| 2020/0110716 A1 | 4/2020 | Mozak et al. | |
| 2020/0174705 A1 | 6/2020 | Qawami et al. | |

FOREIGN PATENT DOCUMENTS

| | | |
|---|---|---|
| CN | 103946811 A | 7/2014 |
| WO | WO-2011-081846 A2 | 7/2011 |
| WO | WO-2014-003764 A1 | 1/2014 |
| WO | WO-2015-042469 A1 | 3/2015 |

OTHER PUBLICATIONS

EP—Extended European Search Report dated Mar. 28, 2019 re: EP Appln. No. 16852294.4. 8 pages.

EP Communication Pursuant to Article 94(3) EPC dated Jan. 27, 2020 re: EP Appln. No. 16852294.4. 4 Pages.

EP Response Filed May 29, 2020 in Response to the Official Communication Pursuant to Article 94(3) EPC dated Jan. 27, 2020 re: EP Appln. No. 16852294.4. 10 Pages.

EP Response in Response to the Extended European Search Report dated Mar. 28, 2019 and the Communication Pursuant to Rules 70(2) and 70a(2) EPC dated Apr. 16, 2019 re: EP Appln. No. 16852294.4. 19 Pages.

Notification of Transmittal of the International Search Report and the Written Opinion of the International Searching Authority, or the Declaration dated Jan. 12, 2017 re: Int'l Appln. No. PCT/US16/051141. 17 Pages.

CN Office Action dated Oct. 21, 2021 re: CN Appln. No. 201680057520. 3. 18 pages. (w/Translation).

* cited by examiner

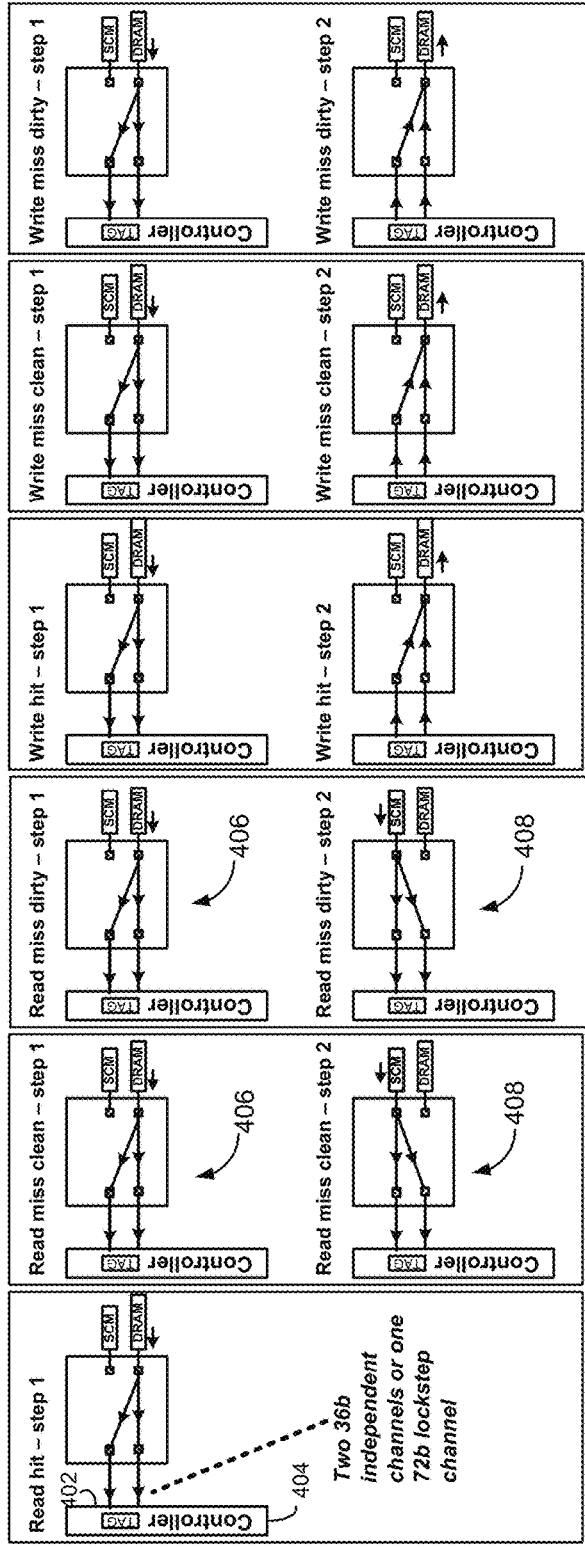

FIG. 4A  FIG. 4B  FIG. 4C  FIG. 4D  FIG. 4E  FIG. 4F

NOTES
+ TAG compare logic in controller
+ minimum impact to DRAM module
+ minimum read hit latency
+ full EDC of dirty miss data (writeback)
+ full EDC of dirty miss TAG (writeback)

Continuous BW summary – two 36b channels (as a fraction of 25.4GB/s = 36b@6.4Gb/s), link turnaround = 1.25ns = 0.5*tDATA
RH ~ 1.00x  RMC ~ 0.50x  RMD ~ 0.25x  WH ~ 0.33x  WMC ~ 0.33x  WMD ~ 0.25x
Continuous BW summary – one 72b channel (as a fraction of 50.8GB/s = 72b@6.4Gb/s), link turnaround = 1.25ns = 1.0*tDATA
RH ~ 1.00x  RMC ~ 0.50x  RMD ~ 0.20x  WH ~ 0.25x  WMC ~ 0.25x  WMD ~ 0.20x

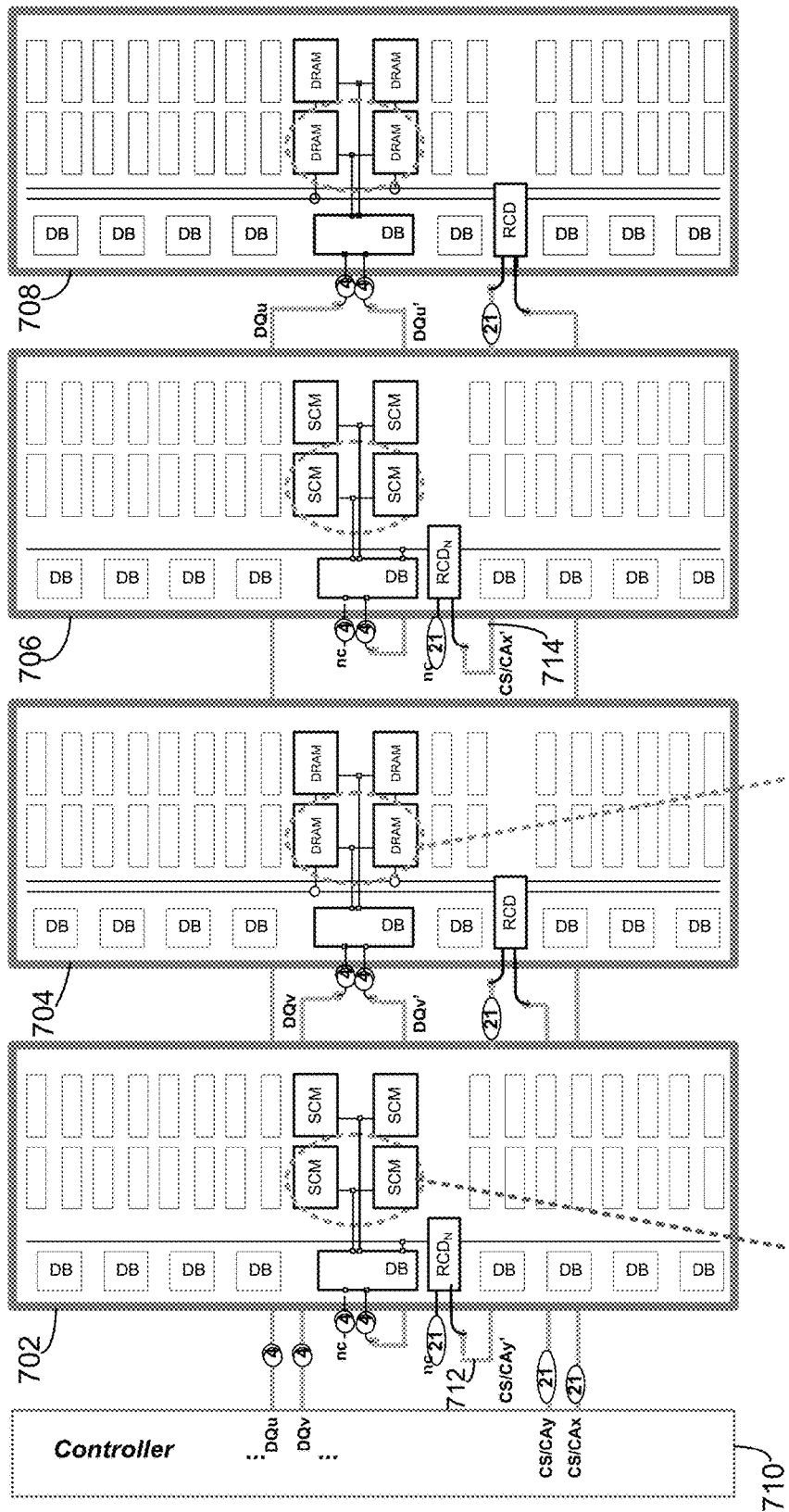
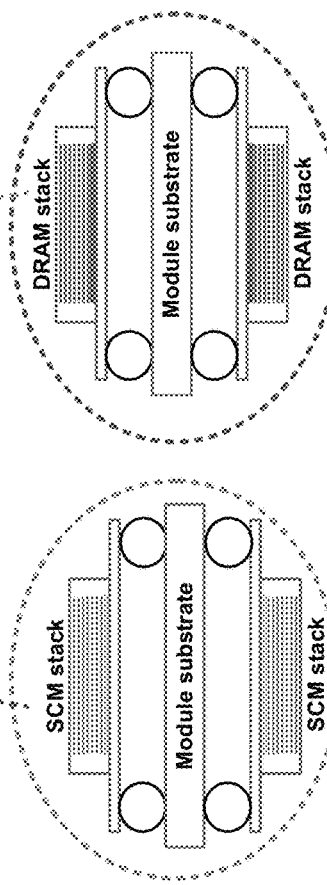
FIG. 7

FIG. 14
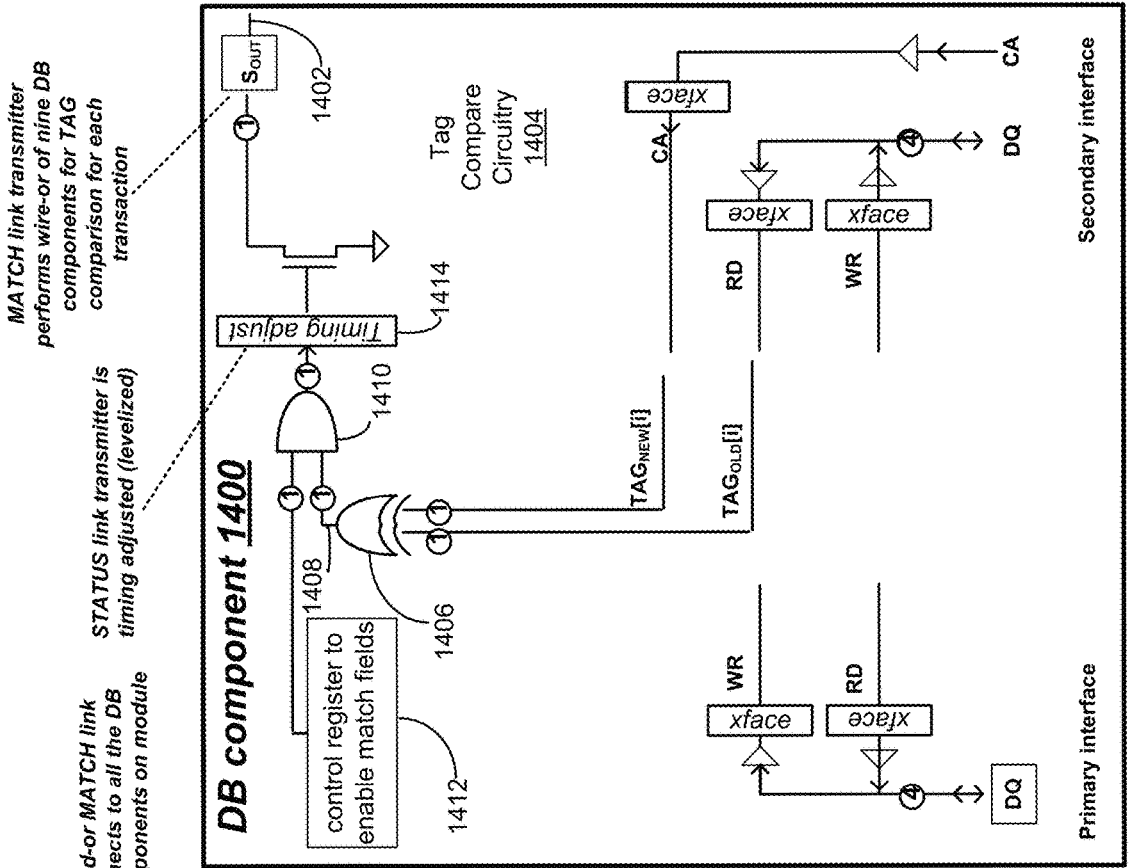
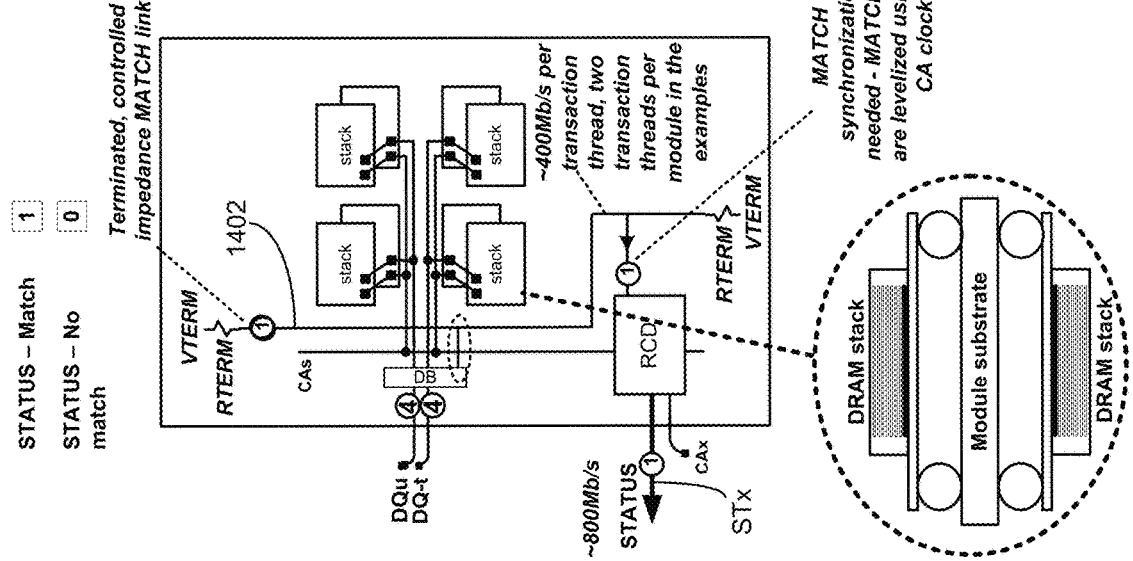

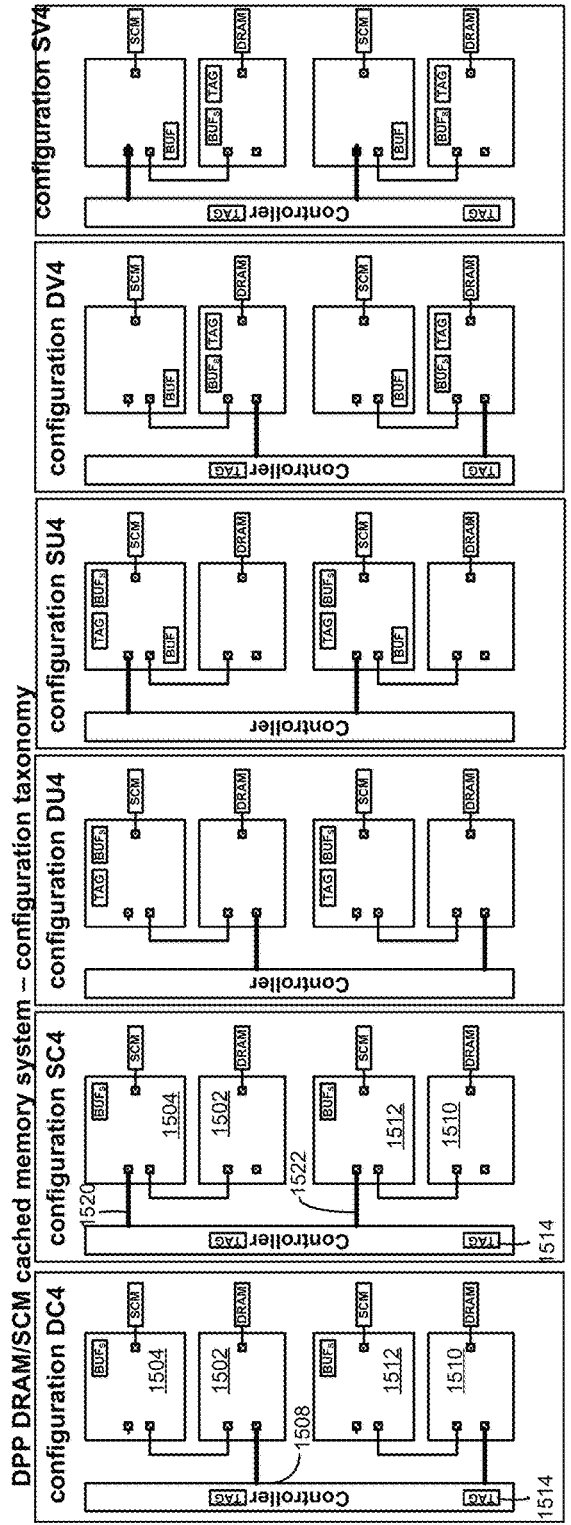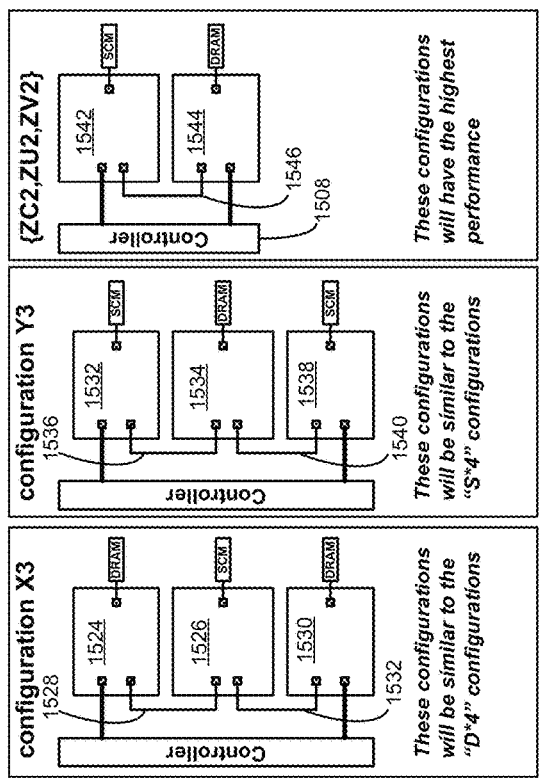

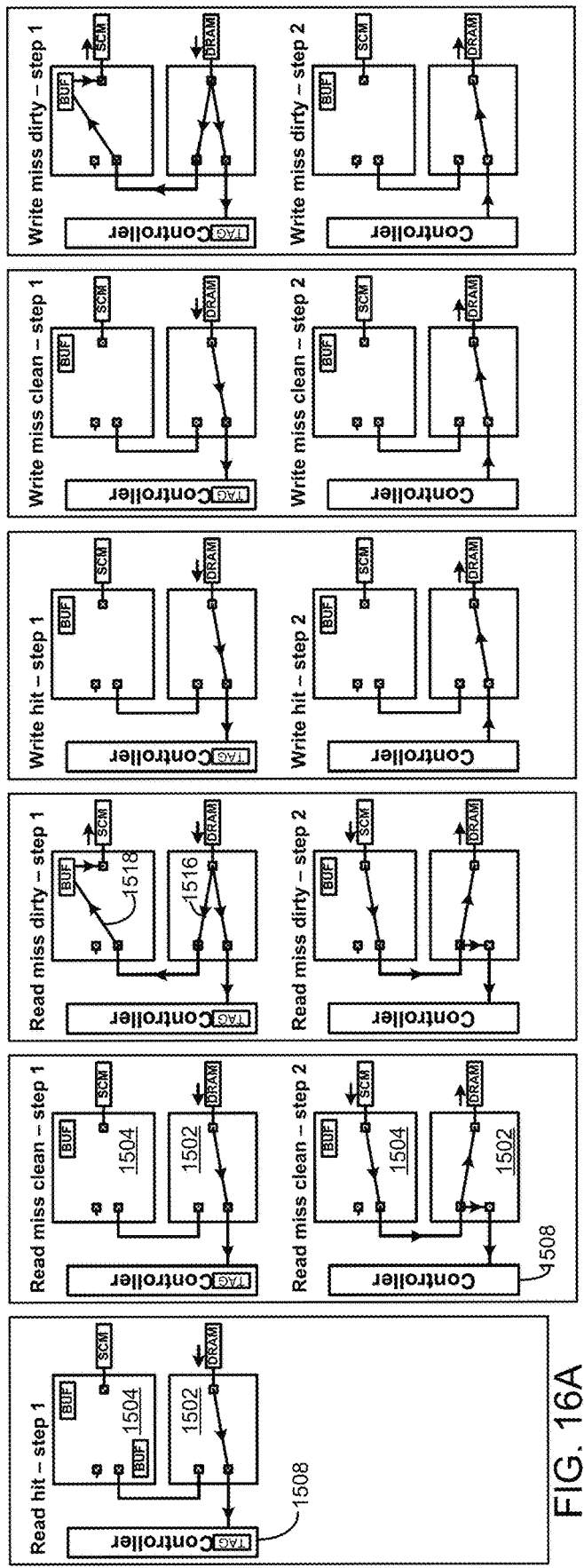

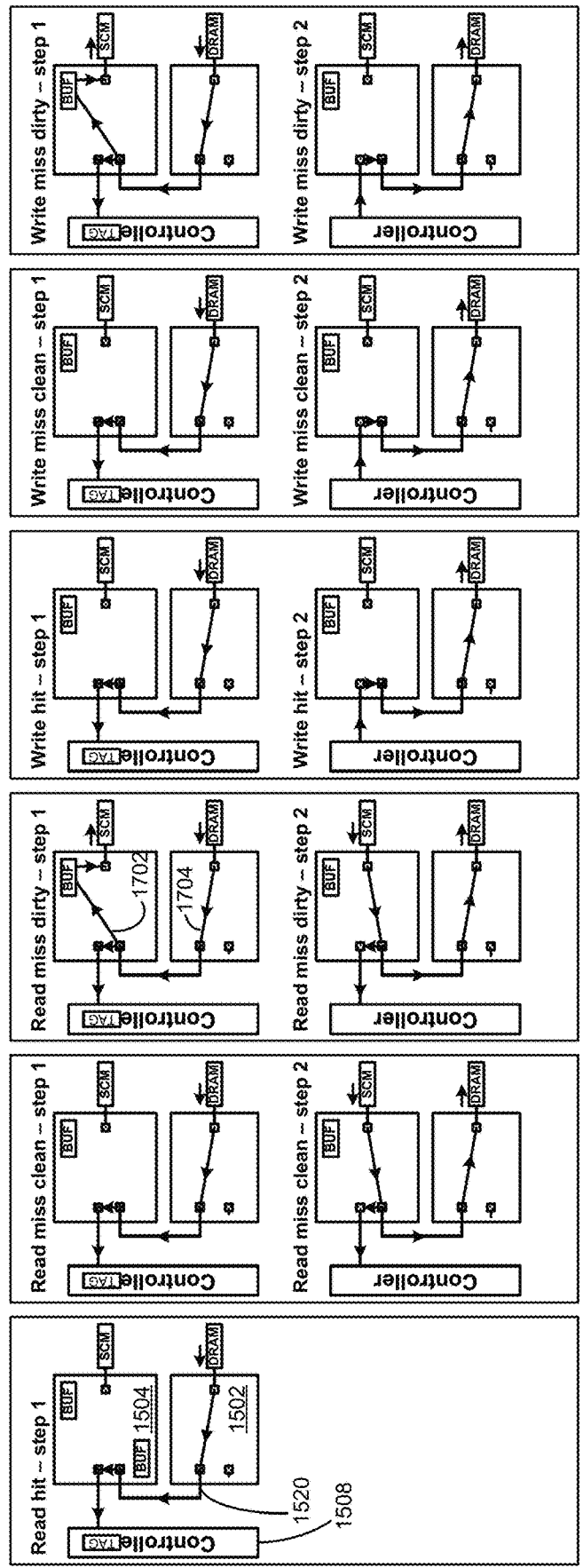

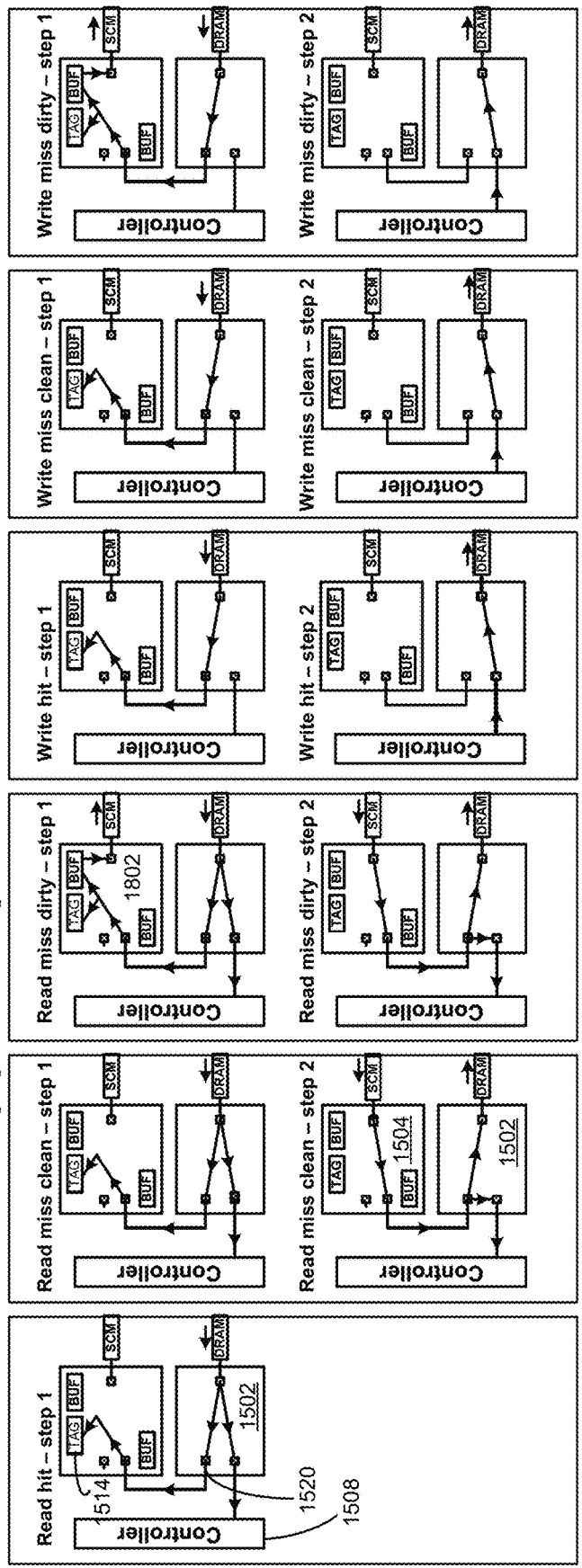

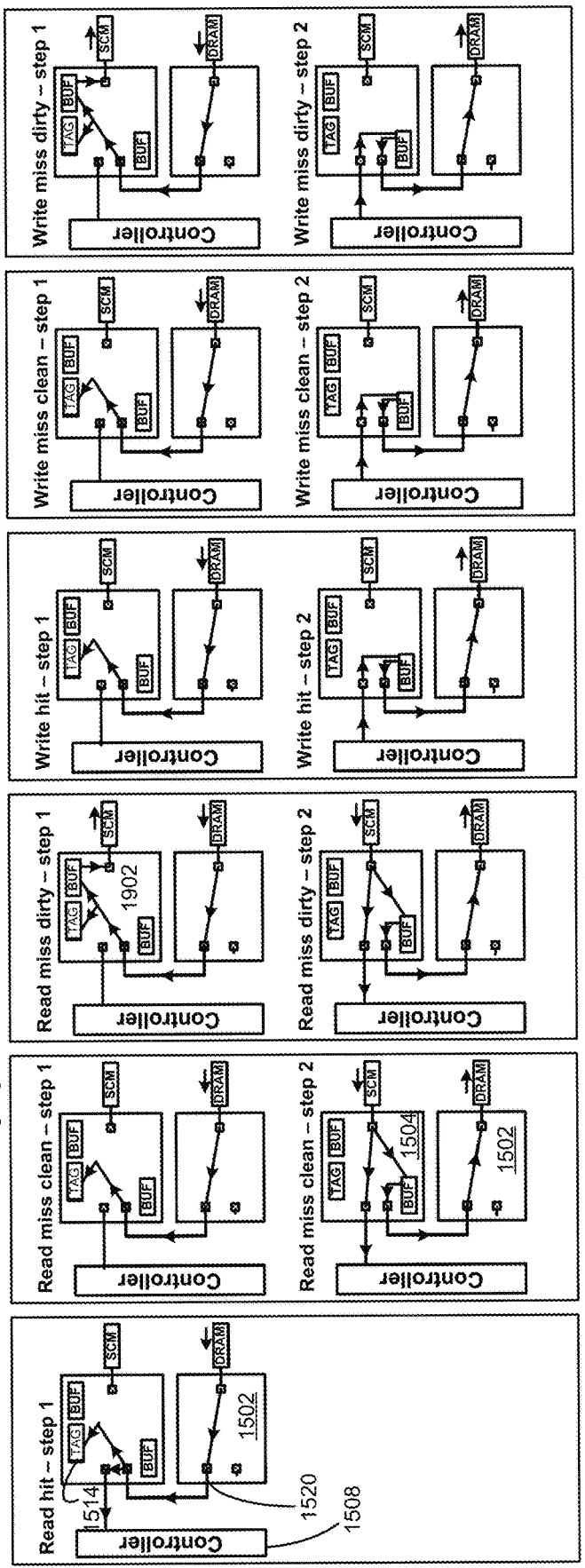

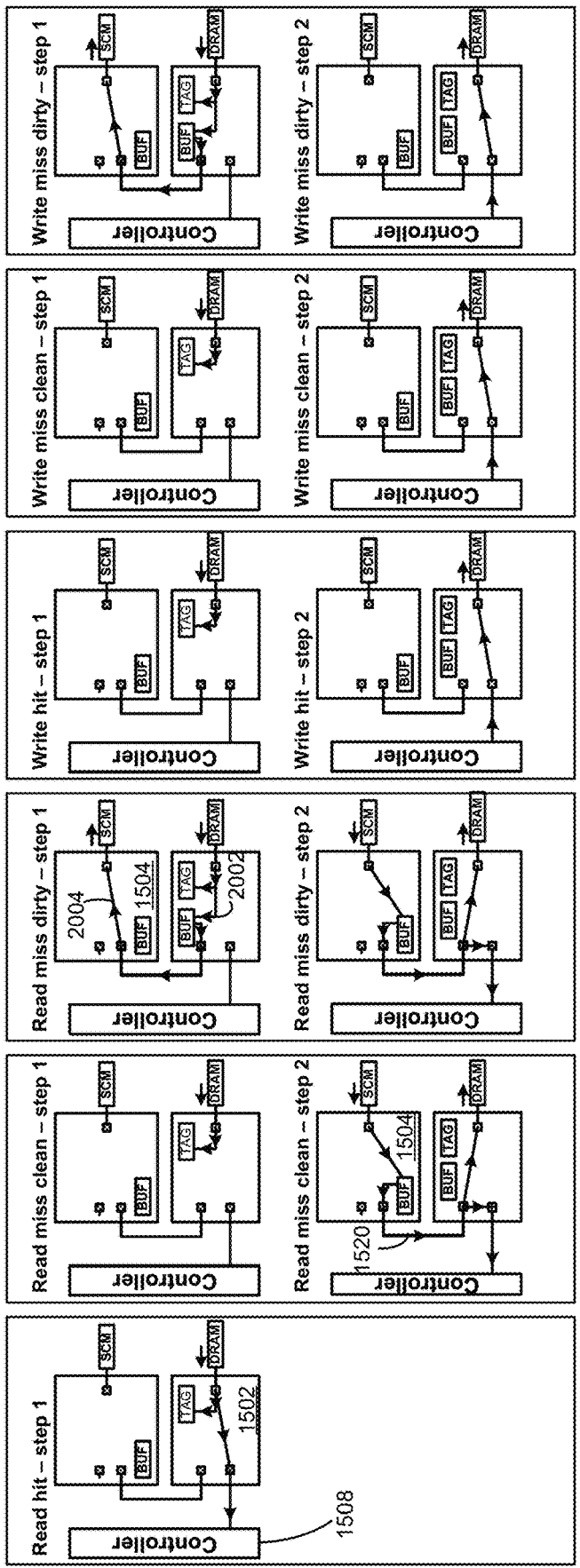

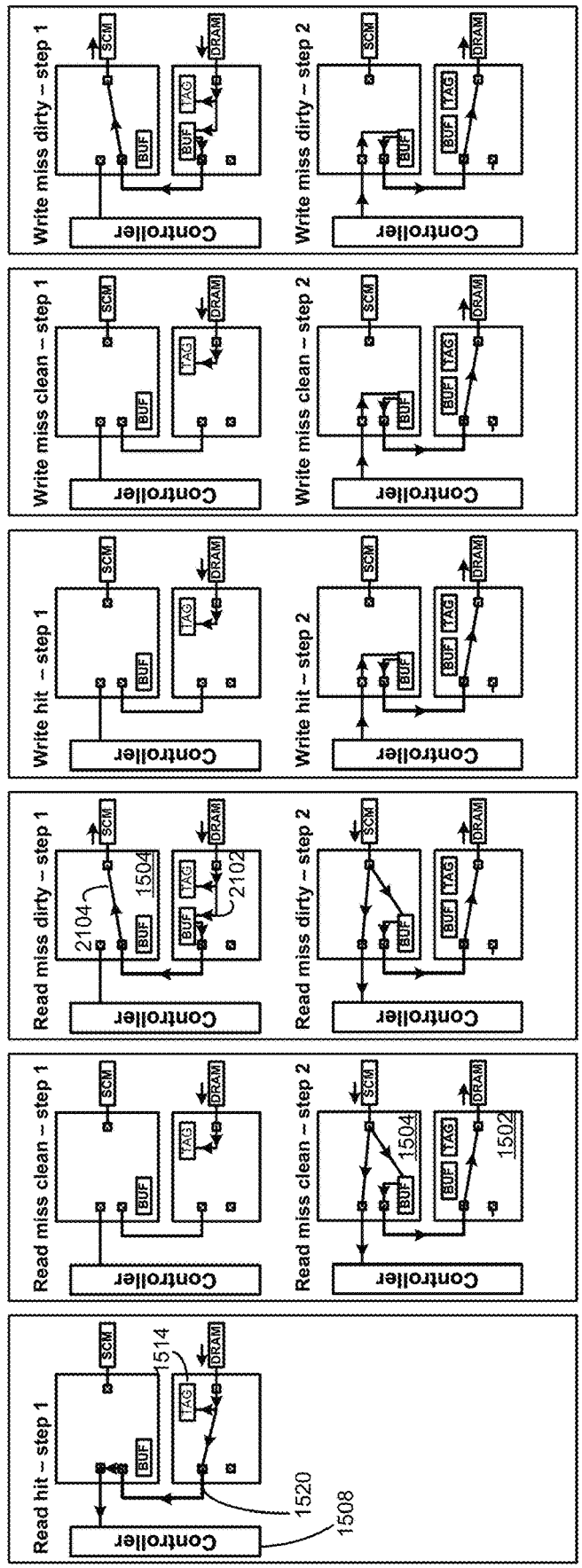

FIG. 21A FIG. 21B FIG. 21C FIG. 21D FIG. 21E FIG. 21F

NOTES
- TAG compare logic in DRAM module
- significant impact to DRAM module
o somewhat higher read hit latency relative to DC4
- no EDC of dirty read/write miss data (writeback)
- parity dirty read/write miss TAG (writeback) – requires some fixup for EDC correction after TAG parity error Continuous BW summary (as a fraction of 25.4GB/s = 36b@6.4Gb/s, alternate accesses to odd/even nibbles)
RH ~ 1.00x   RMC ~ 1.00x   RMD ~ 0.50x   WH ~ 1.00x   WMC ~ 1.00x   WMD ~ 0.50x

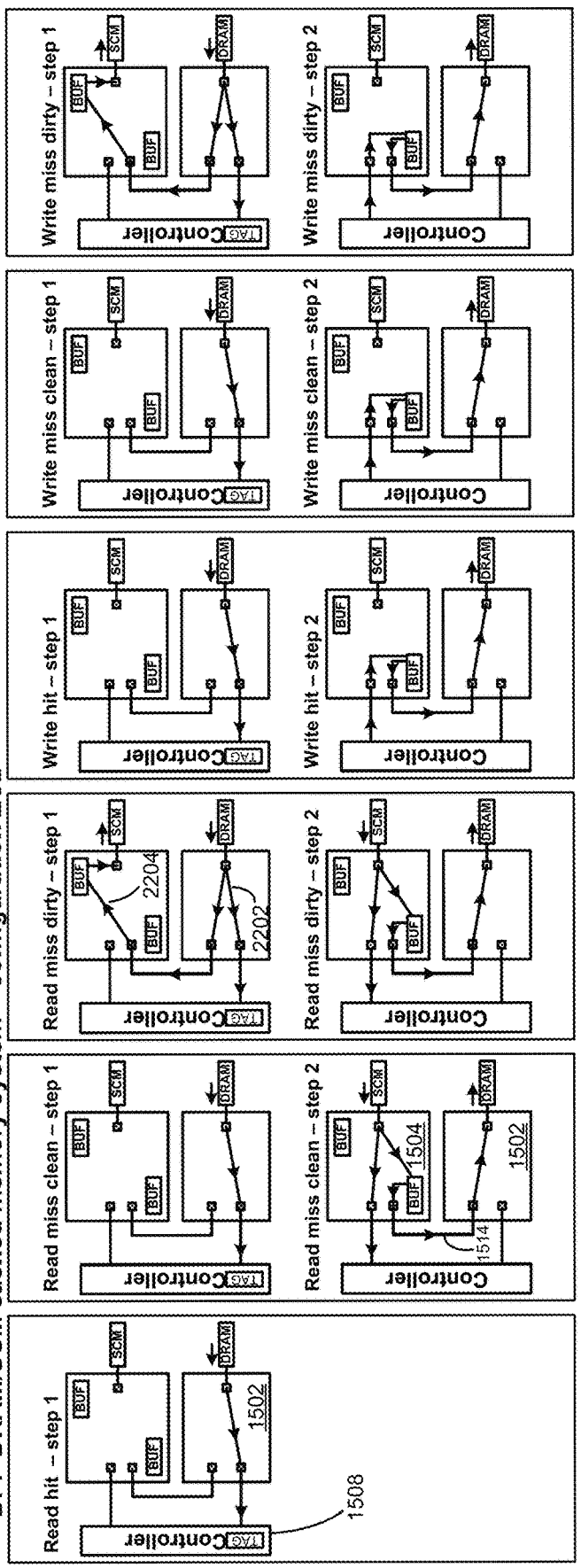

FIG. 22A  FIG. 22B  FIG. 22C  FIG. 22D  FIG. 22E  FIG. 22F

NOTES

+ TAG compare logic in controller
+ minimum impact to DRAM module
+ minimum read hit latency
+ full EDC of dirty miss data (writeback) – requires some fixup when an error is detected/corrected
+ full EDC of dirty miss TAG (writeback) – requires some fixup when an error is detected/corrected Continuous BW summary (as a fraction of 25.4GB/s = 36b@6.4Gb/s, alternate accesses to odd/even nibbles)
RH ~ 1.00x  RMC ~ 1.00x  RMD ~ 0.50x  WH ~ 1.00x  WMC ~ 1.00x  WMD ~ 0.50x

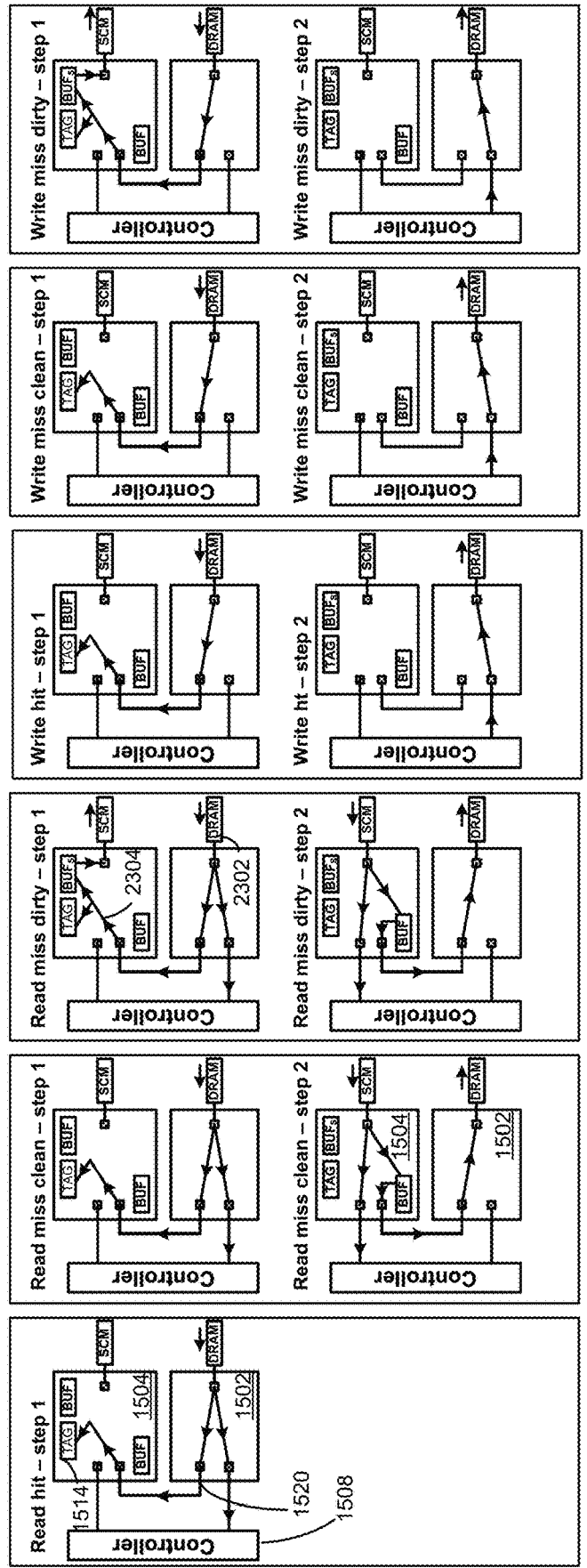

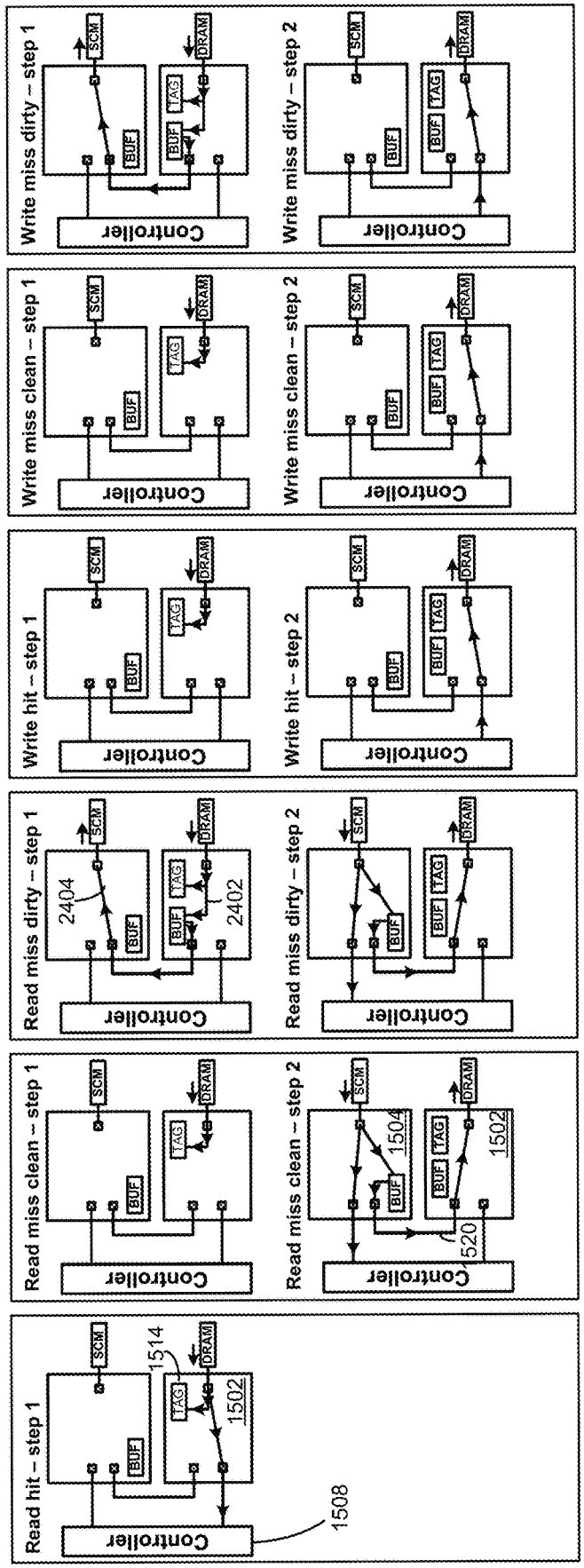

Performance comparison     FIG. 25

Continuous BW summary (as a fraction of 25.4GB/s = 36b@6.4Gb/s, alternate accesses to odd/even nibbles)

| configuration | RH BW | RMC BW | RMD BW | WH BW | WMC BW | WMD BW |
|---|---|---|---|---|---|---|
| MC1,MC2,FC1,FC2 | 1.00x | 0.50x | 0.20x | 0.25x | 0.25x | 0.20x |
| DC4 | 1.00x | 0.50x | 0.33x | 0.33x | 0.33x | 0.33x |
| SC4 | 1.00x | 0.33x | 0.33x | 0.33x | 0.33x | 0.33x |
| DU4 | 1.00x | 0.50x | 0.33x | 1.00x | 1.00x | 1.00x |
| SU4 | 1.00x | 0.50x | 0.50x | 0.50x | 0.50x | 0.50x |
| DV4 | 1.00x | 1.00x | 0.50x | 1.00x | 1.00x | 1.00x |
| SV4 | 1.00x | 0.50x | 0.50x | 0.50x | 0.50x | 0.50x |
| ZV2 | 1.00x | 1.00x | 0.50x | 1.00x | 1.00x | 0.50x |
| ZU2 | 1.00x | 0.50x | 0.50x | 1.00x | 1.00x | 1.00x |
| ZV2 | 1.00x | 1.00x | 0.50x | 1.00x | 1.00x | 1.00x |

NOTATION

{D*4,S*4} – connection of module-pair to controller
 "D***" - DRAM module connects
 "S***" - SCM module connects
{*C4,*U4,*V4} – location of cacheline TAG comparison logic
 "*C4" - TAG logic on controller
 "*U4" - TAG logic on SCM module
 "*V4" - TAG logic on DRAM module
{***4,X3,Y3,Z2} – number of modules per channel
 "***4" - two sets of DRAM/SCM module pair
 "X3" - two DRAM modules, sharing an SCM module
 "Y3" - two SCM modules, sharing a DRAM module
 "Z2" - one DRAM/SCM module pair

FIG. 26

Power comparison

Number of data slots on terminated links (72B blocks at 25.4GB/s = 36b@6.4Gb/s)

| configuration | RH BW | RMC BW | RMD BW | WH BW | WMC BW | WMD BW |
|---|---|---|---|---|---|---|
| MC1,MC2,FC1,FC2 | 2 | 4 | 6 | 4 | 4 | 6 |
| DC4 | 2 | 5 | 8 | 4 | 4 | 6 |
| SC4 | 3 | 7 | 8 | 6 | 6 | 7 |
| DU4 | 3 | 7 | 8 | 4 | 4 | 5 |
| SU4 | 3 | 6 | 7 | 5 | 5 | 6 |
| DV4 | 2 | 5 | 7 | 3 | 3 | 5 |
| SV4 | 3 | 5 | 7 | 4 | 4 | 6 |
| ZV4 | 2 | 6 | 8 | 5 | 5 | 7 |
| ZU2 | 3 | 7 | 8 | 4 | 4 | 5 |
| ZV2 | 2 | 5 | 7 | 3 | 3 | 5 |

NOTATION

{D*4,S*4} – connection of module-pair to controller
  "D***" - DRAM module connects
  "S***" - SCM module connects
{*C4,*U4,*V4} – location of cacheline TAG comparison logic
  "*C4" - TAG logic on controller
  "*U4" - TAG logic on SCM module
  "*V4" - TAG logic on DRAM module
{**4,X3,Y3,Z2} – number of modules per channel
  "***4" - two sets of DRAM/SCM module pair
  "X3" - two DRAM modules, sharing an SCM module
  "Y3" - two SCM modules, sharing a DRAM module
  "Z2" - one DRAM/SCM module pair

MEMORY SYSTEM WITH CACHED MEMORY MODULE OPERATIONS

CROSS REFERENCES TO RELATED APPLICATIONS

This application is a Continuation of U.S. application Ser. No. 16/888,551, filed May 29, 2020, which is a Continuation of U.S. application Ser. No. 15/761,746, filed Mar. 20, 2018, now U.S. Pat. No. 10,678,719, which is a national stage application of international application number PCT/US2016/51141, filed Sep. 9, 2016, which claims the benefit of U.S. Provisional Application No. 62/271,551, filed Dec. 28, 2015, and Provisional Application No. 62/235,660, filed Oct. 1, 2015, all of which are incorporated by reference herein in their entirety.

TECHNICAL FIELD

The disclosure herein relates to memory systems, memory modules, memory controllers, memory devices, and associated methods.

BACKGROUND

Successive generations of dynamic random access memory components (DRAM) have appeared in the marketplace with steadily shrinking lithographic feature size. As a result, the device storage capacity from each generation has increased. However, it is increasingly becoming more difficult to scale DRAM devices and obtain sufficient capacitive performance for charge storage. DRAM device manufacturing can also be costly.

Various non-volatile memory technologies, such as resistive random access memory (RRAM) and phase change random access memory (PCRAM), to name a few, are relatively inexpensive to manufacture. However, many of the non-volatile memory technologies have yet to attain the performance of their DRAM counterparts.

It would be desirable to employ memory in a memory system that has the cost advantages of many non-volatile technologies with the performance of DRAM.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIGS. 4A-4F illustrate various cache operations corresponding two different memory module configurations.

FIG. 7 illustrates a memory architecture similar to FIG. 6 utilizing four memory modules.

FIG. 14 illustrates circuitry relating to tag matching distributed across a module.

FIGS. 15A-15I illustrate a configuration taxonomy for various memory module configurations utilizing both SCM memory components and DRAM memory components.

FIGS. 16A-16F illustrate various cache operations for the memory module configuration shown in FIG. 15A.

FIGS. 17A-17F illustrate various cache operations for the memory module configuration shown in FIG. 15B.

FIGS. 18A-18F illustrate various cache operations for the memory module configuration shown in FIG. 15C.

FIGS. 19A-19F illustrate various cache operations for the memory module configuration shown in FIG. 15D.

FIGS. 20A-20F illustrate various cache operations for the memory module configuration shown in FIG. 15E.

FIGS. 21A-21F illustrate various cache operations for the memory module configuration shown in FIG. 15F.

FIGS. 22A-22F illustrate various cache operations for the memory module configuration shown in FIG. 15I.

FIGS. 23A-23F illustrate various cache operations for the memory module configuration shown in FIG. 15I.

FIGS. 24A-24F illustrate various cache operations for the memory module configuration shown in FIG. 15I.

FIG. 25 illustrates a performance comparison between various memory module configurations.

FIG. 26 illustrates a power comparison between various memory module configurations.

DETAILED DESCRIPTION

Memory modules, memory controllers, devices and associated methods are disclosed. In one embodiment, a memory module is disclosed that includes a pin interface for coupling to a data bus having a first width. The module is capable of operating in a first legacy mode that utilizes the full first width of the data bus. The module may also be operated in a second mode where the module utilizes less than all of first width of the data bus. The module includes at least one storage class memory (SCM) device and at least one DRAM memory device. This basic architecture enables the DRAM device to provide a caching function for transactions directed to the SCM device, thereby providing high performance for a memory system that is primarily populated with lower-cost SCM devices.

Figure 1:
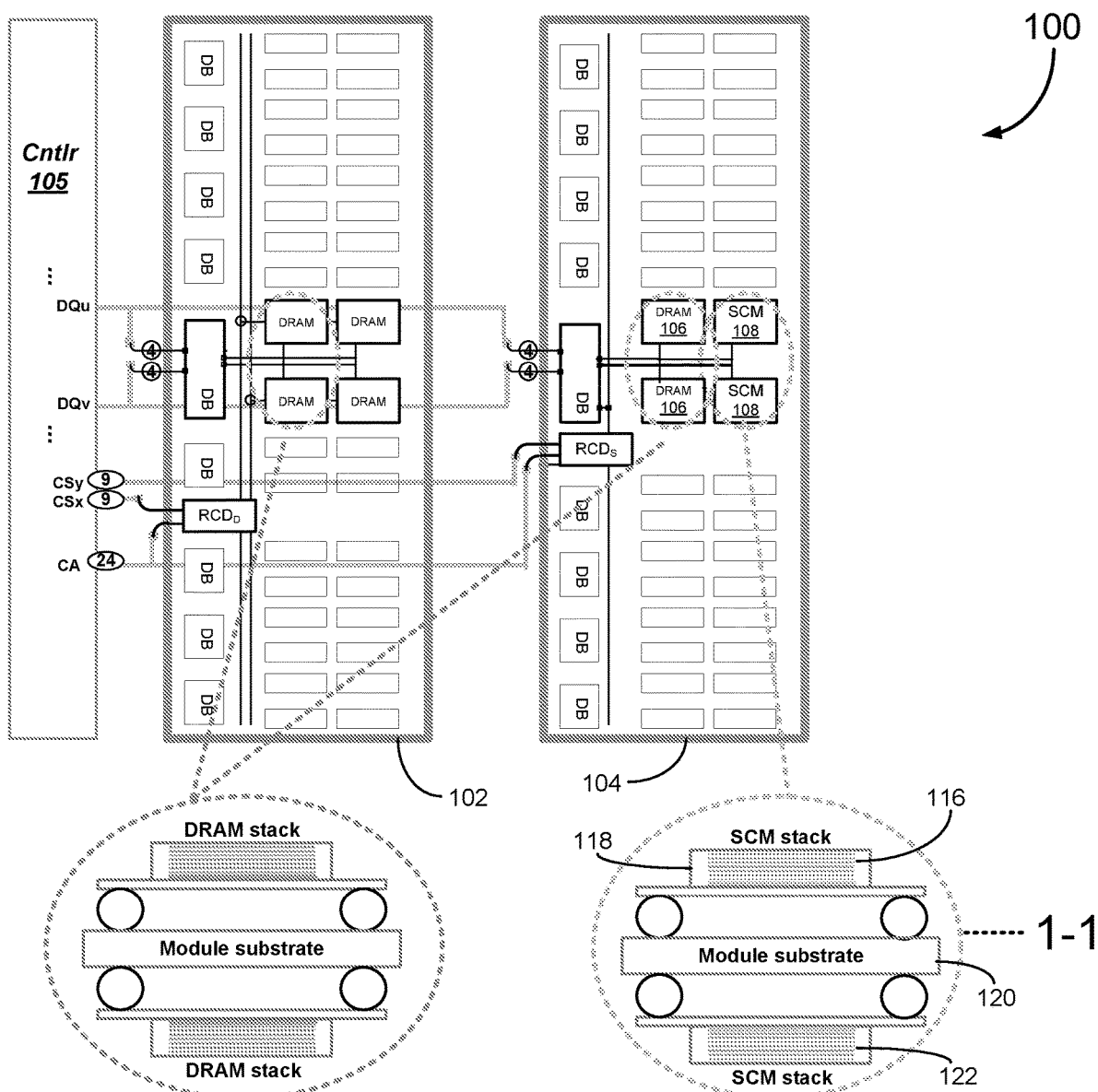
FIG. 1 illustrates one embodiment of a memory system that employs a first memory module that mounts only DRAM components, and a second module that mounts both DRAM components and storage class memory (SCM) memory components.

Referring now to FIG. 1, a memory system according to a first embodiment, generally designated 100, is shown. The system includes a first DRAM module 102 and a second module 104 that incorporates both DRAM memory components or devices 106 and storage class memory (SCM) devices 108. Storage class memory devices include, for example, memory components that have characteristics often associated with non-volatile memory devices such as phase change memory (PCM), resistive random access memory (RRAM), and flash memory. The first and second modules 102 and 104 are interconnected to a memory controller 105 via a legacy point-to-2-point (multi drop) architecture including primary data paths DQu and DQv and control address C/A paths CA, CSy and CSx. For one embodiment, the DRAM components in the hybrid module 104 are configured to form a cache memory, thus providing cache functionality for transactions involving the memory controller 105 and the SCM memory devices 108. Utilizing a legacy multi drop link architecture, however, may involve a fixed ratio of the DRAM cache memory to the SCM memory on the hybrid module 104. Thus, expanding the cache region to a secondary module may involve additional transfers on the primary links, which may impact the bandwidth of those links.

Further referring to FIG. 1, each of the memory devices (DRAM and/or SCM) 106 and 108 may include one or more stacks of memory die. The structure of the SCM stacks will be described, with the understanding that the DRAM stacks may be configured in a similar manner. As noted earlier, the memory die may be of a nonvolatile-type of memory technology other than DRAM, such as such as resistive random access memory (RRAM), phase change random access memory (PCRAM), and flash, to name but a few. Each stack of devices may contain, for example, eight SCM memory components. One example of a stacked set of devices is shown in the magnified view 1-1, illustrating stacked SCM memory components 116 within a single package 118. For some configurations, the opposite side of the SCM module substrate 120 may mount memory components, such as at 122. The interface of each SCM memory component may be connected in parallel using through-silicon-vias, wire bonding, any other connection method. Other stacking configurations such as package-on-package stacking are also possible.

Figure 2:
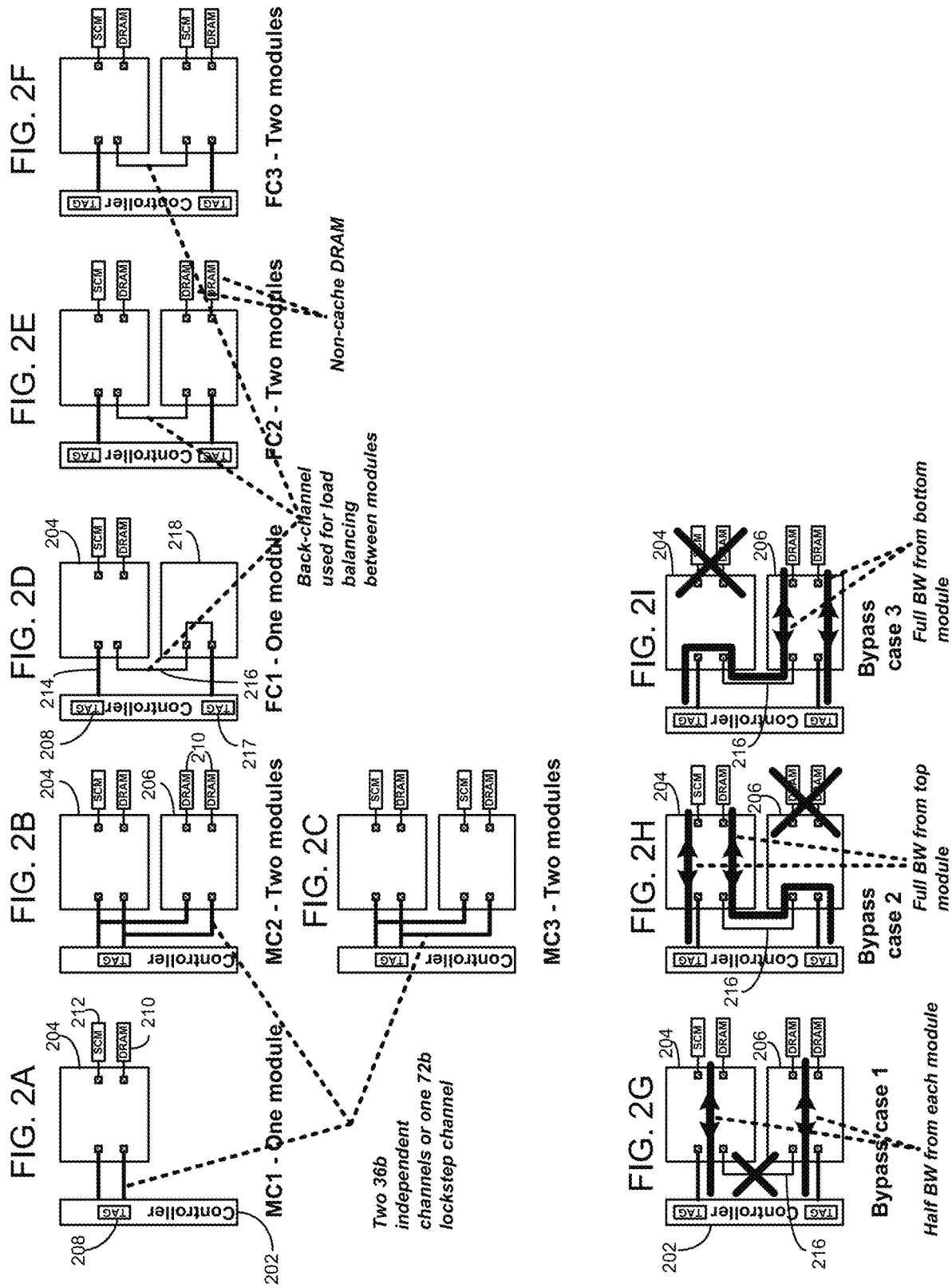
FIGS. 2A-I illustrates various examples of module interconnection schemes further described herein.

FIGS. 2A-2C illustrate various high-level configuration diagrams. FIG. 2A shows interconnections between a memory controller 202 and one hybrid DRAM/SCM module 204, while FIGS. 2B-2I show interconnections between the memory controller 202 and two modules including the hybrid module 204 and a second module 206 that includes DRAM components only, or both DRAM and SCM components. The configuration of FIG. 2A includes the memory controller 202 that has a tag memory comparison circuit 208 with the controller being connected to the hybrid memory module 204 via two 36b independent channels or one 72b lockstep channel. The hybrid module 204 includes both DRAM and SCM memory components 210 and 212. FIG. 2B shows a two module configuration where the memory controller 202 couples to the hybrid module 204 and the second module 206 that includes only DRAM components 210. The two modules 204 and 206 are coupled to the memory controller 202 via a multi-drop configuration, where a given link of the controller is shared by corresponding links associated with each module. Lastly, FIG. 2C illustrates a further multi-drop two-module configuration where both modules 204 and 206 are hybrid modules that include both SCM and DRAM memory components 210 and 212.

FIGS. 2D-2F illustrate memory module configurations involving a point-to-point connection between the memory controller 202 and one or each of the two modules 204 and 206, and each of two sockets, each socket capable of holding one module. As shown in FIG. 2D, the memory controller 202 includes the tag memory comparison circuit 208, and a first point-to-point link 214 that couples a portion of the tag memory comparison circuit to the hybrid memory module 204. A second portion of the tag memory compare circuit, at 217, connects to the hybrid memory module 204 via a point-to-point link 216 routed through a continuity module 218. The continuity module is configured to plug into a module socket to provide point-to-point connectivity between the memory controller 202 and at least one other module. As such, the continuity module does not employ memory devices, and merely provides a connectivity function. As a result of the added connectivity, the single hybrid memory module 202 may interface with the memory controller 202 through multiple point-to-point links, half of the links directly coupled to the memory controller, and half of the links routed through the continuity module to the controller. The link 216 may form a back channel that is directly coupled between the hybrid memory module 204 and the continuity module 218. As more fully described below, for one embodiment, the back channel link may provide a connection for balancing loads between memory modules.

FIG. 2E illustrates a similar configuration as FIG. 2D, but instead of utilizing a continuity module in the second module socket, a second memory module 206 employing DRAM memory components 210 is plugged into the socket, thus connecting to the memory controller 202 in a point-to-point fashion. For one embodiment, the DRAM memory components provide non-cached DRAM storage. FIG. 2F shows a further alternative embodiment where the second memory module 206 is a hybrid memory module employing both SCM and DRAM memory components 210 and 212.

FIGS. 2G-2I illustrate possible load-balancing examples for the system configuration of FIG. 2E. FIG. 2G illustrates a load-balancing example where half the bandwidth of the system is directed to the first module 204 and half the bandwidth of the system is directed to the second module 206. For this case, the back channel link 216 between the two modules does not provide a balancing function. FIG. 2H illustrates a load balancing example where the full bandwidth of the system is allocated to the hybrid module 204 by utilizing the back channel 216 to bypass data transfers from the memory controller 202 through the second memory module 206 to the hybrid memory module 204. FIG. 2I illustrates an example where the full bandwidth of the system is allocated to the second module 206, a DRAM-only module, through activation of the back channel 216 to direct data transfers through the hybrid module 204 to the DRAM module 206. Load balancing may be carried out in a similar manner as in the system configuration of FIG. 2F.

Figure 3:
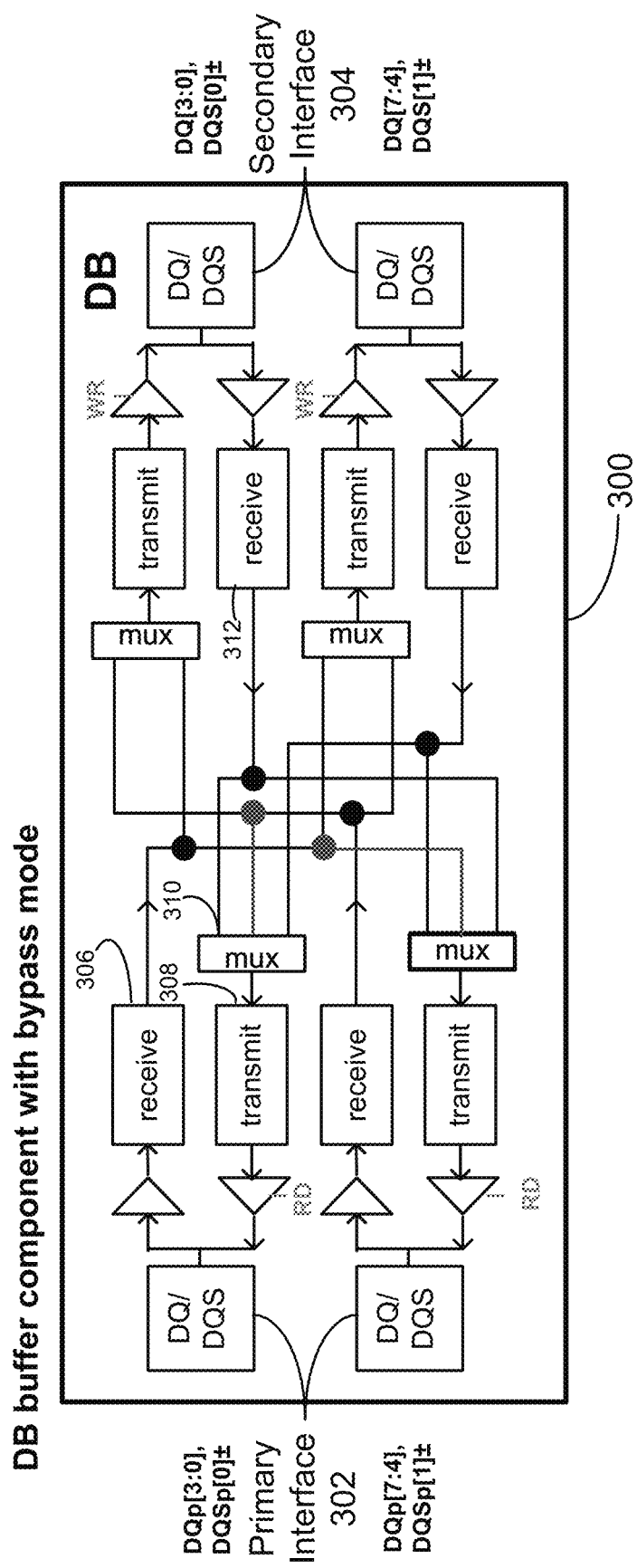
FIG. 3 illustrates steering circuitry within a data buffer component.

FIG. 3 illustrates one embodiment of steering logic 300 that may be utilized with a data buffer DB component of each of the memory modules described above. The steering logic 300 includes a primary interface 302 that has a nibble pair of DQ/DQS I/O circuits, and a secondary interface 304 that also includes a corresponding nibble pair of DQ/DQS I/O circuits. Each nibble pair of the primary interface 302 is associated with a receive path 306 for write data and a transmit path 308 for read data. Each transmit path 308 is fed by an output of a multiplexer 310 which receives data from a selected receive path 312 associated with the secondary nibble pairs and the other receive path 306 of the primary nibble pair. The nibble pair circuitry for the secondary interface is similar to the primary interface, but with the receive and transmit paths corresponding to read and write data, respectively. The steering logic 300 essentially allows data from any of the DQ/DQS I/O circuits to be steered to any of the other DQ/DQS I/O circuits, thus providing for a bypass function, and enabling load balancing for systems with point-to-point topologies (such as FIGS. 2D-2I).

FIGS. 4A through 4F illustrate various cache operations associated with hybrid DRAM and SCM modules, where a tag comparison circuit 402 is located on a memory controller 404. In general, a portion of an overall DRAM capacity defined by DRAM components on each module is designated as a cache for the SCM memory. For a given memory operation, an address is requested by the controller 404, at 402. If the address is held in the DRAM cache, then the data in the addressed cache space may be fed and provided to the controller directly, as shown in FIG. 4A. As shown in FIG. 4B, in the event that the address is not in the cache, often referred to as a "miss", the contents still need to be read out for a tag comparison. This is carried out as a first step, at 406. An additional step is carried out, at 408, where the SCM memory is read for the data. Referring now to FIG. 4C, should the miss involve "dirty" data, then in addition to the read operations 406 and 408 from the DRAM and SCM modules described above with respect to FIG. 4B, a write operation back to the old location in the SCM memory is carried out, at 410. The second and third steps 408 and 410 may be carried out in any order. FIGS. 4D through 4F show corresponding cache operations for write transactions.

Figure 5:
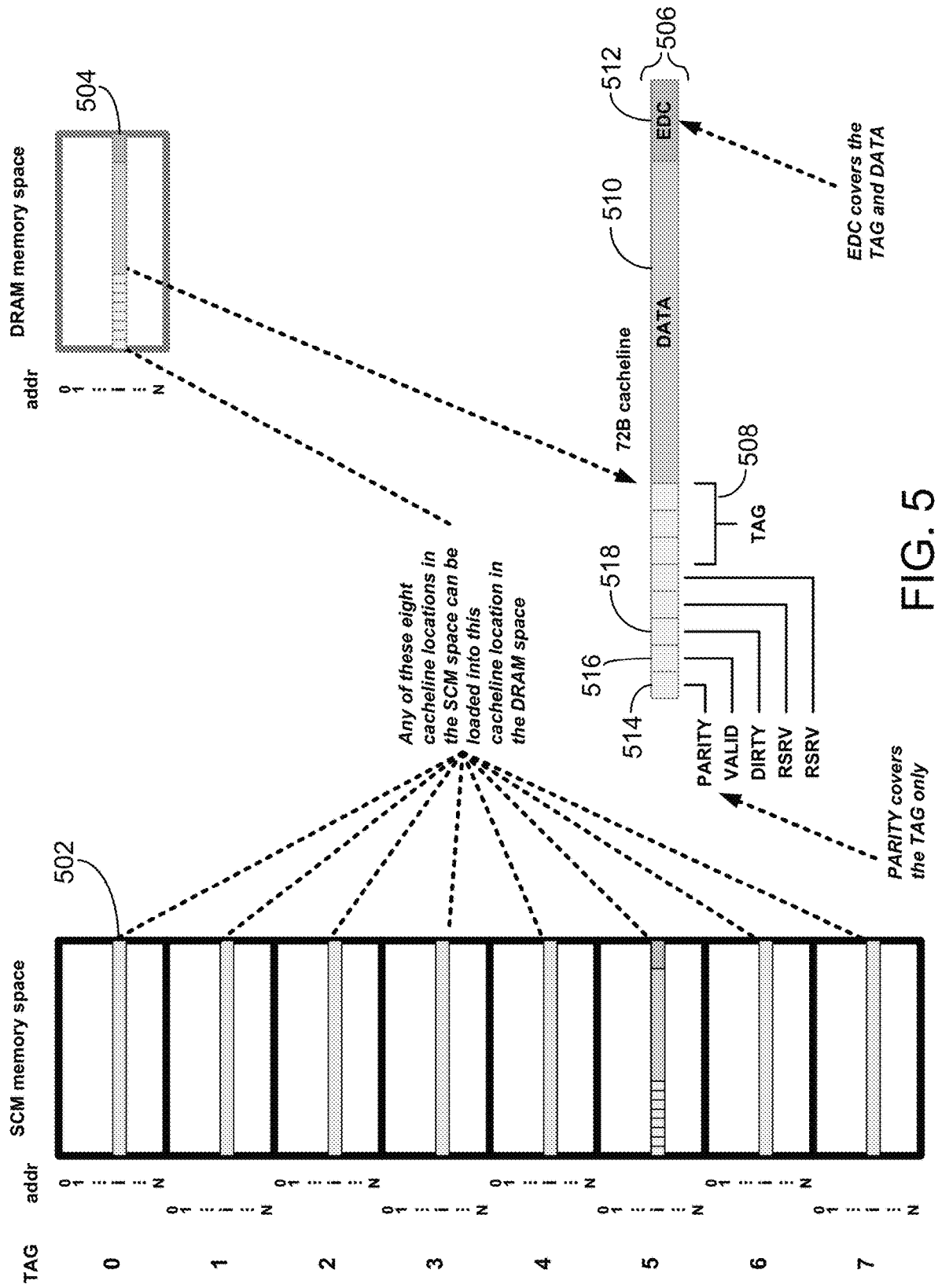
FIG. 5 illustrates a tag data structure as it correlates to SCM memory space.

FIG. 5 illustrates one embodiment of the relationship, or mapping, between a given cache line in DRAM space, to multiple address lines in the SCM memory space. This may be referred to as a DRAM to SCM mapping for single-set (direct-map) cache organization. For the example shown, any of eight cacheline locations in the SCM space, such as at 502, can be loaded in a single cacheline in the DRAM space, such as at 504. One embodiment of a data structure 506 that may be stored in the DRAM cacheline includes a tag address field 508 that identifies a 3-bit tag address, a 72B data field 510, an error code EDC field 512 that protects the entire data structure, and respective parity 514, valid 516 and dirty fields 518. For one embodiment, the EDC field 512 may protect the DATA and TAG fields 510 and 508 with an error correction/detection code. The EDC field 512 might also protect the VALID, DIRTY, and PARITY fields 514, 516 and 518 in some embodiments, and may not protect the fields in other embodiments. The PARITY field 514 may protect the TAG field 508 with an error detection code (this code will be redundant with the code used in the EDC field). The PARITY field 514 might also protect the VALID field 516, and the DIRTY field 518 in some embodiments.

Figure 6:
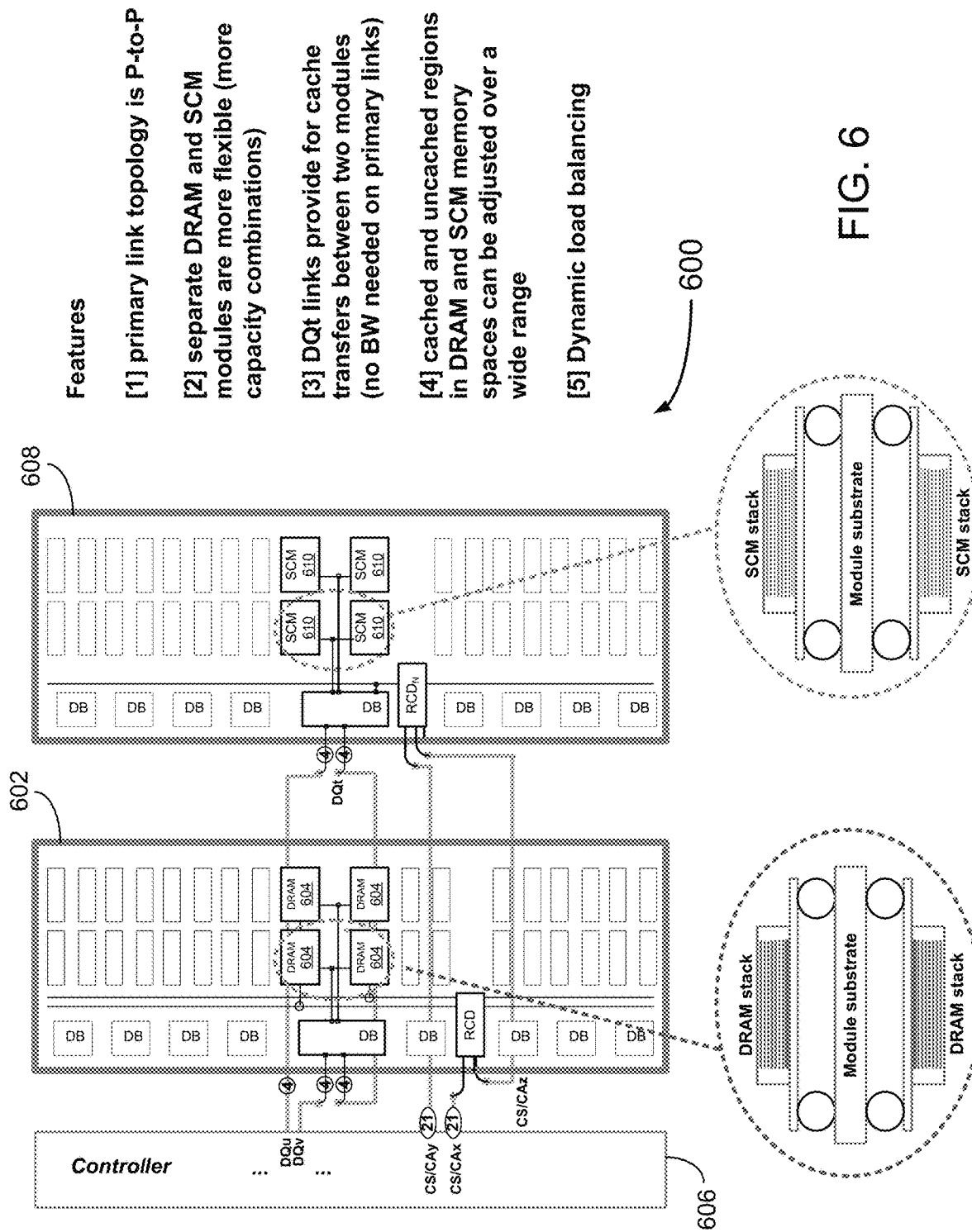
FIG. 6 illustrates a point-to-point memory architecture utilizing a first memory module with DRAM components and a second memory module with SCM components.
Figure 8:
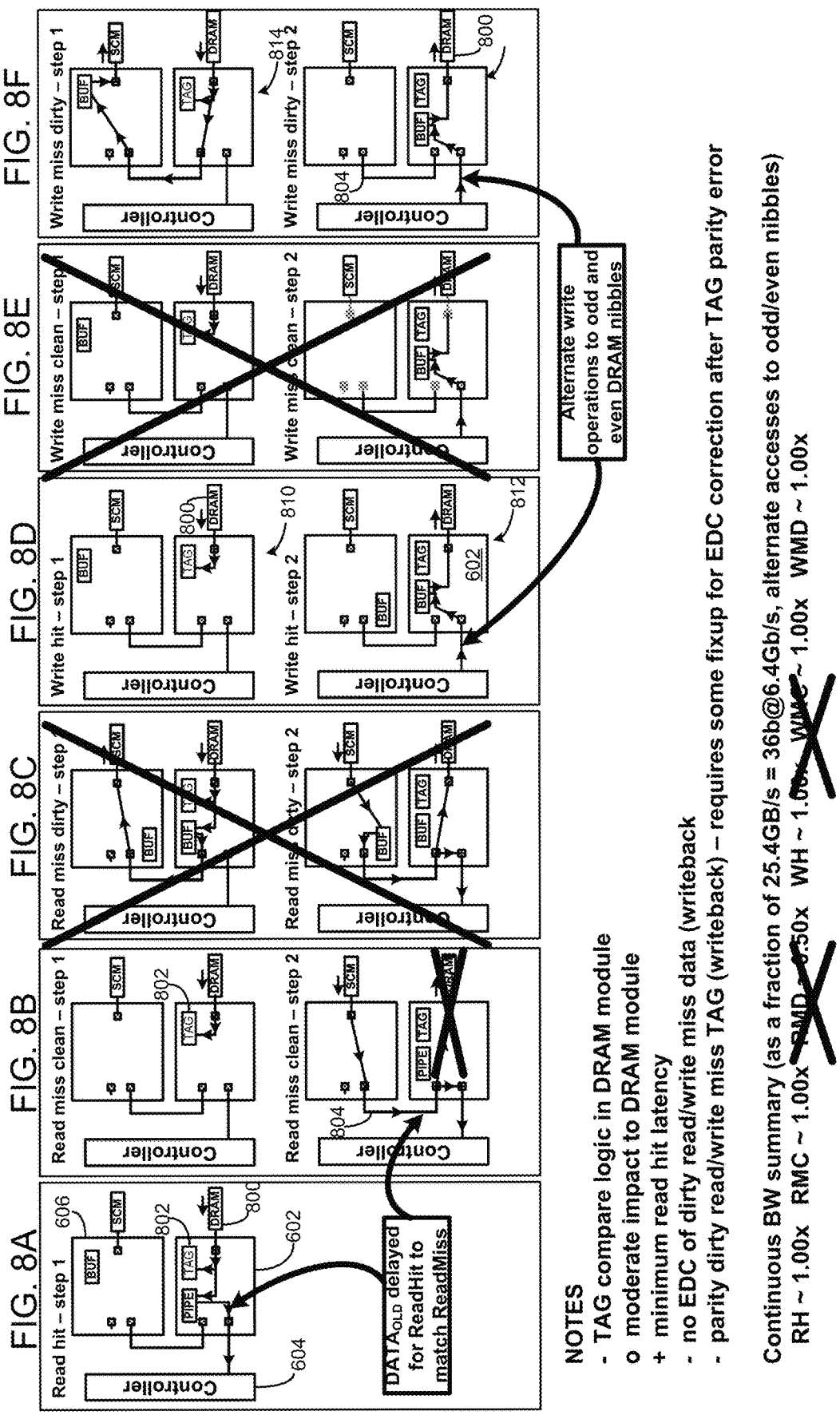
FIGS. 8A-8F illustrate a variety of cache operations corresponding to various memory module configurations.

FIG. 6 illustrates one embodiment of a memory system 600 that exhibits a point-to-point architecture. The system 600 includes a first memory module 602 that employs DRAM memory components 604 that are buffered from a memory controller 606 by multiple data buffer components DB and a command/address (CA) buffer component RCD. The first memory module 602 couples to the memory controller 606 through a point-to-point data nibble or link DQv, and a point-to-point CA link CS/CAx. The system 600 includes a second memory module 608 that employs SCM memory components 610 that are also buffered from the memory controller 606 by multiple data buffer DB and CA buffer components RCD. The second module 608 includes a point-to-point connection to the memory controller via data nibble DQu. A CA link CS/CAy couples the CA signal lines of the second module 608 to the memory controller 606 in a point-to-point manner. The first module 602 and the second module 608 may communicate with each other via a backchannel signal path DQt. For the described two-module configuration, half the total data width of the controller may be allocated to one module, and half the total data width may be allocated to the second module. For one embodiment, at least a portion of the DRAM memory space of the first module 602 is allocated to cache for operations involving the SCM memory of the second memory module 608. For one embodiment, the back channel path DQt provides for cache transfers between the two modules 602 and 608, such that no transfer bandwidth is needed on the primary links DQu and DQv for cache transfers. The back channel DQt may also provide for dynamic load balancing operations.

The memory system of FIG. 6 may be expanded while still maintaining a point-to-point architecture, as shown in FIG. 7. Four modules 702, 704, 706 and 708 are shown, with two of the modules 704 and 708 employing DRAM components to provide a cache for the two other modules 702 and 706 that employ SCM memory components. In such an embodiment, a total data width of a memory controller 710 may be allocated into halves, where direct point-to-point data connections are made to the first DRAM module 708 via nibble link DQu, and a second point-to-point connection made to the second DRAM module 704 via nibble link DQv. Point-to-point CA connections between the DRAM modules 708 and 704 and the memory controller 710 are made via links CS/CAx and CS/CAy. Back channel links, at 712 and 714, for CA signaling are provided between the DRAM modules 708, 704 and the SCM modules 706, 702 via links CS/CAx' and CS/CAy'. The SCM modules 706 and 702 interface with the DRAM modules 708 and 704 for data signal transfers via back channel link connections along links DQu' and DQv'. As more fully explained below, the back channel connections 714 and 712 allow for cache operations between modules with little impact to the bandwidth of the primary interface point-to-point links DQu and DQv.

FIGS. 8A-8F illustrate cache operations between the DRAM memory module 602, SCM memory module 608, and the memory controller 606 of FIG. 6. The operations assume that cache tag comparison circuitry 802 resides on the DRAM module 602, and that there is no writeback of dirty read miss data, and no allocation of a cacheline in the DRAM when there is a read miss. This means that the read-miss-dirty case and the write-miss-clean cases will not occur (they have been crossed out). This simplification allows the cached system to have the highest read and write bandwidth, at the cost of most reads accessing the SCM location.

FIG. 8A shows a read hit case, where the address in the DRAM cache, at 800, matches a requested address (carried out by the tag comparison circuit 802), resulting in the data being transferred from the DRAM module 602 to the memory controller 604 directly (in only one step since the data was already read from the DRAM space 800 and provided to both the tag circuit 802 and the data buffer). For one embodiment, the read data is delayed by a time interval in an effort to match a latency associated with a read miss case. When the read hit data is delayed to match the delay of the read miss data, there will be no conflict on the data bus between a read hit and an earlier read miss to a different address.

For a read miss case, shown in FIG. 8B, the DRAM 800 is first read so that the tag contents can be determined via the tag circuit 802, and compared to the incoming requested address. When the data is determined to be a "miss", the SCM memory module 606 is then accessed for a read operation to transfer the requested read data from the SCM module 606, along the back channel link, at 804, (between the DRAM module and the SCM module), then transferred from the DRAM module 602 via a bypass connection configured through the data buffer DB steering logic 300 described above with respect to FIG. 3. FIG. 8C merely confirms that a particular embodiment described here does not provide any writeback for "dirty" read miss cases.

A write hit case is illustrated by FIG. 8D, where in a first step, at 810, the tag contents are first read from the DRAM 800, and in a second step, at 812, the write data is written to the DRAM module 602. For one embodiment, for write hit cases, the write operations are directed to alternate odd and even nibbles of the DRAM module 602. When alternate odd and even nibbles are used, then it is possible to perform the tag read and the data write in two different cycles in the odd nibble, and to perform a second tag read and the data write in two different cycles in the even nibble, resulting in a throughput of one cached write operation per tCC interval (the same as an uncached DRAM system).

FIG. 8E shows that for the embodiment described, no operations for a write miss case are carried out. For write miss dirty operations, after the tag contents are compared in a first step, at 814, the tag contents are transferred via the back channel link 804 to the SCM memory, and the write data written to the DRAM 800, as shown at 816 in FIG. 8F.

Figure 9:
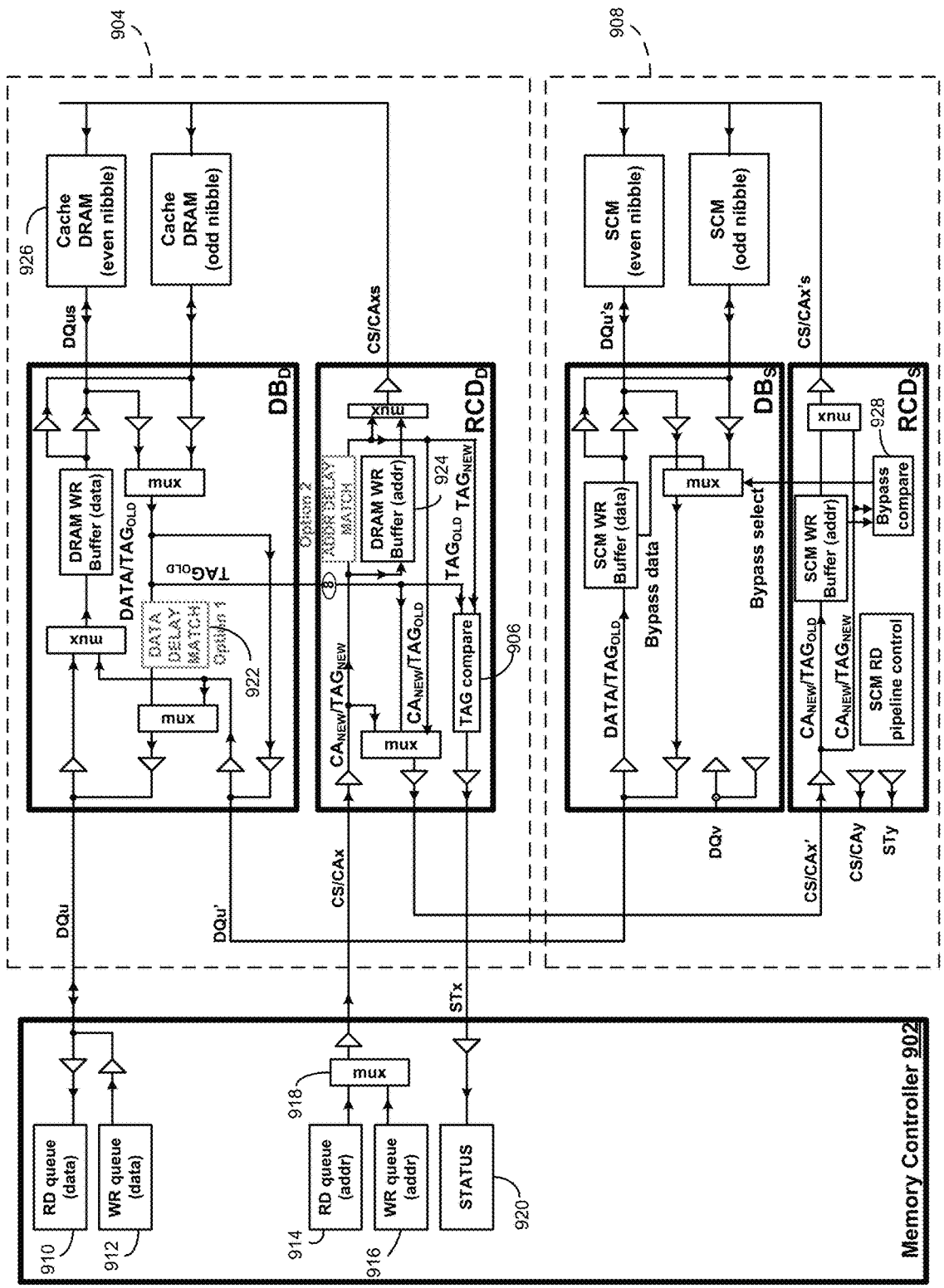
FIG. 9 illustrates further detail of a memory system according to one embodiment.

FIG. 9 illustrates further detail of the memory system of FIGS. 6, 7 and 8A-8F, with special emphasis on the buffer circuitry for the DRAM and the SCM modules. To reiterate, this particular embodiment employs a point-to-point connection between a memory controller 902 and at least one DRAM module 904, and also incorporates tag compare circuitry 906 on the DRAM module, and for one embodiment, specifically in a CA buffer $RCD_D$. Data transfers between the memory controller 902 and an SCM module 908 are passed through the DRAM module 904 via a back channel connection DQu' between the DRAM module 904 and the SCM module 908. The memory controller 902 includes respective read and write data queues 910 and 912 coupled to data nibble DQu, which serves as a primary data link for coupling to a DRAM module data buffer component $DB_D$. The memory controller 902 further includes respective read and write address queues 914 and 916 that are selectively coupled, via a multiplexer 918, to CA link CS/CAx, which serves as a primary CA link for coupling the memory controller 902 to the DRAM module CA buffer $RCD_D$. Status circuitry "STATUS" 920 interfaces with the DRAM CA buffer component $RCD_D$ via a status link STx, which provides information concerning tag compare operations, as described below.

Further referring to FIG. 9, the each buffer component $DB_D$ on the DRAM module 904 employs steering logic described above with respect to FIG. 3, such that the primary data interface I/O circuits coupled to links DQu and DQu' (the backchannel link) may be selectively coupled to either of the secondary data I/O circuits DQus (respective even and odd cache DRAM nibbles) via multiplexer circuitry appropriately placed in the data transfer paths of the steering logic. For read hit cases, delay circuitry "DATA DELAY MATCH" 922 may be employed in the data buffer $DB_D$ to match the latency of read miss cases, which may maximize the bandwidth of the primary data link DQu between the DRAM module 904 and the memory controller 902. Alternatively, the delay circuitry 922 may be omitted, and a similar delay provided by delaying address commands with delay circuitry in the DRAM CA buffer $RCD_D$. As described earlier, delaying the read hit data to match the read miss data allows the maximum read data bandwidth, at a cost of increased latency in the read hit case.

With continued reference to FIG. 9, the DRAM CA buffer $RCD_D$ includes a DRAM write address buffer circuit 924 that provides buffered write addresses to DRAM memory components 926. The tag compare circuit 906 also resides on the CA buffer component $RCD_D$, which receives new tag information for a requested address with old tag information provided by the DRAM data buffer via a tag communication path $TAG_{OLD}$. The results of the tag comparison are then fed back to the memory controller 902 via the status link $ST_X$, so that the controller can dispatch any commands necessary for additional cache operations associated with "miss" cases. CA information passed to the DRAM module 904 via the CA link CS/CAx link is redriven by the DRAM module to the SCM module 908 via a CA backchannel link CS/CAx'.

The SCM memory module data buffer components $DB_S$ and CA buffer component $RCD_S$ are configured similar to their DRAM module counterparts. However, since the connections between the memory controller 902 and the memory modules 904 and 908 are made through the DRAM module 904, the steering logic for the data buffers $DB_D$ and $DB_S$ generally provides steering capability between one primary data circuit (the back channel link), to either of the secondary data I/O circuits. As to the CA buffer component $RCD_S$, no tag comparison circuitry is provided (or provided optionally). However, to control the back channel link CS/CAx', bypass compare logic 928 is employed.

Figure 10:
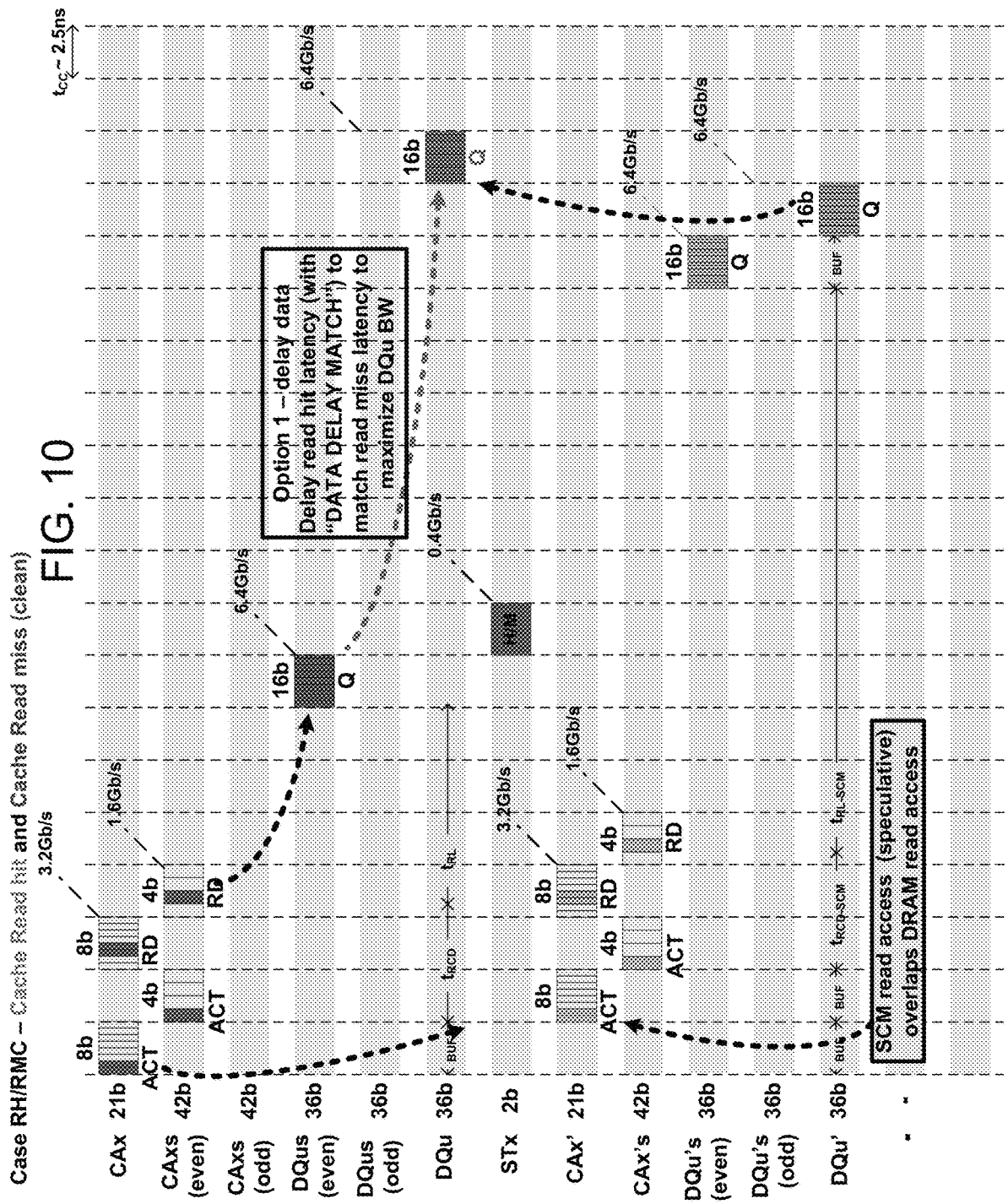
FIGS. 10-13 illustrate various timing diagrams regarding cache operations in the memory system of FIG. 9.

FIGS. 10-13 illustrate various timing diagrams that show the relative timing of various cache operations discussed above with respect to FIGS. 6, 7, 8A-8F, and 9. Referring now to FIG. 10, the relative timing for a series of operations are shown relating to a cache "read hit" and a cache read miss (clean) case. The top half of the labeled links shown in the chart (CAx to STx) correspond to signals associated with the DRAM module such as 904 (FIG. 9), while the lower signals (CAx' to DQu' relate to signals associated with the SCM module such as 908 (FIG. 9). To evaluate the contents of the tag memory, a read transaction, corresponding to commands "ACT" and "RD", to read the tag address from the DRAM is dispatched along CA link CAx, and redriven by the CA buffer along an "even" secondary CA link CAxs. The tag address data Q is accessed several cycles later, and optionally delayed. A delay of the tag data (address) to match the latency of a read miss data operation may help maximize the bandwidth of the primary data link DQu. The tag compare circuitry 906 evaluates the requested address and the tag address and indicates a hit or miss signal "H/M" on the status link STx. Concurrent with the DRAM module transaction to read the contents of the tag memory, a speculative SCM memory access operation is carried out by dispatching a read command along the back channel CA link CAx' which is redriven by the CA buffer $RCD_S$ along the secondary CA interface path CAx's. Alternatively, the SCM read access could wait to start until the tag was read in the DRAM and a read miss was confirmed. This increases the read miss latency, however. The resulting read data Q from the SCM module 908 may then be transferred, in the case of a "read miss clean" case, to the memory controller 902 along primary link DQu. For a read "hit" case, the data accessed from the DRAM is transferred to the memory controller 902.

Figure 11:
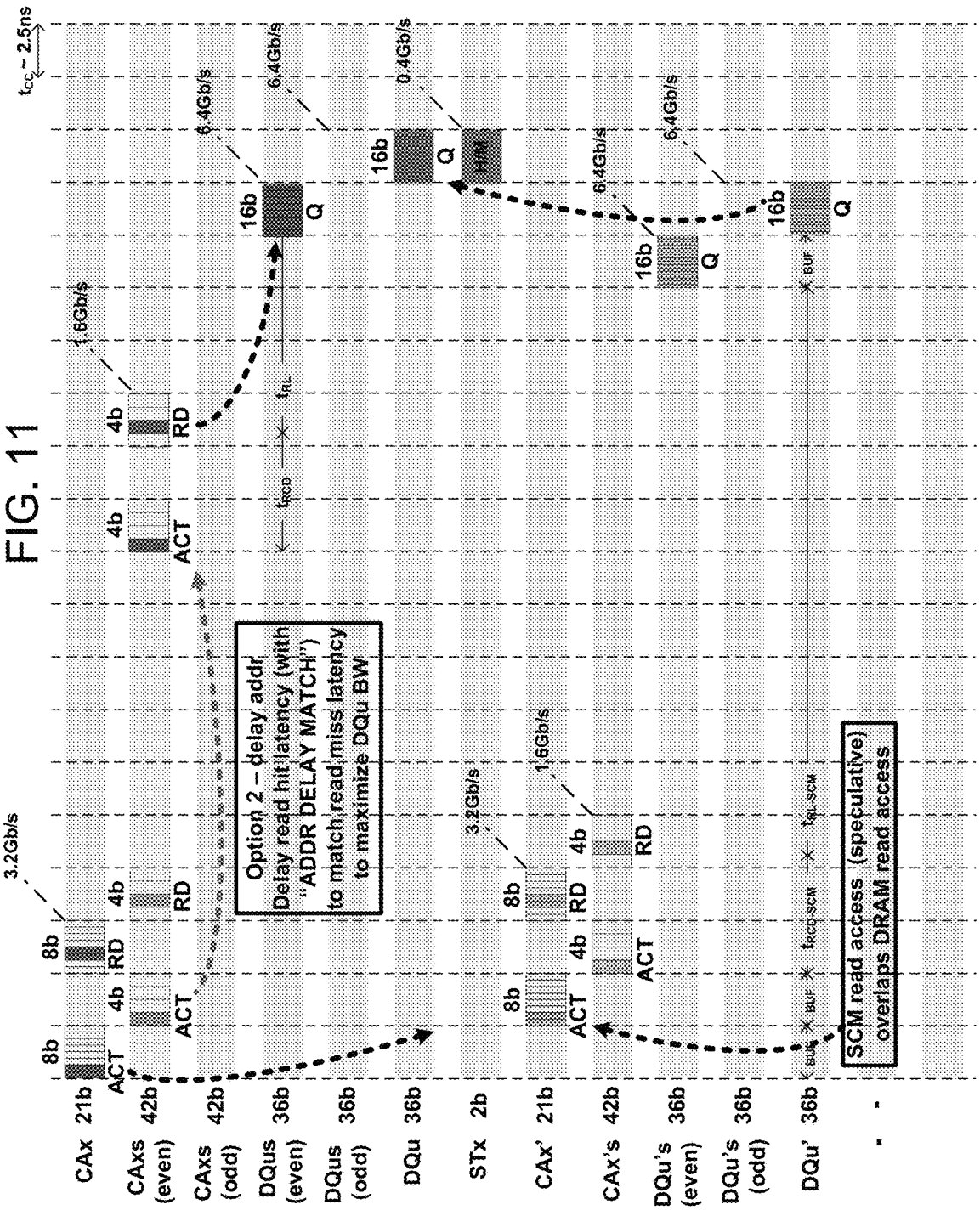

FIG. 11 illustrates a timing diagram similar to that of FIG. 10, for "read hit" and "read miss clean" cases, but instead of delaying the read data accessed from the DRAM module 904, the address information is delayed along the secondary CA link CAxs in the DRAM CA buffer RCD$_D$. Like the data delay option, described in FIG. 10, the address delay may improve the bandwidth of the primary data link DQu.

Figure 12:
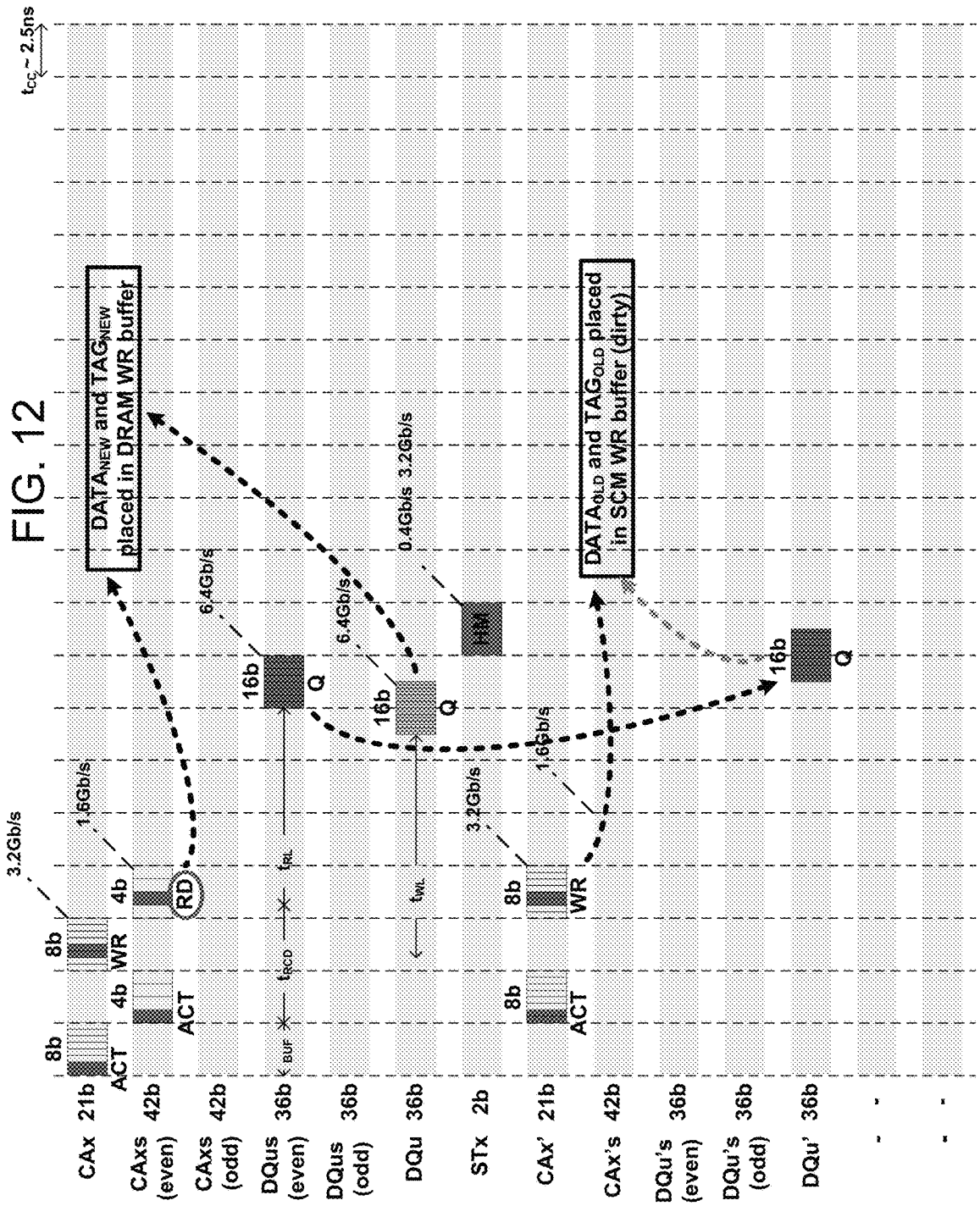

FIG. 12 illustrates the timing for a "write hit" and "dirty write miss" case. A write operation (commands "ACT" and "WR") is dispatched by the memory controller 902 along primary CA link CAx. The CA buffer component RCD$_D$ receives the write command, address information and the associated data, and retransmits the command as a read operation "RD" (accomplished by the CA buffer RCD$_D$) to read the contents of the tag memory. The new write data and new address tag information is then stored in the DRAM write buffer. For a write miss dirty case (determined after evaluating the tag information), a further write operation is carried out with a write command "WR" along link CAx' to place the old data and tag information in an SCM write buffer. Storing the old and new tag information in the buffers in this manner helps maximize the bandwidth of the primary data link DQu.

Figure 13:
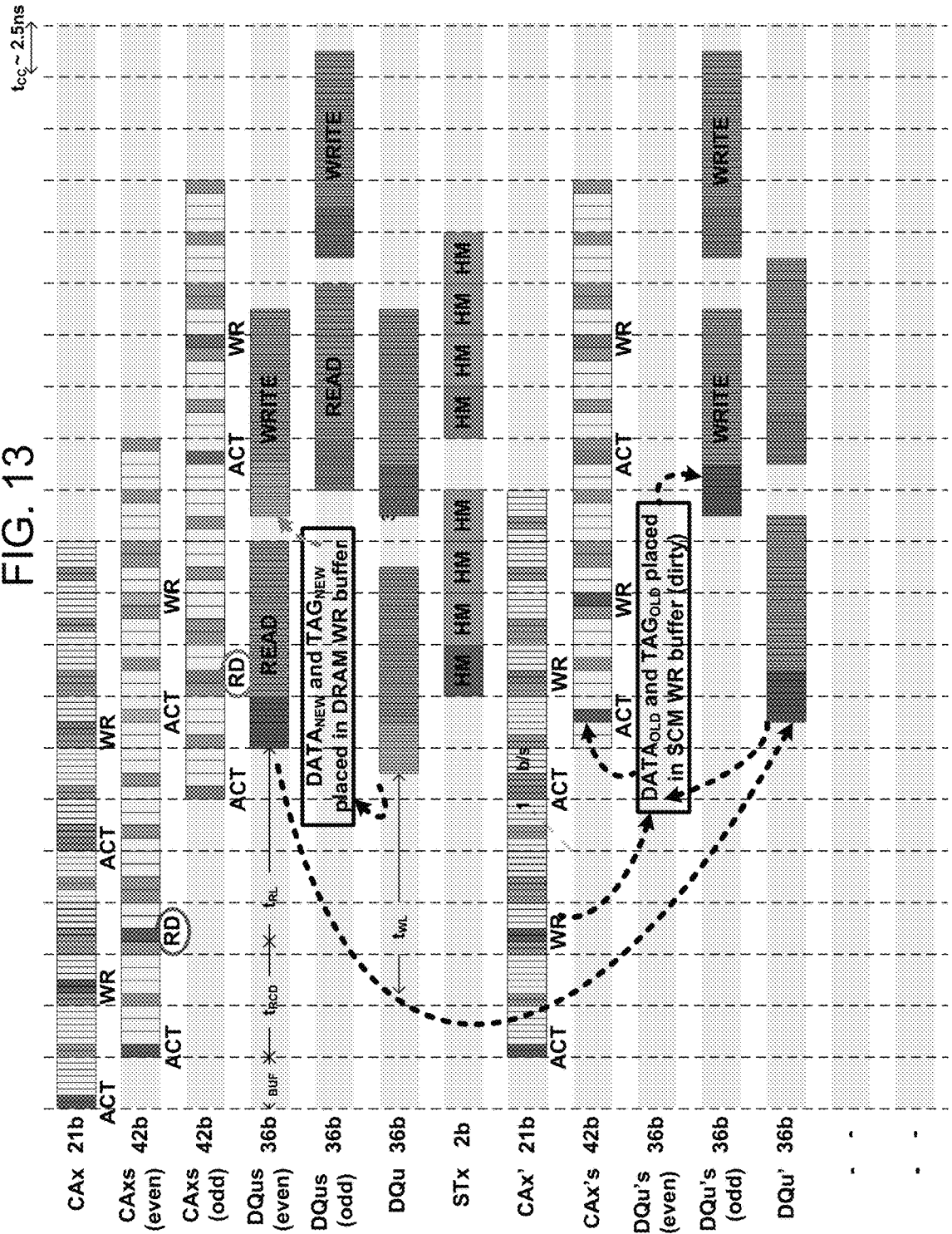

FIG. 13 illustrates the relative timing involved for various operations undertaken to accomplish odd/even nibble sequencing for cache write hit and miss cases. The sequencing takes advantage of the temporary storage of the tag and data in the buffers for the write operations of FIG. 12. Alternating read and write operations for odd and even nibbles attached to the data buffers minimizes turnaround time latency, and maximizes the bandwidth of the channel.

FIG. 14 shows a portion of a DRAM module, such as that shown in FIG. 9, with tag matching circuitry distributed across the DRAM module via multiple data buffer components DB, rather than being employed in the single CA buffer RCD, such as in FIG. 9, at 904. Also shown is a portion of a data buffer 1400 that includes tag compare circuitry 1404. The status link STx interfaces the memory controller 902 to the CA buffer component RCD$_D$. A match link 1402 is routed along the modules between the various data buffers DB allows the data buffers DB to communicate the results of each match for each buffer along the match link to the CA buffer RCD, such that the results can be sent to the memory controller 902 to control cache operations. The tag compare circuitry 1404 is replicated in each data buffer DB and includes an XOR circuit 1406, which receives as its input old tag information TAG$_{OLD}$ [i] and new tag information TAG$_{NEW}$[i] (from the tag field). The XOR output, at 1408, is then masked or ORed by an OR gate 1410 with an output from a control register 1412 (set at initialization). The output from the OR gate 1410 may then undergo a timing adjustment, at 1414, and transmitted out along the match link 1402 to the CA buffer RCD. Distributing the tag status information in this manner may reduce pin counts. Alternatively the TAG$_{OLD}$ from the DRAM read can be transferred from the DB component to the RCD component where the TAG comparison is done. This may require more pins on the buffer components.

FIGS. 15A-15I illustrate high-level system configuration diagrams for various embodiments that may serve as alternatives to the systems, modules, and memory devices described above. The embodiments of FIG. 15E and FIG. 20 are similar to the DV4 system in FIG. 8, except that the embodiment of FIG. 8 uses a no-allocate-on-read cache policy, whereas the embodiment of FIGS. 15E and 20 will allow allocation on read operations (as will the other configurations). For instance, FIG. 15A shows a high-level diagram of a first pair of DRAM and SCM modules 1502 and 1504 coupled together via a back channel connection 1506, with the DRAM module 1502 connected to a memory controller 1508. A second pair of DRAM and SCM modules 1510 and 1512 are configured similarly. For this embodiment, tag comparison circuitry 1514 resides on the memory controller 1508. Associated cache operations for the embodiment of FIG. 15A are shown in FIGS. 16A-16F. A read hit operation involves reading the DRAM module 1502 directly, and providing the data directly to the memory controller 1508, as shown in FIG. 16A. For a read miss clean, shown in FIG. 16B, an additional step is carried out that involves reading the tag information and data from the SCM module 1504 as a write operation to the DRAM module 1502, and sending the read data to the memory controller 1508. For a read miss dirty, shown in FIG. 16C, the first cache operation is augmented by reading the tag and address information from the DRAM module 1502, at 1516, and writing it to the SCM module 1504, at 1518. FIGS. 16D-16F illustrate the counterpart write cache operations.

FIG. 15B shows an alternative system configuration similar to that of FIG. 15A, but instead of interfacing the DRAM modules 1502 and 1510 to the memory controller 1508, the SCM modules 1504 and 1512 communicate directly to the memory controller via point-to-point links 1520 and 1522. The associated cache operations for read and writes are illustrated in FIGS. 17A-17F. A read hit operation involves reading the DRAM module 1502 via the back channel link (utilizing the bypass formed by the steering logic in the buffer circuitry of the SCM module 1504, and providing the data to the memory controller 1508, as shown in FIG. 17A. For a read miss clean, shown in FIG. 17B, an additional step is carried out that involves reading the tag information and data from the SCM module 1504 as a write operation to the DRAM module 1502, and sending the read data to the memory controller 1508. For a read miss dirty, shown in FIG. 17C, the first cache operation is augmented by reading the tag and address information from the DRAM module 1502, at 1702, and writing it to the SCM module 1504, at 1704. FIGS. 17D-17F illustrate the counterpart write cache operations.

FIG. 15C illustrates a further system embodiment similar to FIG. 15A, with the DRAM modules coupled directly to the memory controller 1508. The tag comparison circuitry 1514 however, is disposed on each SCM module 1504 and 1512, instead of the memory controller 1508. The associated cache operations are shown in FIGS. 18A-18F. A read hit operation involves reading the DRAM module 1502 directly, providing the tag information to the tag comparison circuit 1514 via the back channel 1520, and providing the data directly to the memory controller 1508, as shown in FIG. 18A. For a read miss clean, shown in FIG. 18B, an additional step is carried out that involves reading the tag information and data from the SCM module 1504 as a write operation to the DRAM module 1502, and sending the read data to the memory controller 1508. For a read miss dirty, shown in FIG. 18C, the first cache operation is augmented by writing the tag and address information to the SCM module 1504, at 1802. FIGS. 18D-18F illustrate the counterpart write cache operations.

FIG. 15D illustrates yet another system embodiment similar to FIG. 15A, but incorporating the tag comparison circuitry 1514 on each SCM module 1504 and 1512, and directly connecting the SCM modules to the memory controller 1508 (instead of the DRAM modules). The associated cache operations are shown in FIGS. 19A-19F. A read hit operation involves reading the DRAM module 1502 via the back channel link 1520, providing the tag information to the tag compare circuit 1514, and providing the data to the memory controller 1508, as shown in FIG. 19A. For a read miss clean, shown in FIG. 19B, an additional step is carried out that involves reading the tag information and data from the SCM module 1504 as a write operation to the DRAM module 1502, and sending the read data directly to the memory controller 1508. For a read miss dirty, shown in FIG. 19C, the first cache operation is augmented by writing the tag and address information to the SCM module 1504, at 1902. FIGS. 19D-19F illustrate the counterpart write cache operations.

FIG. 15E illustrates a four-module embodiment similar to the embodiment shown above with respect to FIGS. 7-14, utilizing the tag comparison circuitry 1514 on each DRAM module 1502 and 1510, and coupling the DRAM modules directly to the memory controller 1508. The associated cache operations are shown in FIGS. 20A-20F. A read hit operation involves reading the DRAM module 1502 directly, and providing the data directly to the memory controller 1508, as shown in FIG. 20A. For a read miss clean, shown in FIG. 20B, an additional step is carried out that involves reading the tag information and data from the SCM module 1504 via the back channel link 1520 as a write operation to the DRAM module 1502, and sending the read data directly to the memory controller 1508. For a read miss dirty, shown in FIG. 20C, the first cache operation is augmented by reading the tag and address information from the DRAM module 1502, at 2002, and writing it to the SCM module 1504, at 2004. FIGS. 20D-20F illustrate the counterpart write cache operations.

FIG. 15F illustrates yet another system embodiment similar to FIG. 15A, but incorporating the tag comparison circuitry 1514 on each DRAM module 1502 and 1510, and directly connecting the SCM modules 1504 and 1512 to the memory controller 1508 (instead of the DRAM modules). The associated cache operations are shown in FIGS. 21A-21F. A read hit operation involves reading the DRAM module 1502 via the back channel link 1520, comparing the tag information with the tag compare circuitry 1514, and providing the data to the memory controller 1508, as shown in FIG. 21A. For a read miss clean, shown in FIG. 21B, an additional step is carried out that involves reading the tag information and data from the SCM module 1504 as a write operation to the DRAM module 1502 (via the back channel link 1520), and sending the read data from the SCM module 1504 directly to the memory controller 1508. For a read miss dirty, shown in FIG. 21C, the first cache operation is augmented by reading the tag and address information from the DRAM module 1502, at 2102, and writing it to the SCM module 1504, at 2104. FIGS. 21D-21F illustrate the counterpart write cache operations.

FIG. 15G illustrates a high-level diagram showing a 3-module system configuration that employs a first DRAM module 1524 interconnected to an SCM module 1526 via a first back channel connection 1528. The SCM module interfaces with a second DRAM module 1530 via a second back channel connection 1532, such that both DRAM modules 1524 and 1530 interface with the memory controller 1508 directly.

FIG. 15H illustrates a high-level 3-module configuration similar to FIG. 15G, but incorporates a first SCM module 1532 interconnected to a DRAM module 1534 via a first backchannel connection 1536. The DRAM module interfaces with a second SCM module 1538 via a second back channel connection 1540, such that both SCM modules 1532 and 1538 interface with the memory controller 1508 directly.

FIG. 15I illustrates a high-level dual-module system configuration that generally employs an SCM module 1542 and a DRAM module 1544 that are interconnected by a back channel connection 1546, and where both modules are coupled to the memory controller 1508 via point-to-point links. FIGS. 22A-22F illustrate cache operations associated with the system configuration of FIG. 15I, where the tag comparison circuitry is disposed on the memory controller. A read hit operation involves reading the DRAM module 1502 directly, and providing the data directly to the memory controller 1508, as shown in FIG. 22A. For a read miss clean, shown in FIG. 22B, an additional step is carried out that involves reading the tag information and data from the SCM module 1504 as a write operation to the DRAM module 1502 via the back channel link 1514, and sending the read data directly to the memory controller 1508. For a read miss dirty, shown in FIG. 22C, the first cache operation is augmented by reading the tag and address information from the DRAM module 1502, at 2202, and writing it to the SCM module 1504, at 2204. FIGS. 22D-22F illustrate the counterpart write cache operations.

FIGS. 23A-23F illustrate cache operations associated with the system configuration of 15I, where both of the memory modules 1502 and 1504 are directly coupled to the memory controller 1508, and the tag comparison circuitry 1514 is disposed on the SCM memory module 1504. A read hit operation involves reading the DRAM module 1502 directly, providing the tag information to the tag comparison circuit 1514 via the back channel link 1520, and providing the data directly to the memory controller 1508, as shown in FIG. 23A. For a read miss clean, shown in FIG. 23B, an additional step is carried out that involves reading the tag information and data from the SCM module 1504 as a write operation to the DRAM module 1502 (via the back channel link 1520), and sending the read data directly from the SCM module 1504 to the memory controller 1508. For a read miss dirty, shown in FIG. 23C, the first cache operation is augmented by reading the tag and address information from the DRAM module 1502, at 2302, and writing it to the SCM module 1504, at 2304. FIGS. 23D-23F illustrate the counterpart write cache operations.

FIGS. 24A-24F illustrate cache operations associated with the system configuration of 15I, where the tag comparison circuitry is disposed on the DRAM memory module 1502. A read hit operation involves reading the DRAM module 1502 directly, comparing the tag information with the tag comparison circuitry 1514 and providing the data directly to the memory controller 1508, as shown in FIG. 24A. For a read miss clean, shown in FIG. 24B, an additional step is carried out that involves reading the tag information and data from the SCM module 1504 as a write operation to the DRAM module 1502 via the back channel link 1520, and sending the read data directly from the SCM module 1504 to the memory controller 1508. For a read miss dirty, shown in FIG. 24C, the first cache operation is augmented by reading the tag and address information from the DRAM module 1502, at 2402, and writing it to the SCM module 1504, at 2404. FIGS. 24D-24F illustrate the counterpart write cache operations.

FIG. 25 illustrates a chart that compares various performance characteristics between the various system configurations described above with respect to FIGS. 15A-15I. The comparison provides a continuous bandwidth summary in comparison to a baseline (such as a fraction of, for example, 25.4 GB/s or 36b at 6.4 Gb/s, with alternate accesses to odd and even nibbles. The first column notes the particular module configuration nomenclature (corresponding to the notation at the bottom portion of the chart), while the top row lists the cache operation involved, such as a read hit "RH", read miss clean "RMC", read miss dirty "RMD", write hit "WH", write hit clean "WHC" and write hit dirty "WHD."

FIG. 26 illustrates a chart that compares various power characteristics between the various system configurations described above with respect to FIGS. 15A-15I. The configuration and cache operation nomenclature of the first column and first row corresponds to that of FIG. 25.

Figure 27:
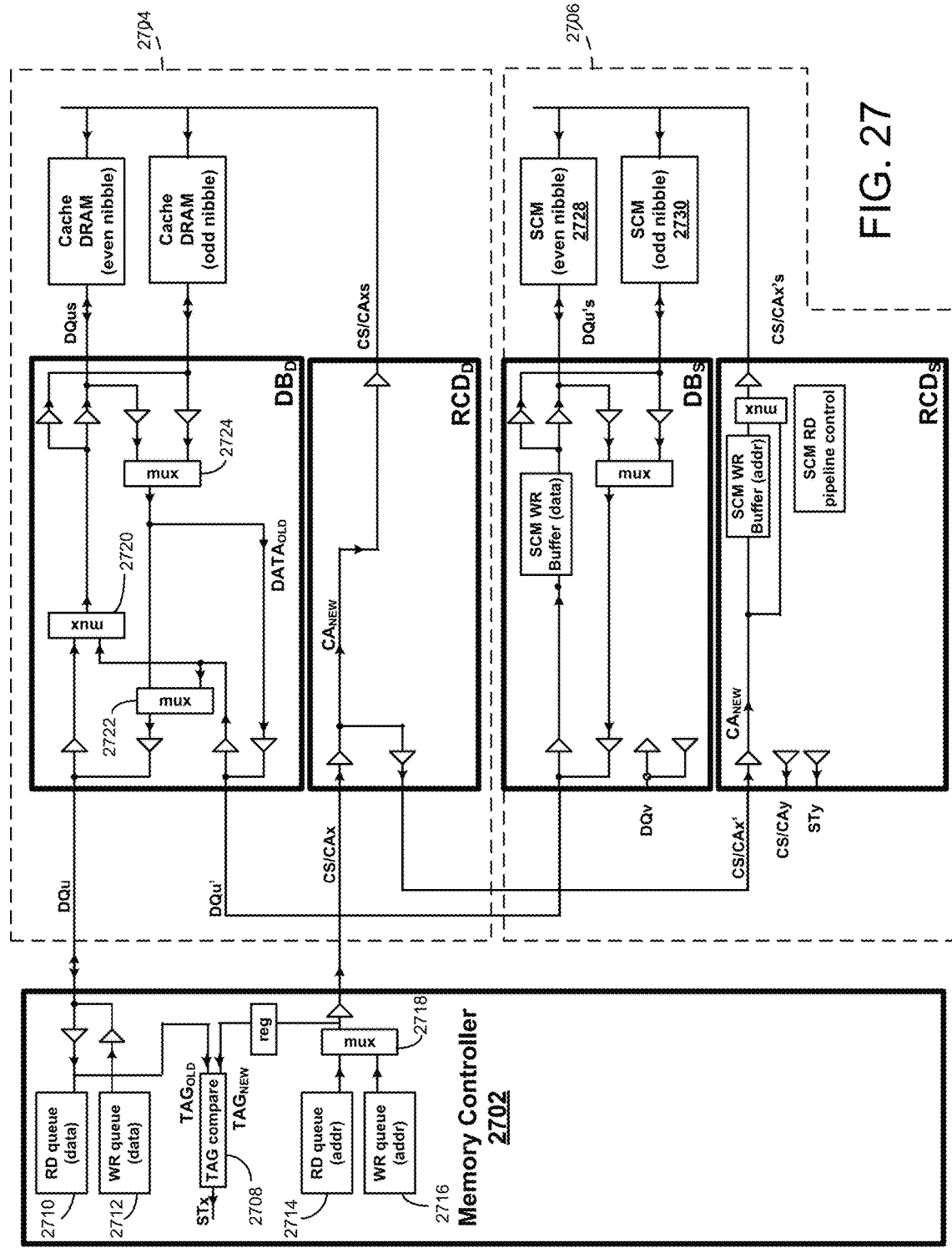
FIG. 27 illustrates further detail regarding the memory system configuration of FIG. 15A.

FIG. 27 illustrates further detail of the memory system of FIG. 15A, similar to FIG. 9, with special emphasis on the buffer circuitry for the DRAM and the SCM modules. To reiterate, this particular embodiment employs a point-to-point connection between a memory controller 2702, at least one DRAM module 2704, an SCM memory module 2706, with tag compare circuitry 2708 being disposed on the memory controller 2702. Data transfers between the memory controller 2702 and the SCM module 2706 are passed through the DRAM module 2704 via the backchannel connection DQu' and CS/CAx' between the DRAM module 2704 and SCM module 2706. The memory controller 2702 includes respective read and write data queues 2710 and 2712 coupled to data nibble DQu, which serves as a primary data link for coupling to a DRAM module data buffer component $DB_D$. The controller 2702 further includes respective read and write address queues 2714 and 2716 that are selectively coupled, via a multiplexer 2718, to CA link CS/CAx, which serves as a primary CA link for coupling the controller 2702 to the DRAM module CA buffer RCDP. Since the tag comparison circuitry 2708 resides on the memory controller 2702 for this embodiment, no status circuitry or link is employed by the memory modules 2704 and 2706. The tag comparison circuitry 2708 receives old tag information read from the DRAM module 2704, and new tag information provided with new request information as part of a new memory operation.

Further referring to FIG. 27, the each buffer component $DB_D$ on the DRAM module 2704 employs steering logic described above with respect to FIG. 3, such that the primary data interface I/O circuits coupled to links DQu and DQu' (the backchannel link) may be selectively coupled to either of the secondary data I/O circuits DQus (respective even and odd cache DRAM nibbles) via multiplexers 2720, 2722, and 2724 appropriately placed in the data transfer paths of the steering logic.

With continued reference to FIG. 27, the SCM data buffer $DB_S$ is configured similar to the DRAM module counterpart, but includes an SCM write data buffer circuit 2726 that buffers write data to SCM memory components 2728 and 2730. In a similar manner, the SCM module CA buffer $RCD_S$ includes an SCM write address buffer circuit 2732 that provides buffered write addresses to the SCM memory components 2728 and 2730. Since the connections between the memory controller 2702 and the memory modules 2704 and 2706 are made through the DRAM module 2704, the steering logic for the data buffers $DB_D$ and $DB_S$ generally provides steering capability between one primary data circuit (the backchannel link DQu'), to either of the secondary data I/O circuits DQus and DQu's. However, to control the backchannel link DQu', bypass compare logic may be employed.

Figure 28:
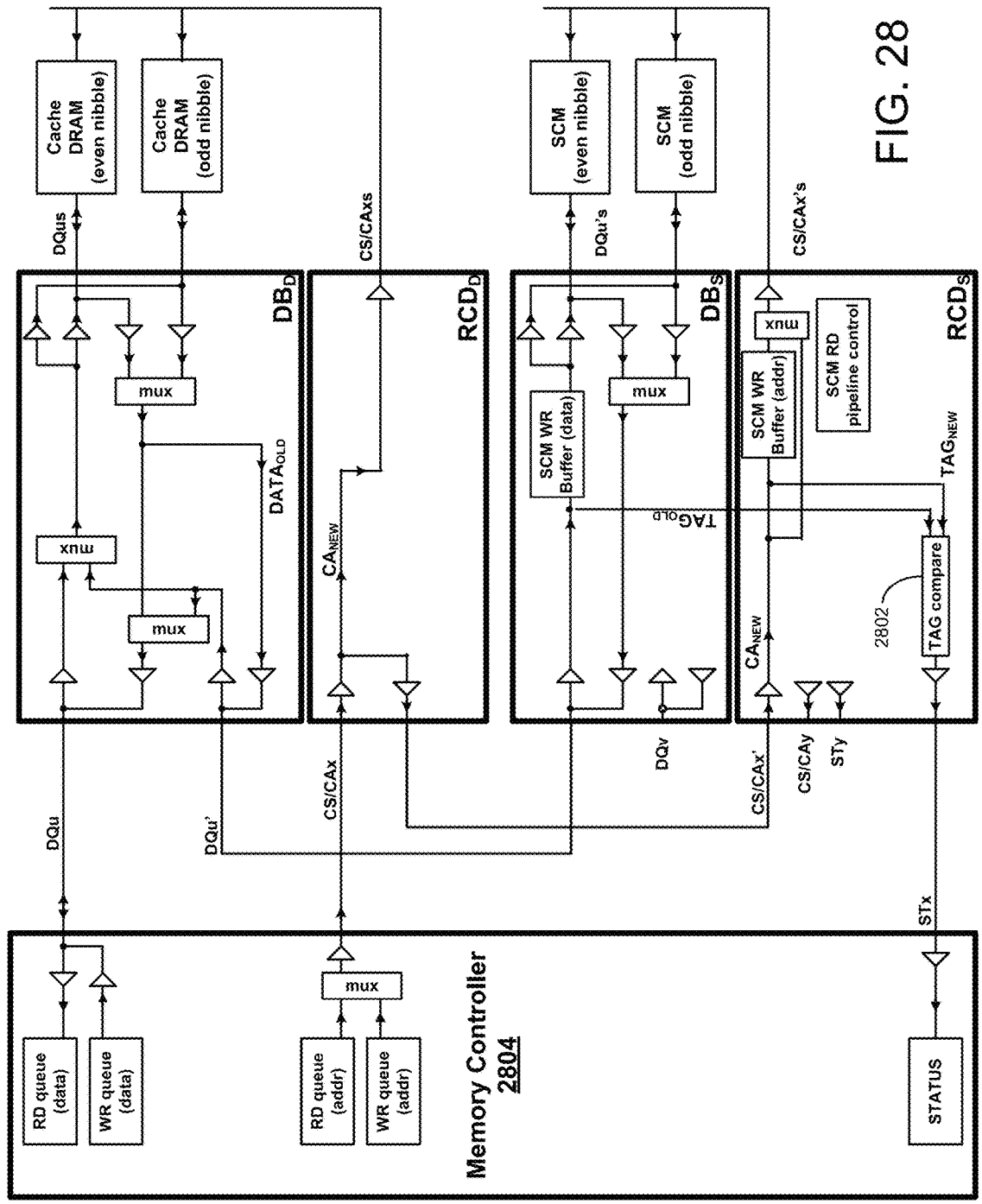
FIG. 28 illustrates further detail regarding the memory system configuration of FIG. 15C.

FIG. 28 illustrates a memory system configuration, with special emphasis on the buffer component circuitry, similar to FIG. 27, with tag comparison circuitry 2802 resident on an SCM module CA buffer component $RCD_S$, rather than in a memory controller 2804. With the tag comparison circuitry 2802 residing on the SCM CA buffer RCDs, a status link STx couples the SCM CA buffer $RCD_S$ to the memory controller 2804 to provide the cache status information. Most of the remaining system construction is similar to the system of FIG. 27.

Figure 29:
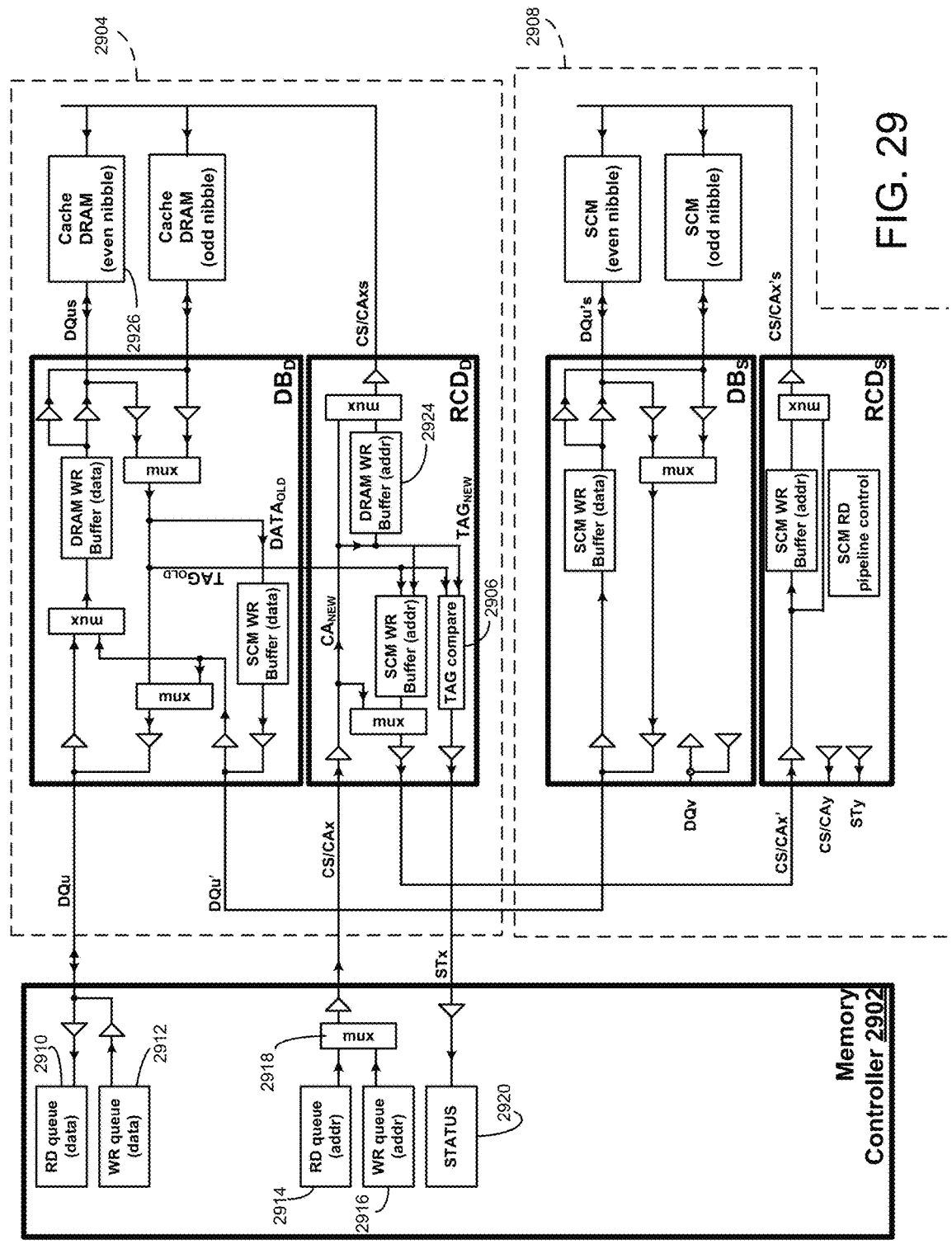
FIG. 29 illustrates further detail regarding the memory system configuration of FIG. 15E.

FIG. 29 illustrates a memory system configuration similar to that shown in FIG. 9, without optional data delay circuitry in the DRAM data buffer $DB_D$, nor optional address delay circuitry in the DRAM CA buffer component $RCD_D$. This particular embodiment employs a point-to-point connection between a memory controller 2902 and at least one DRAM module 2904, and also incorporates tag compare circuitry 2906 on the DRAM module. Data transfers between the memory controller 2902 and an SCM module 2908 are passed through the DRAM module 2904 via a back channel connection DQu' between the DRAM module 2904 and the SCM module 2908. The memory controller 2902 includes respective read and write data queues 2910 and 2912 coupled to data nibble DQu, which serves as a primary data link for coupling to a DRAM module data buffer component $DB_D$. The memory controller 2902 further includes respective read and write address queues 2914 and 2916 that are selectively coupled, via a multiplexer 2918, to CA link CS/CAx, which serves as a primary CA link for coupling the memory controller 2902 to a DRAM module CA buffer $RCD_D$. Status circuitry "STATUS" 2920 interfaces with the DRAM CA buffer component $RCD_D$ via a status link STx, which provides information concerning tag compare operations, as described below.

Further referring to FIG. 29, the each buffer component $DB_D$ on the DRAM module 2904 employs steering logic described above with respect to FIG. 3, such that the primary data interface I/O circuits coupled to links DQu and DQu' (the backchannel link) may be selectively coupled to either of the secondary data I/O circuits DQus (respective even and odd cache DRAM nibbles) via multiplexer circuitry appropriately placed in the data transfer paths of the steering logic.

With continued reference to FIG. 29, the DRAM CA buffer $RCD_D$ includes a DRAM write address buffer circuit 2924 that provides buffered write addresses to DRAM memory components 2926. The tag compare circuit 2906 also resides on the CA buffer component $RCD_D$, which receives new tag information for a requested address with old tag information provided by the DRAM data buffer via a tag communication path $TAG_{OLD}$. The results of the tag comparison are then fed back to the memory controller 2902 via the status link STx, so that the controller can dispatch any commands necessary for additional cache operations associated with "miss" cases. CA information passed to the DRAM module 2904 via the CA link CS/CAx link is redriven by the DRAM module to the SCM module 2908 via a CA backchannel link CS/CAx'.

The SCM memory module data buffer components $DB_S$ and CA buffer component $RCD_S$ are configured similar to their DRAM module counterparts. However, since the connections between the memory controller 2902 and the memory modules 2904 and 2908 are made through the DRAM module 2904, the steering logic for the data buffers $DB_D$ and $DB_S$ generally provides steering capability between one primary data circuit (the back channel link), to either of the secondary data I/O circuits.

Figure 30:
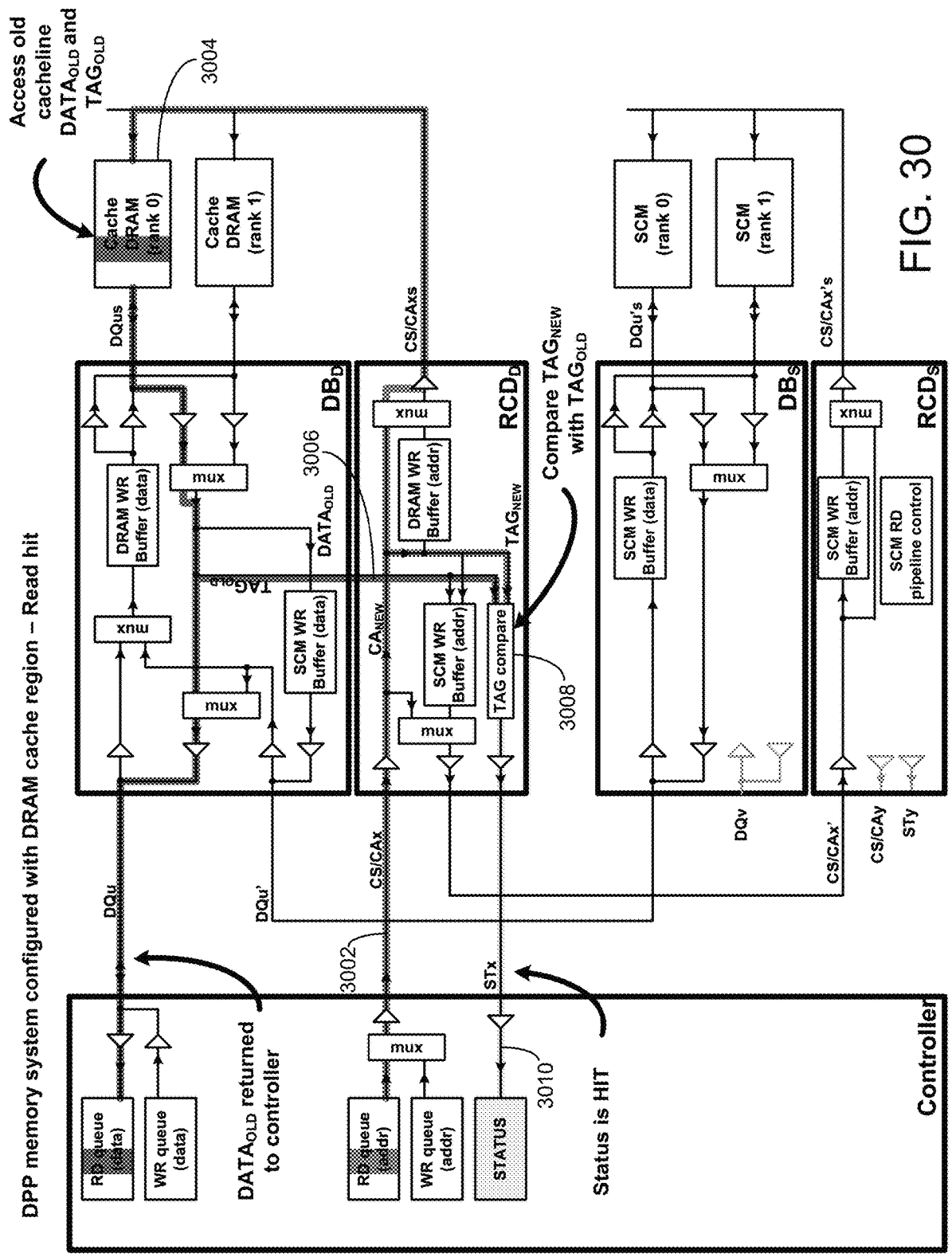
FIGS. 30-36 illustrate further detail regarding various cache operations with respect to various system configurations.

FIG. 30 illustrates the memory system configuration of FIG. 29, highlighted to show the various signal paths operative during cache operations involving a read hit. As shown, a first read operation takes place where a read command is dispatched, at 3002, along primary DRAM CA path CS/CAx to the DRAM CA buffer component $RCD_D$.

The command propagates to the secondary CA path CS/CAxs, and is fed to a first rank (rank 0) of the DRAM cache memory, at 3004. The old cacheline data and tag information is accessed, read out and transferred first along the secondary data path DQus, to the data buffer component $DB_D$, and steered by the buffer steering logic to the primary data interface path DQu. Concurrently, for one embodiment, the old cacheline tag information $TAG_{OLD}$ is passed from the data buffer $DB_D$ along, for example, an extension to a BCOM bus, at 3006, that interconnects all of the data buffers $DB_D$ on the DRAM module with the CA buffer component $RCD_D$. The tag compare logic, at 3008, on the CA buffer receives the old tag information via the BCOM bus, and new tag information received from the primary CA path CS/CAx when the original DRAM read command was received. The output of the tag comparison is then driven along the status line $ST_X$ to the memory controller, at 3010. For some embodiments, the BCOM bus may be further extended to allow for the propagation of tag compare information or partial tag status information. The memory controller then uses the received tag status to determine whether or not the data read from the DRAM cache is the current data for the requested address (a read hit case).

Figure 31:
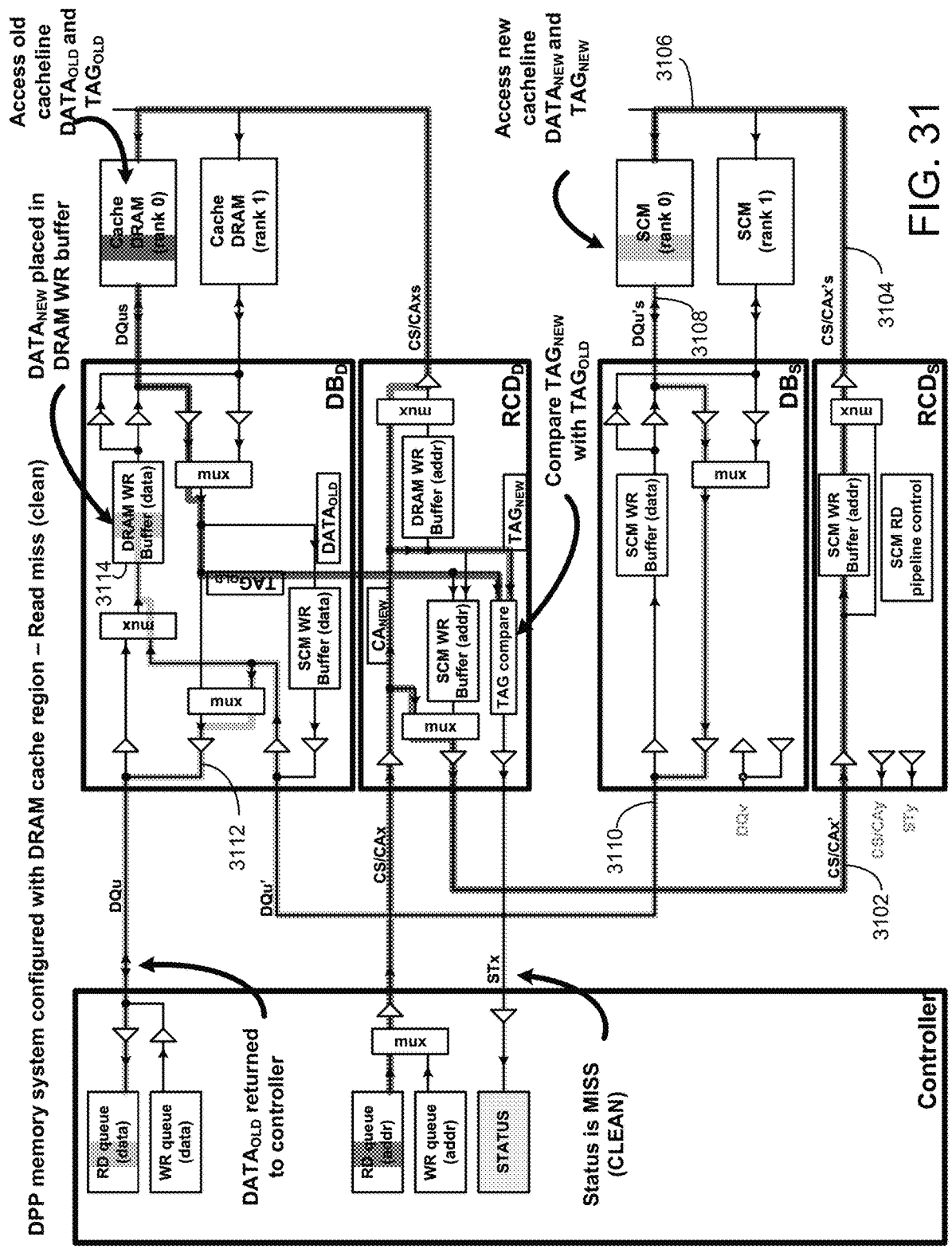

FIG. 31 illustrates the memory system of FIG. 30, including the highlighting relating to a read hit condition, but also includes highlighted signaling paths involved in cache operations where the status of the tag compare results in a read miss clean case. The operations involved in reading the DRAM cache, and comparing the tag information are still the same as described above with respect to FIG. 30, but additional cache operations are carried out regarding the SCM module. To provide the controller with the correct data, the SCM memory module is read by dispatching a read command along the primary CA link CS/CAx, and directing the command through the DRAM CA buffer $RCD_D$, along the backchannel connection CS/CAx', to the SCM CA buffer $RCD_S$, at 3102. The command is then fed along the secondary CA link CS/CAx's, at 3104, to a first rank (rank 0) of the SCM memory, at 3106. New cacheline data and tag information is then accessed from the SCM memory, passed along secondary data link DQu's, at 3108, and through an SCM data buffer component $DB_S$. The new data and tag information is then transferred along the backchannel link DQu', at 3110, and received at the DRAM data buffer component $DB_D$. The data is then steered by the buffer steering logic to both the memory controller, via primary data path DQu, at 3112, and the DRAM write buffer, at 3114. The buffer contents may then be written to DRAM cache at an appropriate timing interval.

Figure 32:
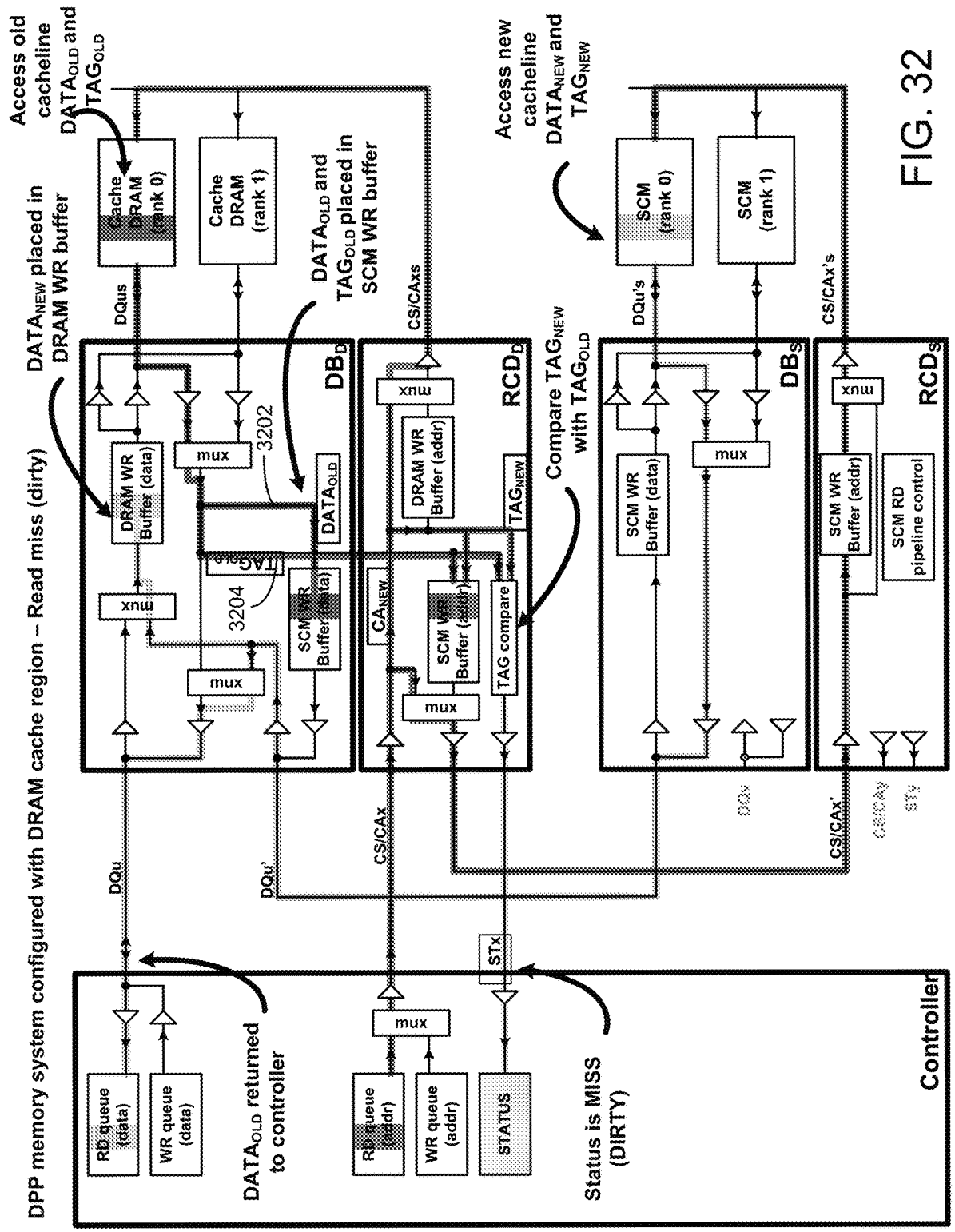

Referring now to FIG. 32, for a read miss dirty case, the cache operations are similar to those described above, with the addition of loading the old data and old tag information to the SCM write buffers, at 3202 and 3204. The information may then be written to the SCM memory at an appropriate time interval.

Figure 33:
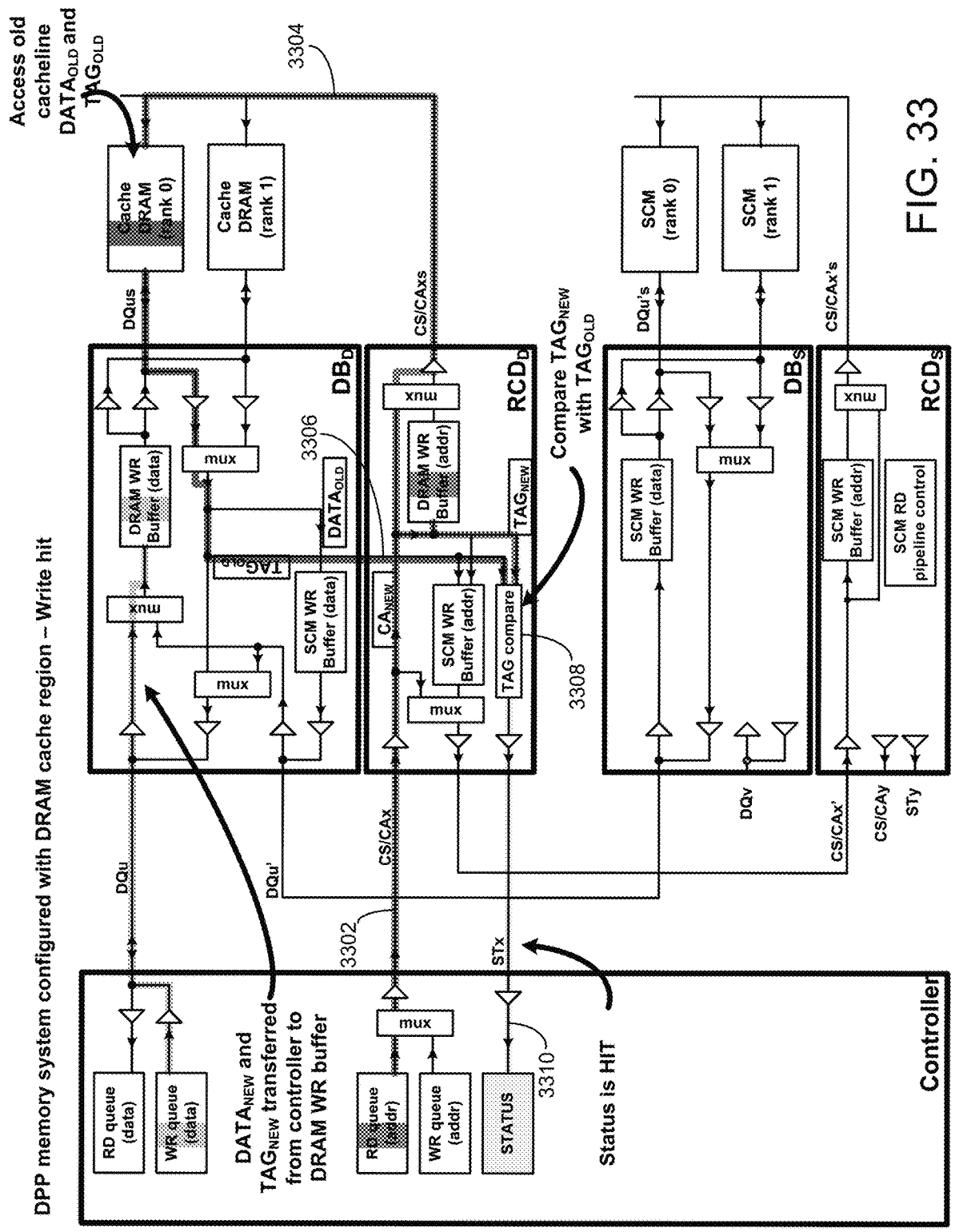
Figure 34:
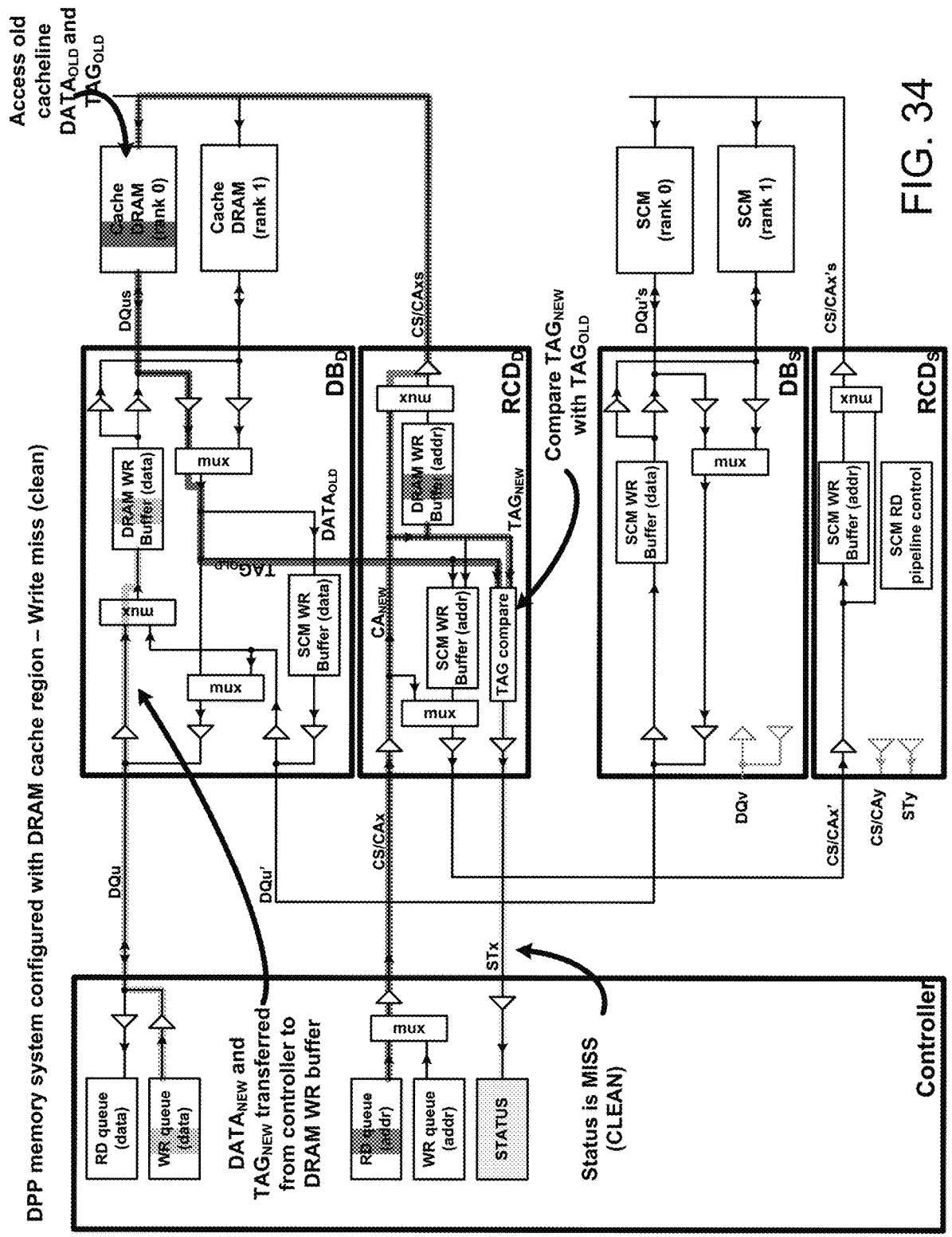
Figure 35:
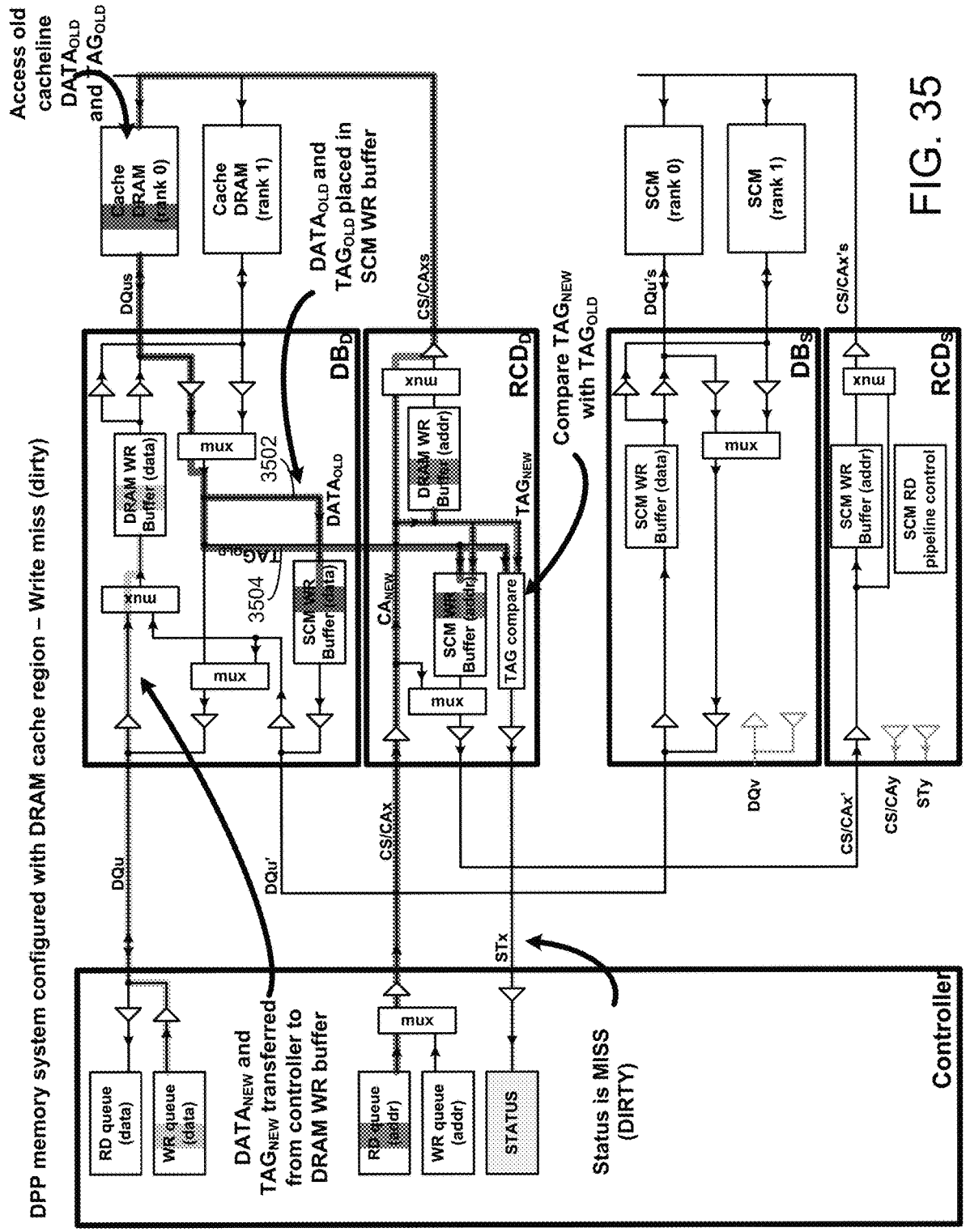

FIGS. 33-35 illustrate cacheline operations similar to those described above in FIGS. 30-32, but for write operations rather than read operations.

Figure 36:
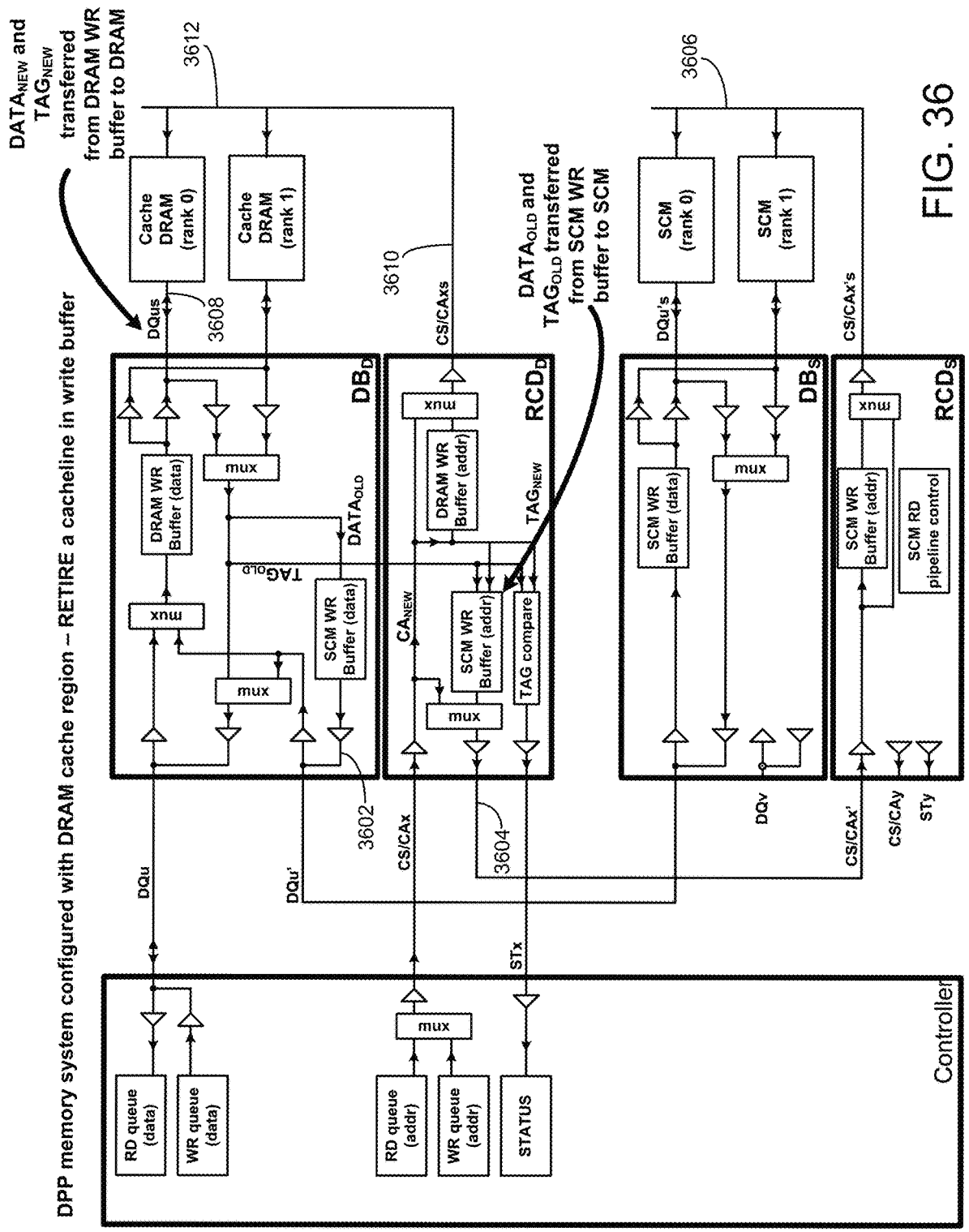

FIG. 36 illustrates a cacheline operation involving retiring a cacheline in the write buffer. The retire operations will typically be initiated by a bit field in a read or write column command, possibly with a static delay. Generally, the operations involve transferring old data and tag information from SCM write buffers (data and address), at 3602 and 3604, to the SCM memory, at 3606. The new data and tag information is transferred from the DRAM write buffers (data and address), at 3608 and 3610, to the DRAM memory, at 3612.

Figure 37:
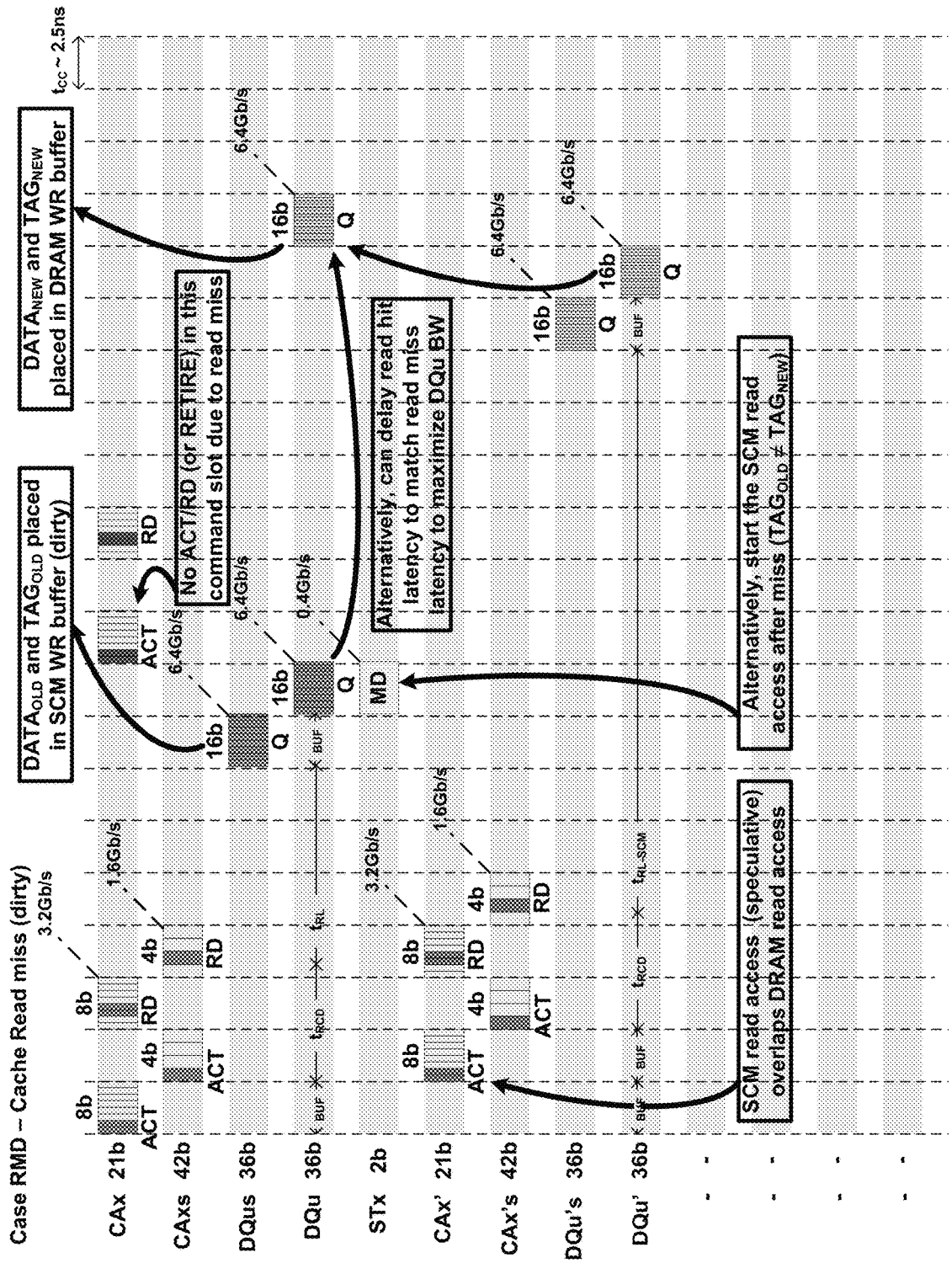
FIGS. 37-42 illustrate timing diagrams showing the timing of various cache operations in various system embodiments.
Figure 38:
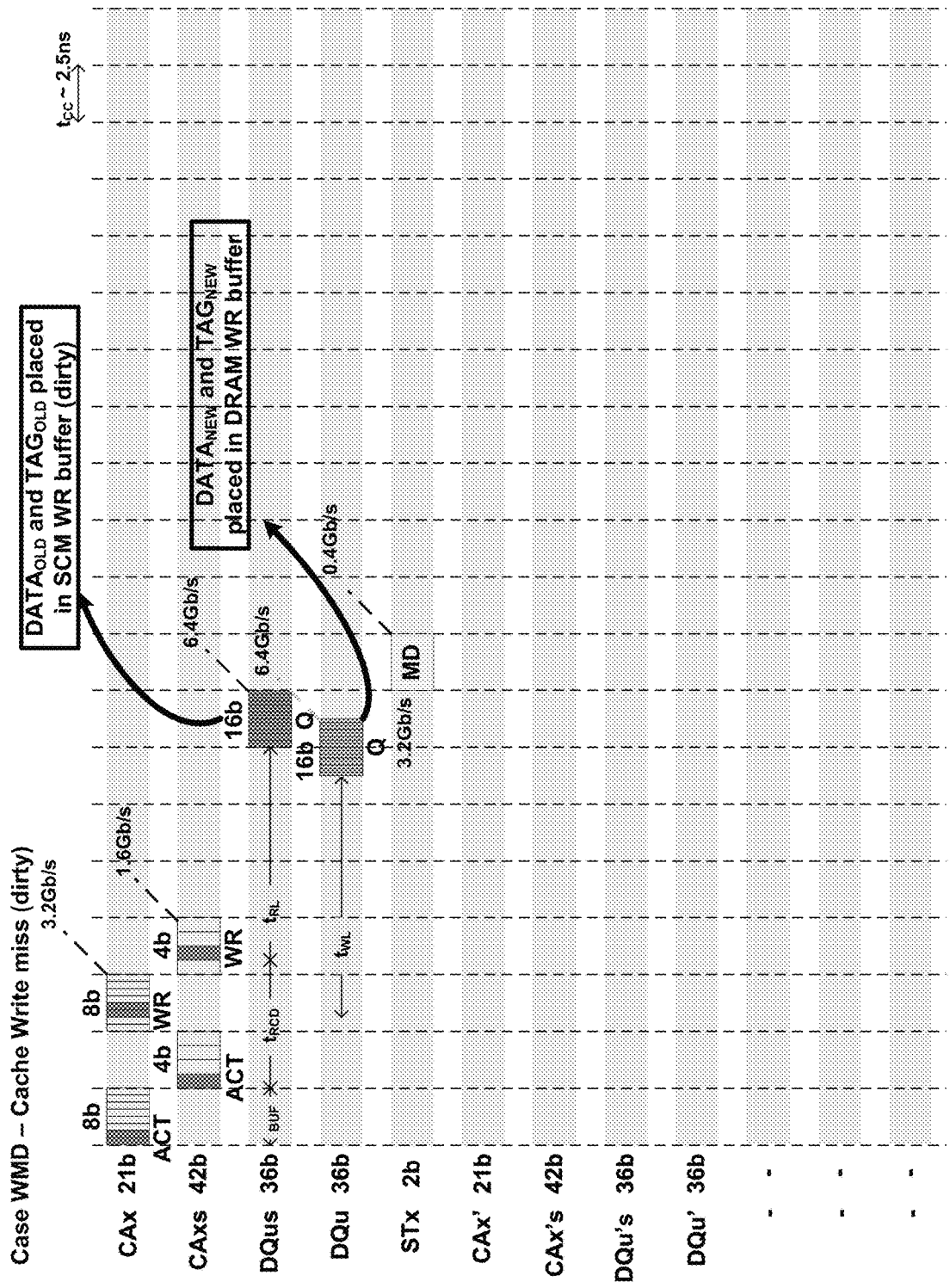
Figure 39:
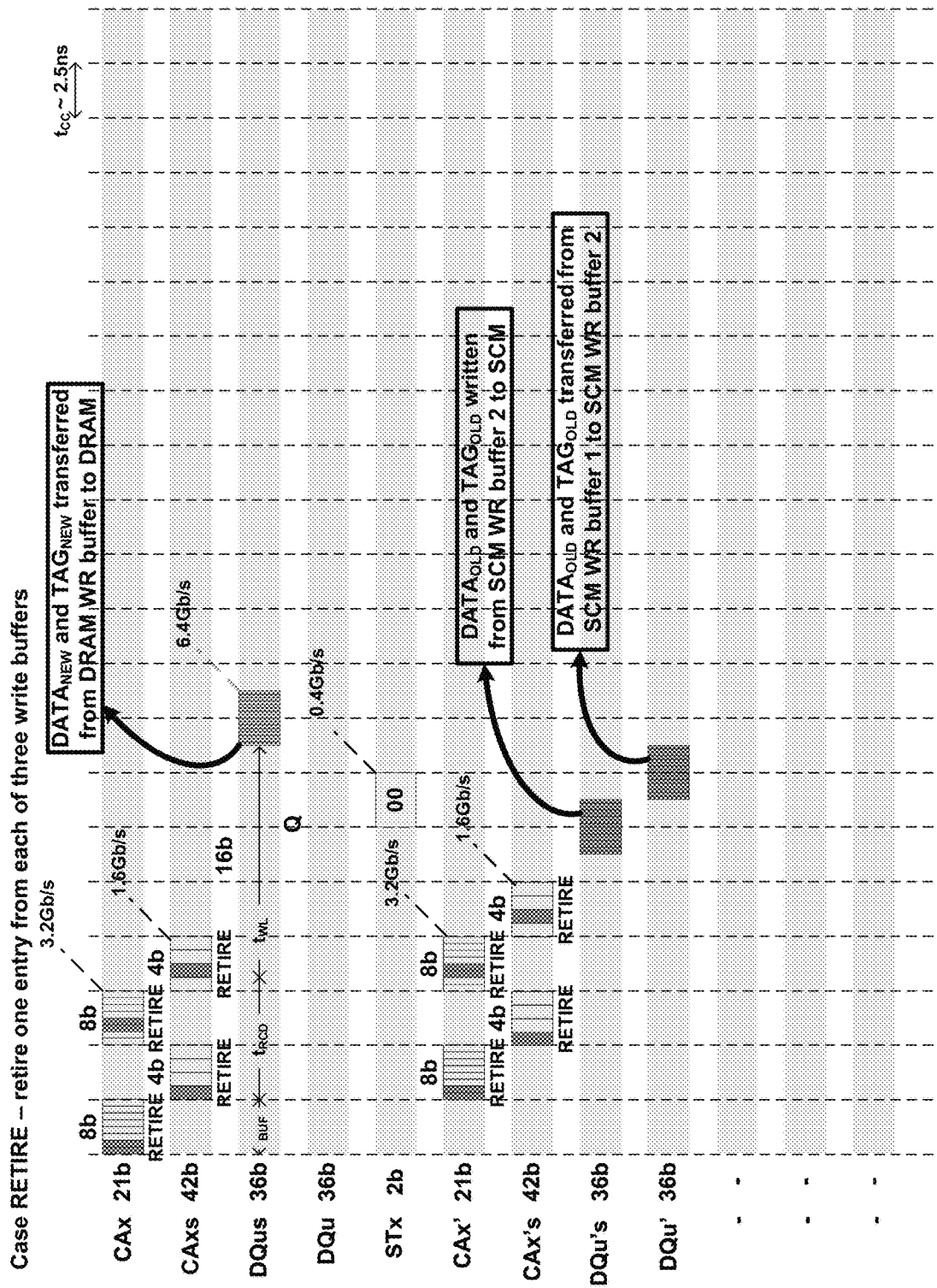
Figure 40:
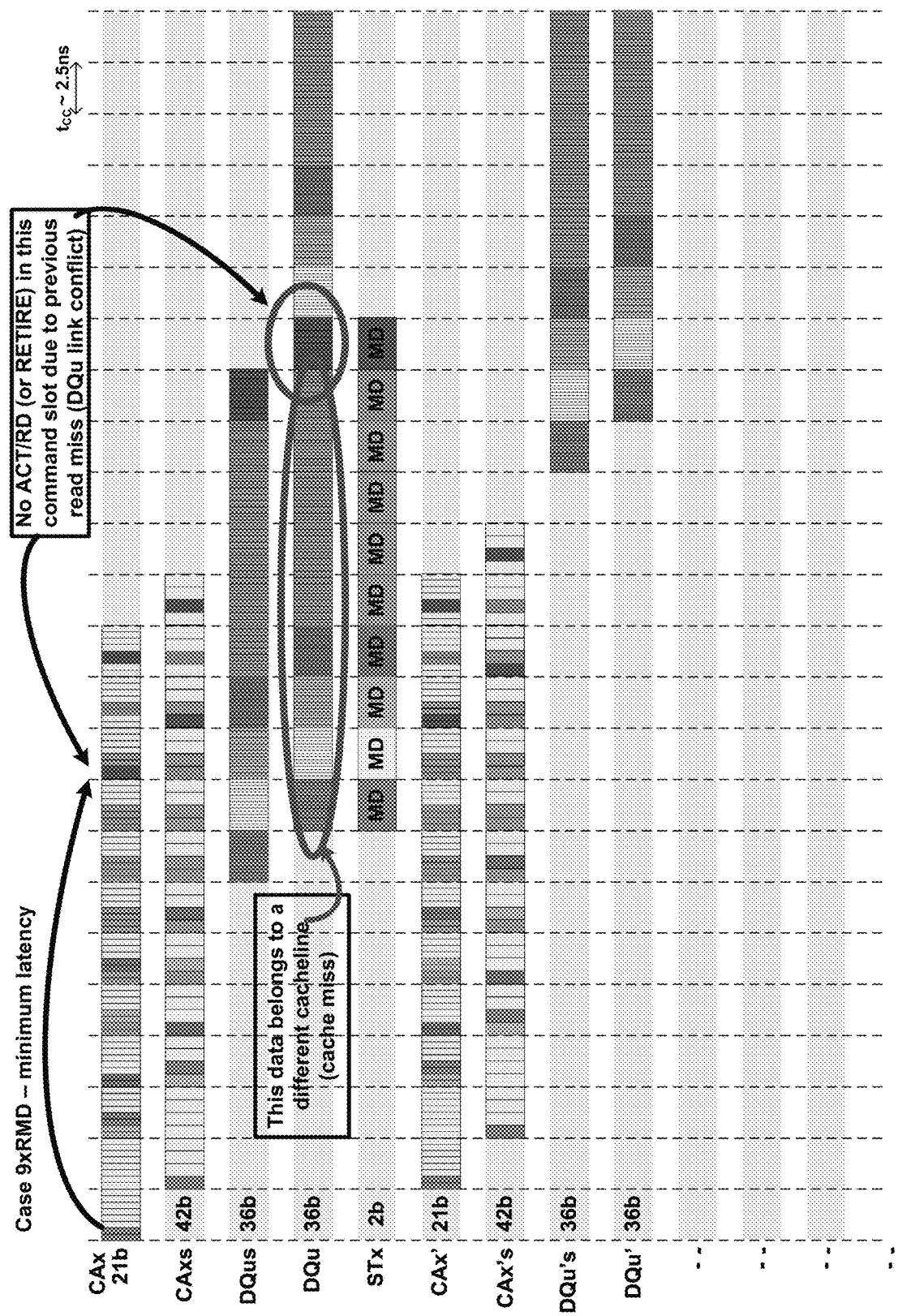
Figure 41:
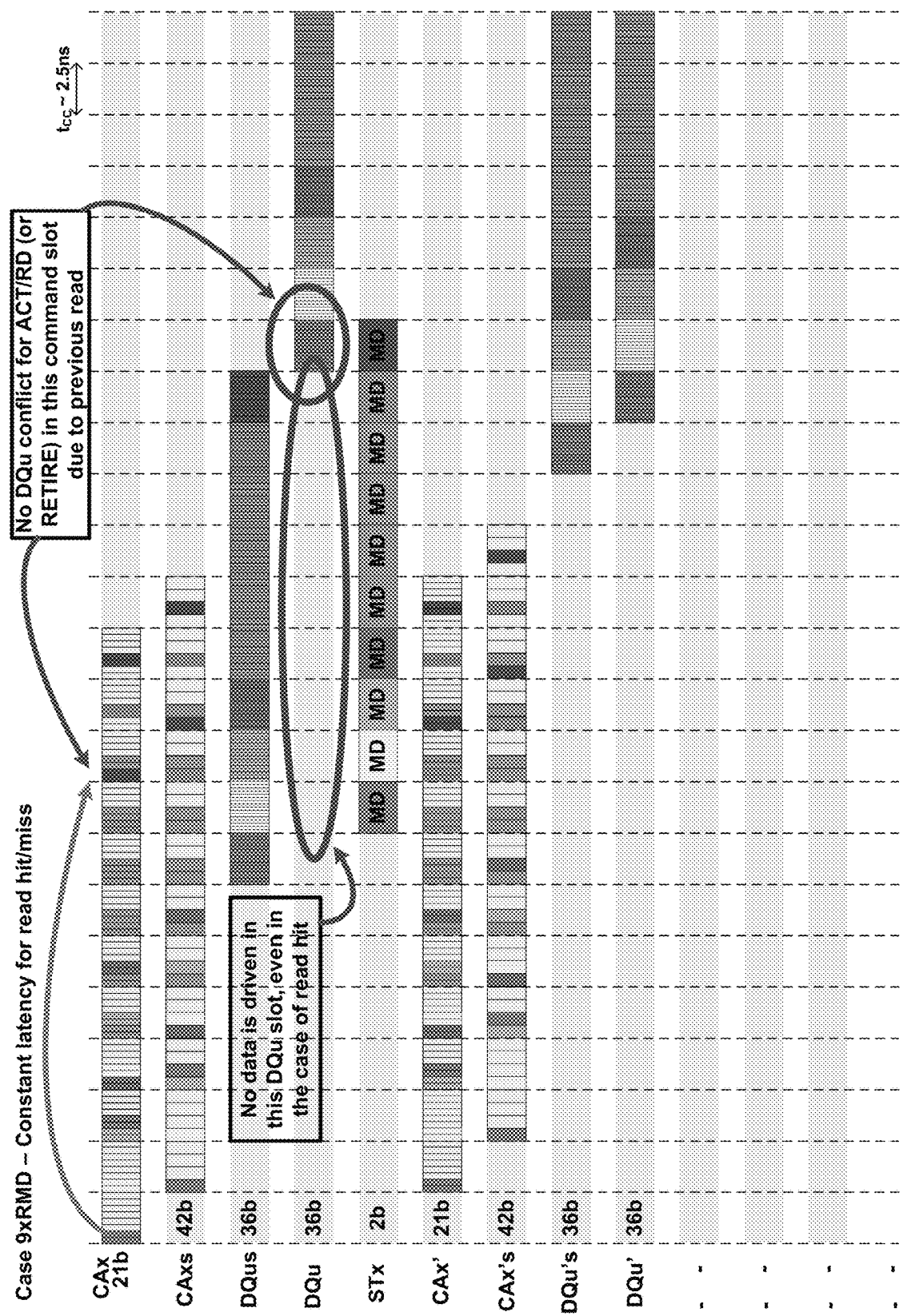
Figure 42:
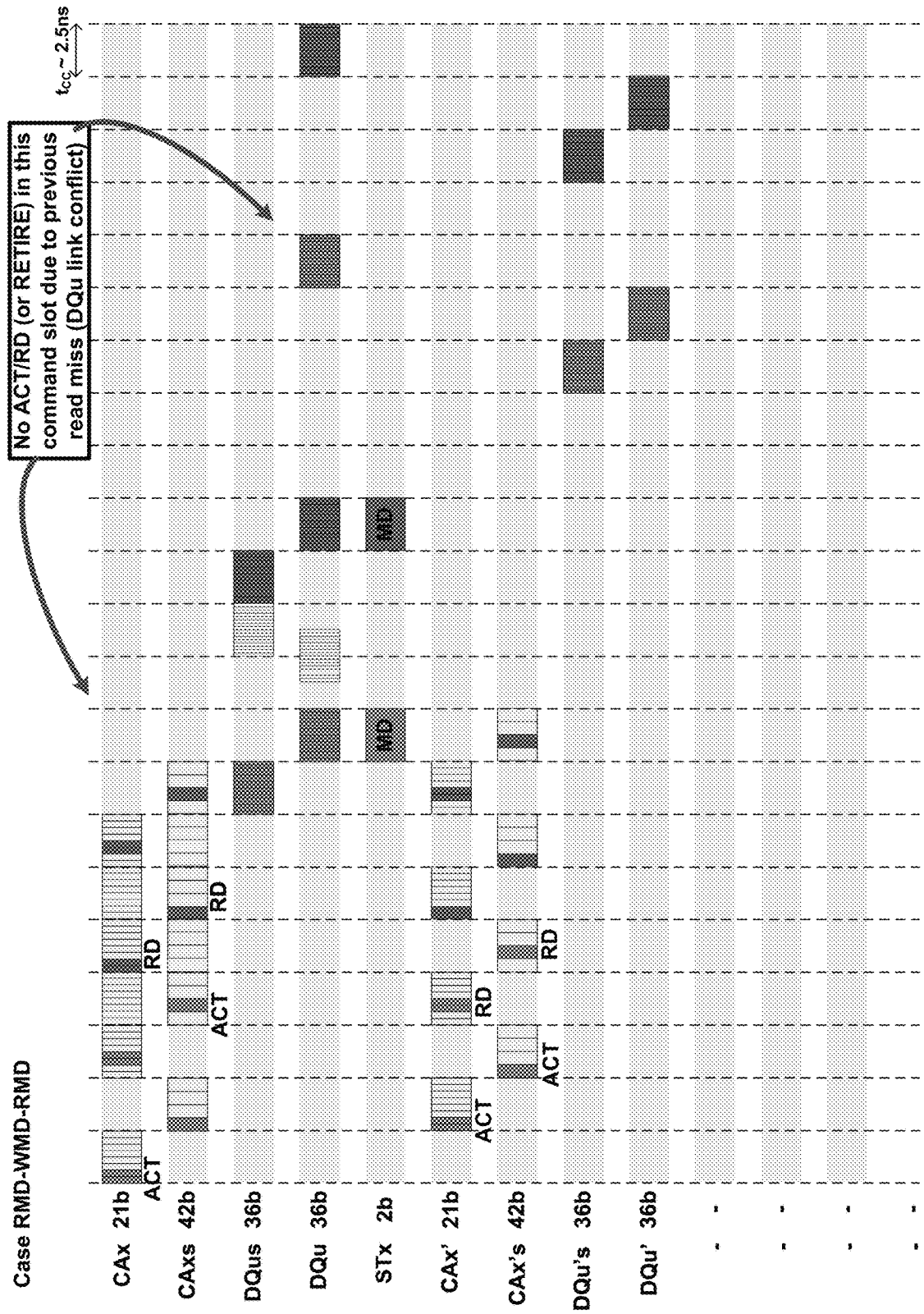

FIGS. 37-42 illustrate various timing charts relating to various cacheline operations consistent with the operations described above. FIG. 37 illustrates various operations and relative timing parameters associated with one embodiment of a cache read miss dirty sequence. FIG. 38 illustrates various operations and relative timing parameters associated with one embodiment of a cache write miss dirty sequence. FIG. 39 illustrates various timing parameters associated with a retire operation involving retiring one cache entry from each of three write buffers. FIG. 40 illustrates the minimum latency associated with read miss dirty cache operations. FIG. 41 illustrates a constant latency for read hit miss and dirty operations. FIG. 42 illustrates timing associated with back-to-back-to-back read miss dirty, write miss dirty, and read miss dirty sequences.

Figure 43:
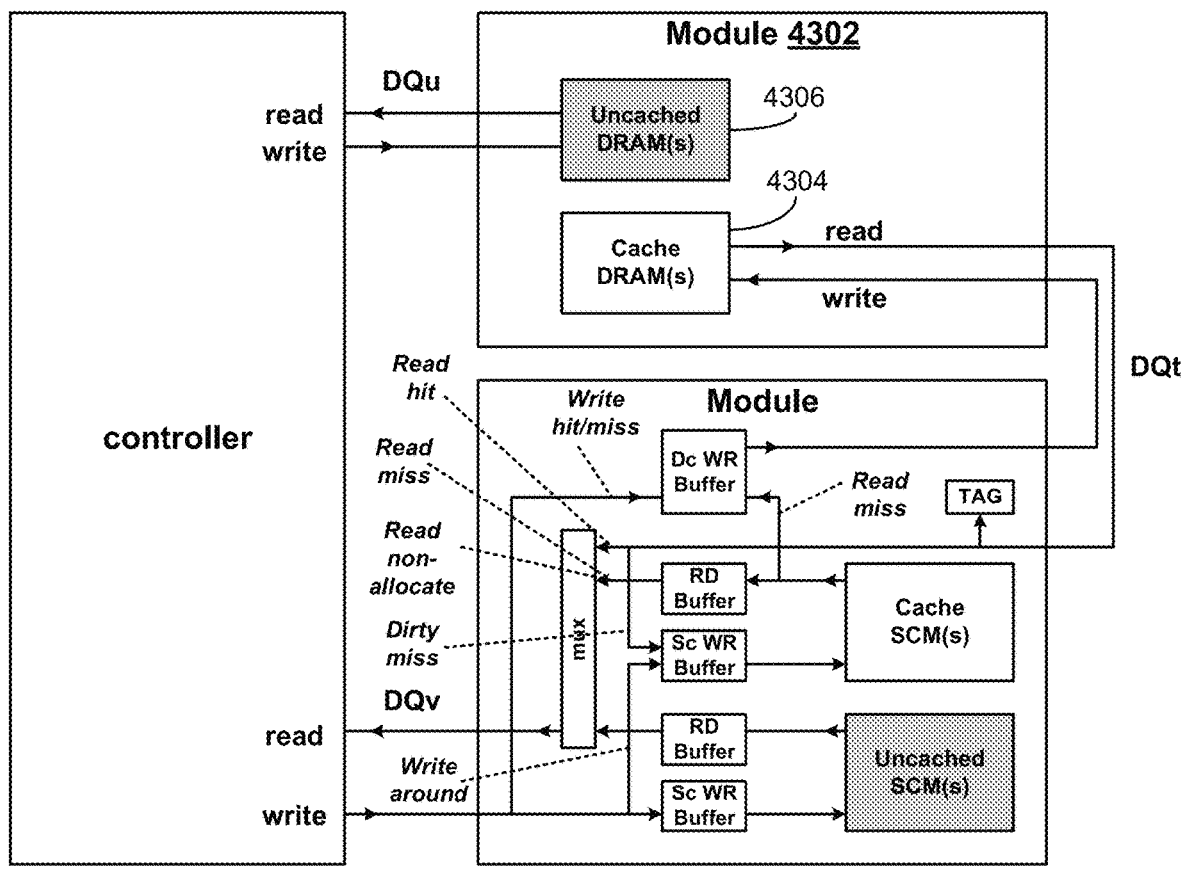
FIGS. 43-45 illustrate various system configurations.

FIG. 43 illustrates a high-level embodiment of a dual-module memory system, similar to embodiments described above, where a first portion of a DRAM memory module 4302 is utilized as cache memory, at 4304, while a second portion of the DRAM memory is uncached, at 4306. This system is similar to the SU4 system shown in FIG. 15D and FIG. 19.

Figure 44:
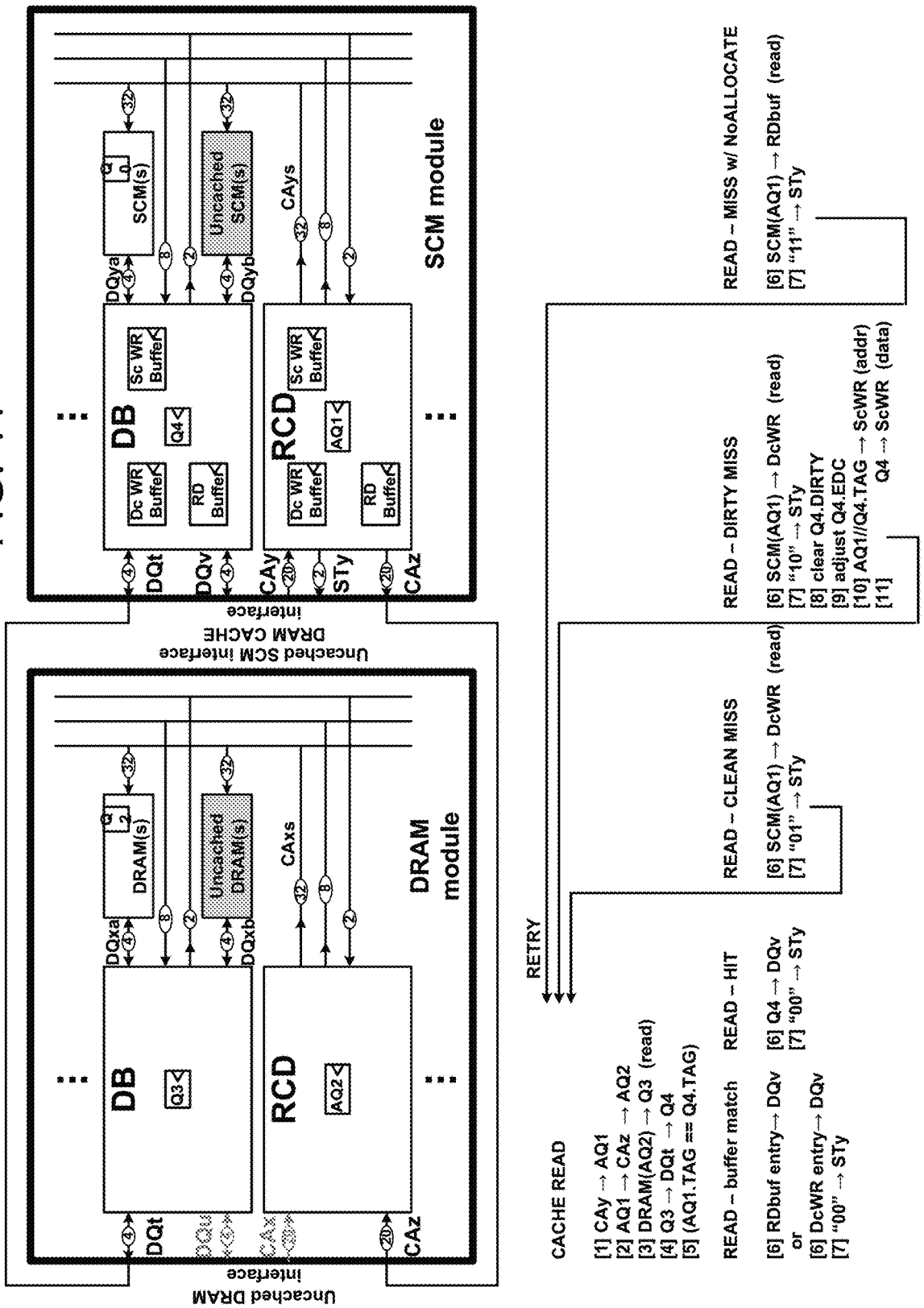

FIG. 44 illustrates further detail of the circuitry employed by respective data buffers and CA buffers on the DRAM and SCM modules of the memory system shown in FIG. 43, and associated cache operations for read operations.

Figure 45:
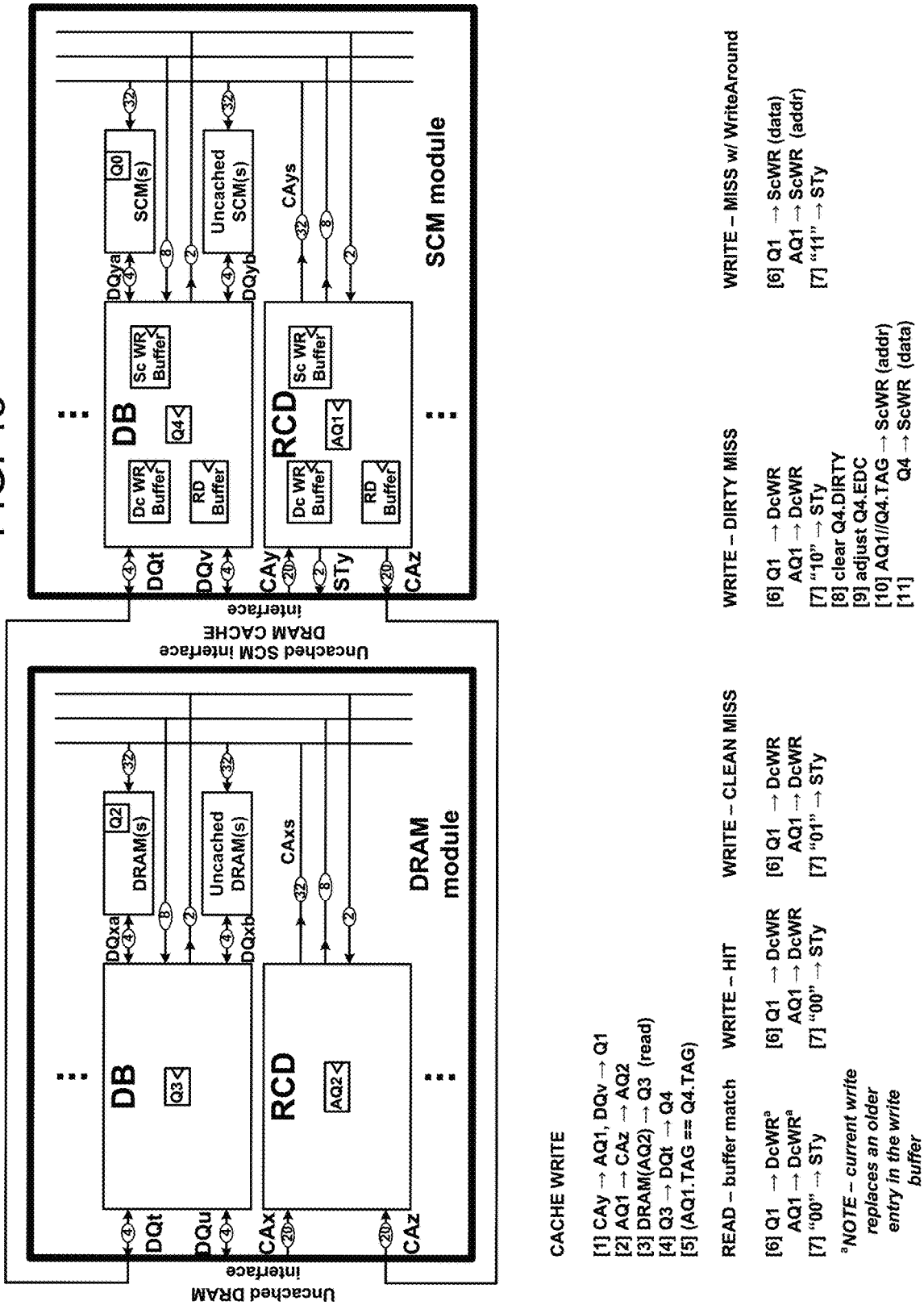

FIG. 45 illustrates further detail of the circuitry employed by respective data buffers and CA buffers on the DRAM and SCM modules of the memory system shown in FIG. 43, similar to FIG. 44 and associated cache operations for write operations.

Figure 46:
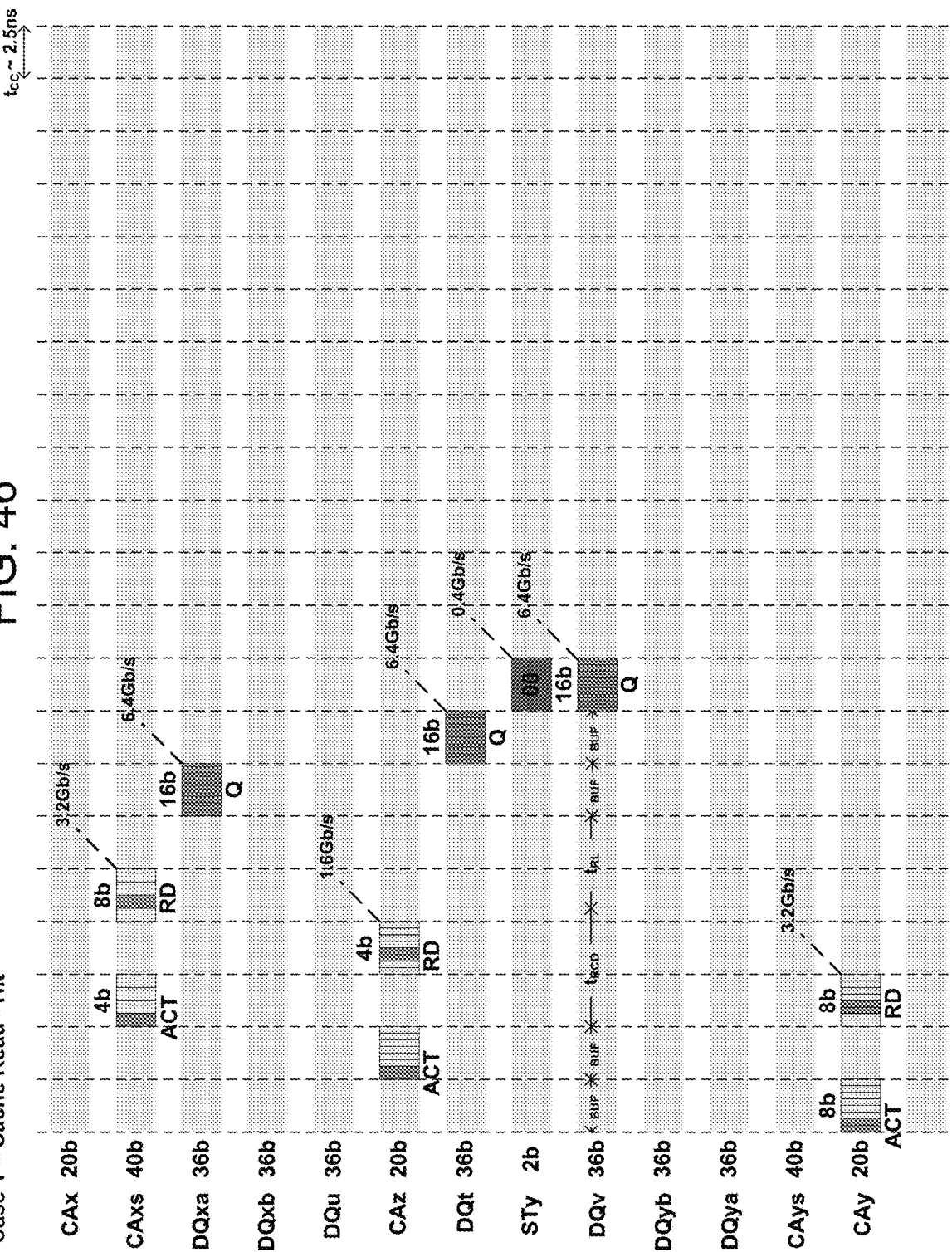
FIGS. 46-49 illustrate various timing diagrams.
Figure 47:
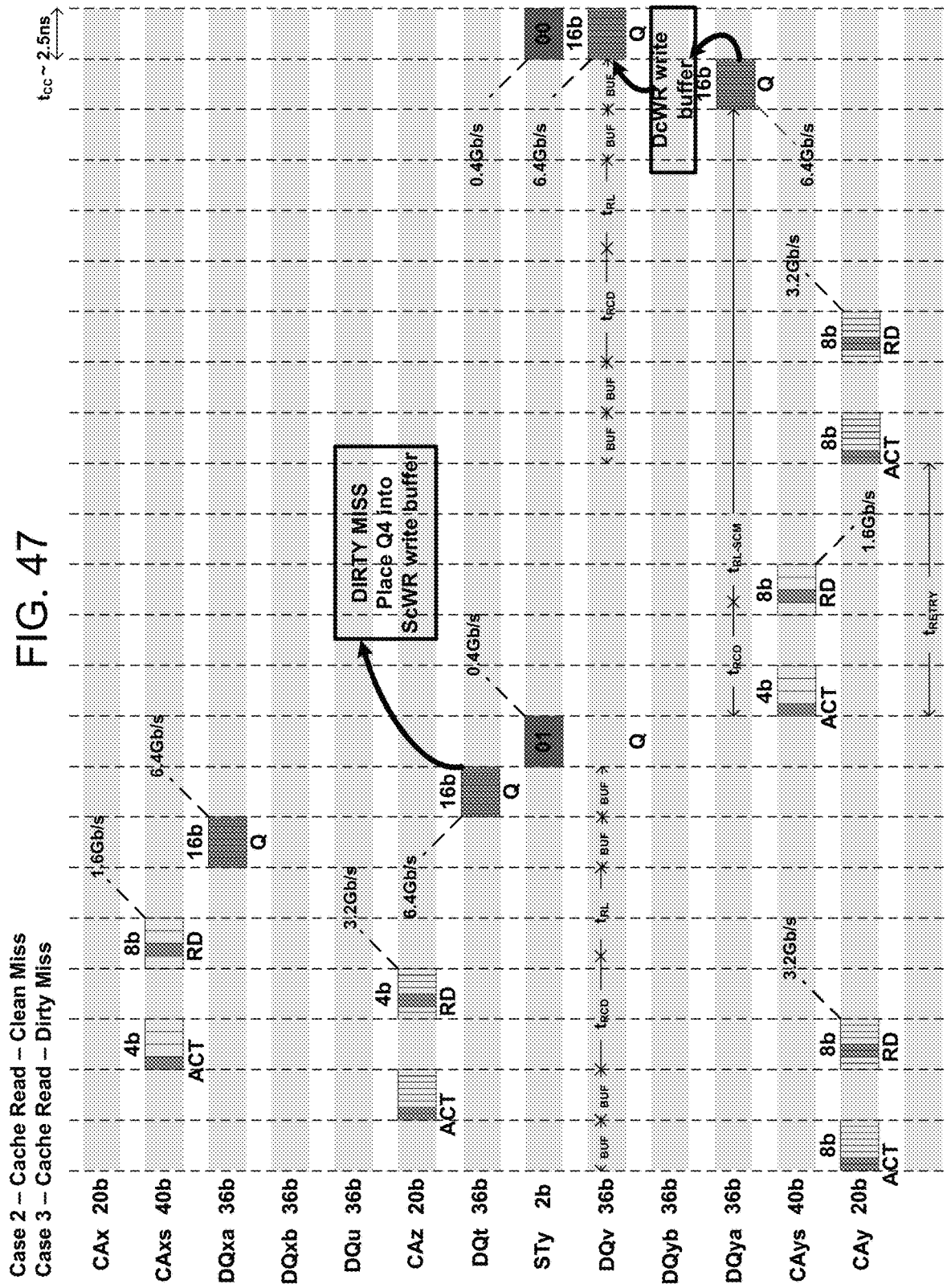

FIGS. 46 and 47 illustrate timing diagrams with operations associated with cache read hit and miss conditions, for the system shown in FIG. 43.

Figure 48:
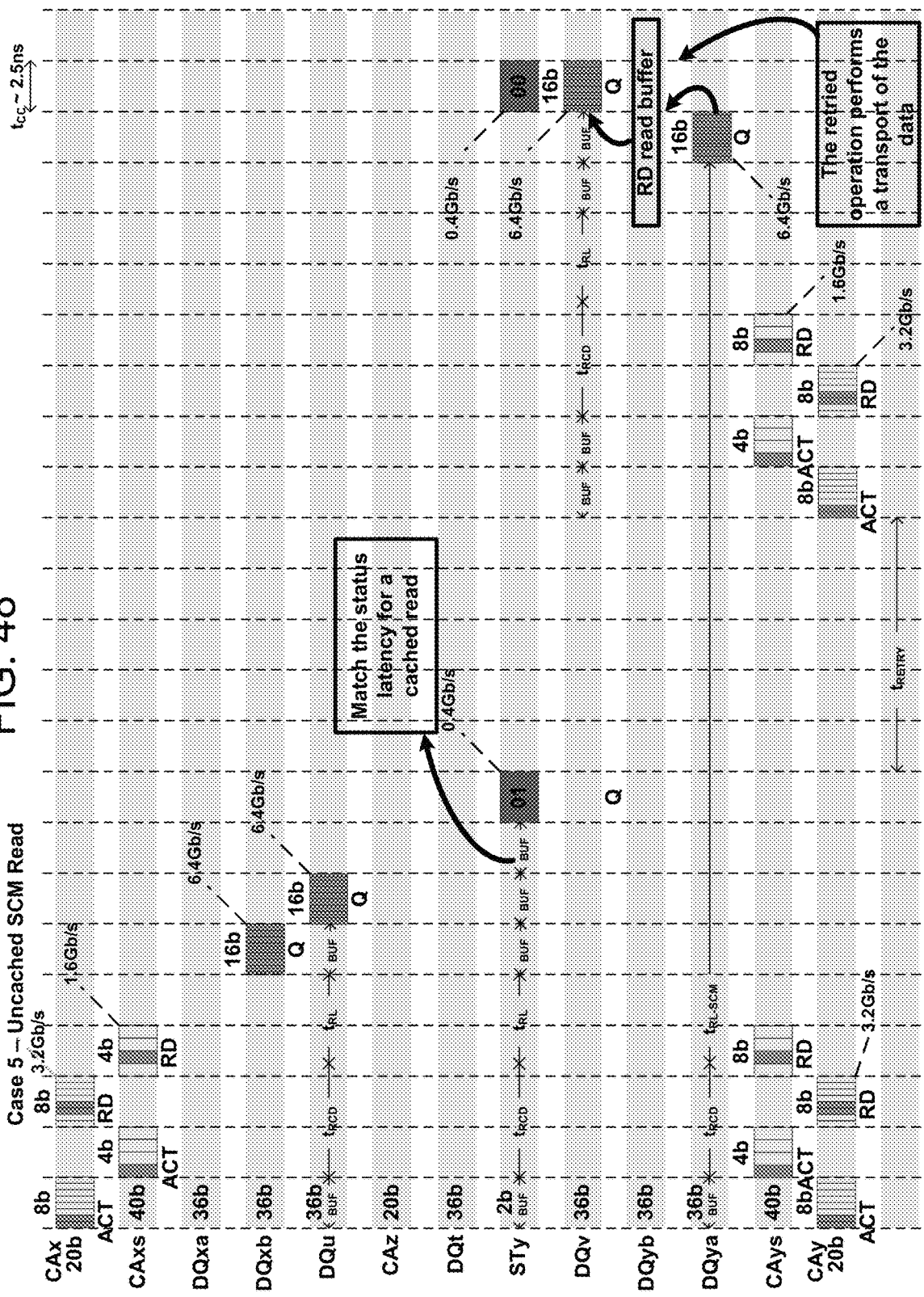

FIG. 48 illustrates a timing diagram with operations associated with uncached DRAM and SCM memory read operations for the system of FIG. 43.

Figure 49:
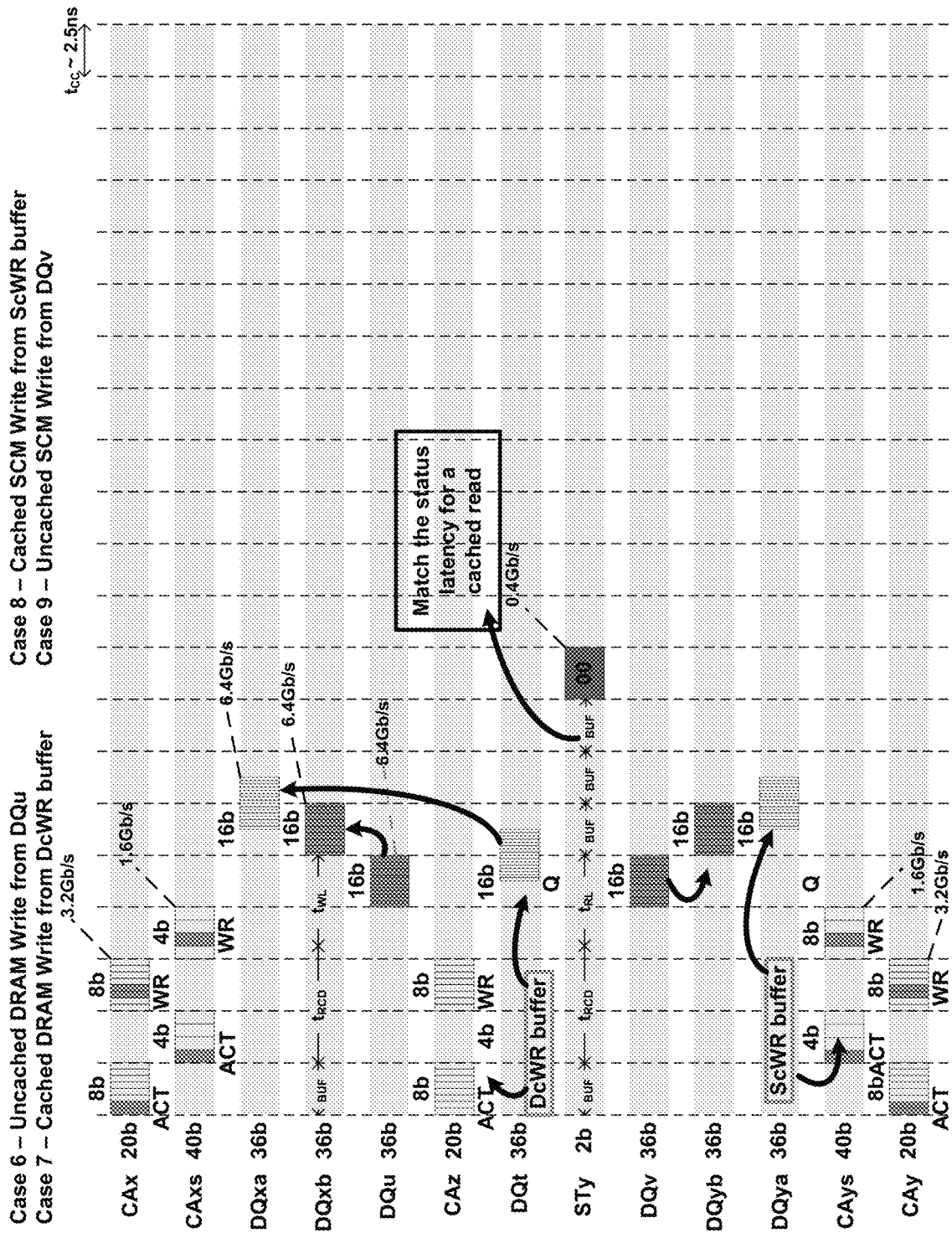

FIG. 49 illustrates a timing diagram with operations associated with both cached and uncached DRAM and SCM memory write operations for the system of FIG. 43.

Figure 50:
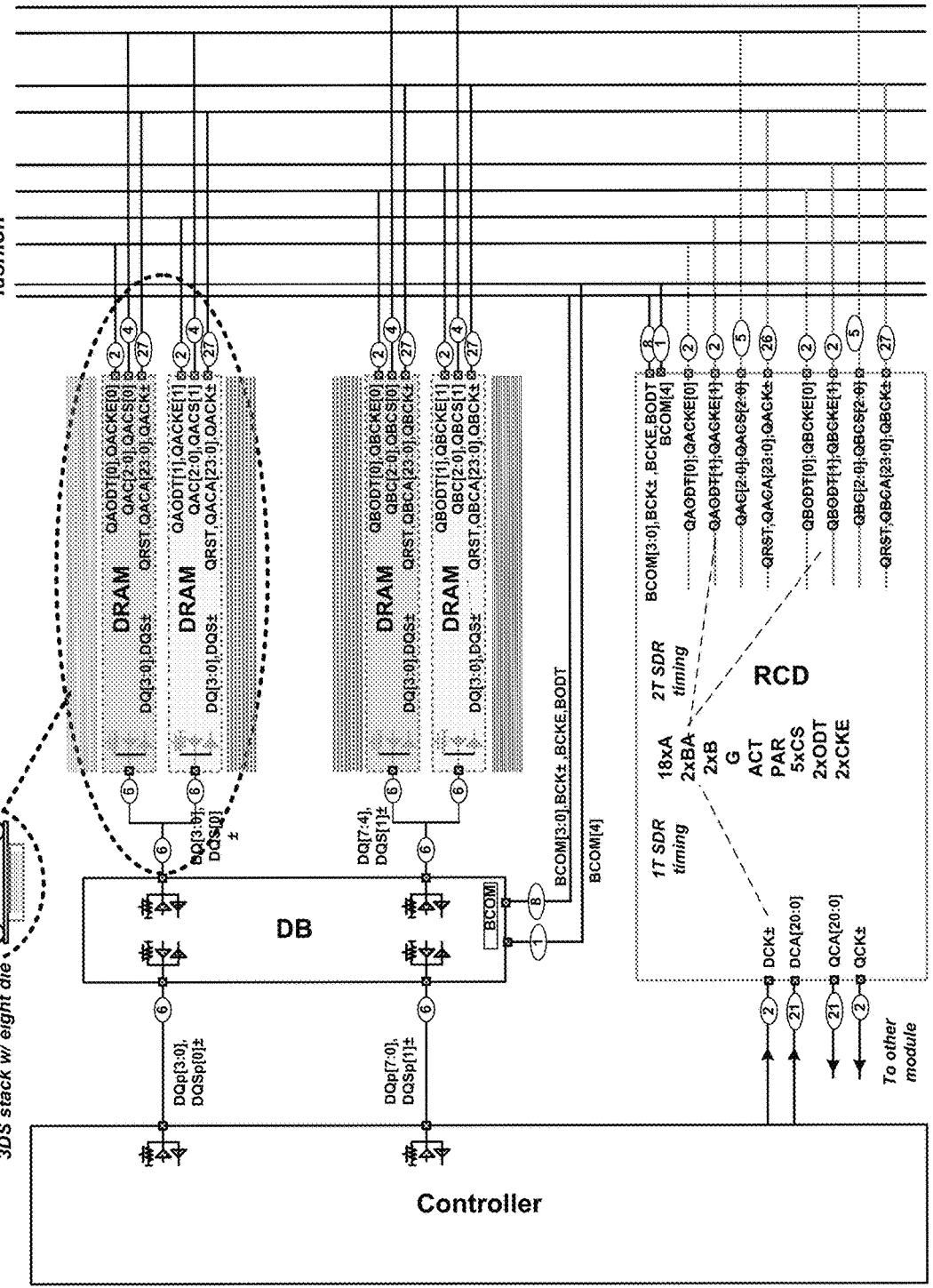
FIG. 50 illustrates further detail regarding DRAM package structure.

FIG. 50 illustrates further detail regarding DRAM package structure and various interconnections between the DRAM package and the data and CA buffer circuitry.

Figure 51:
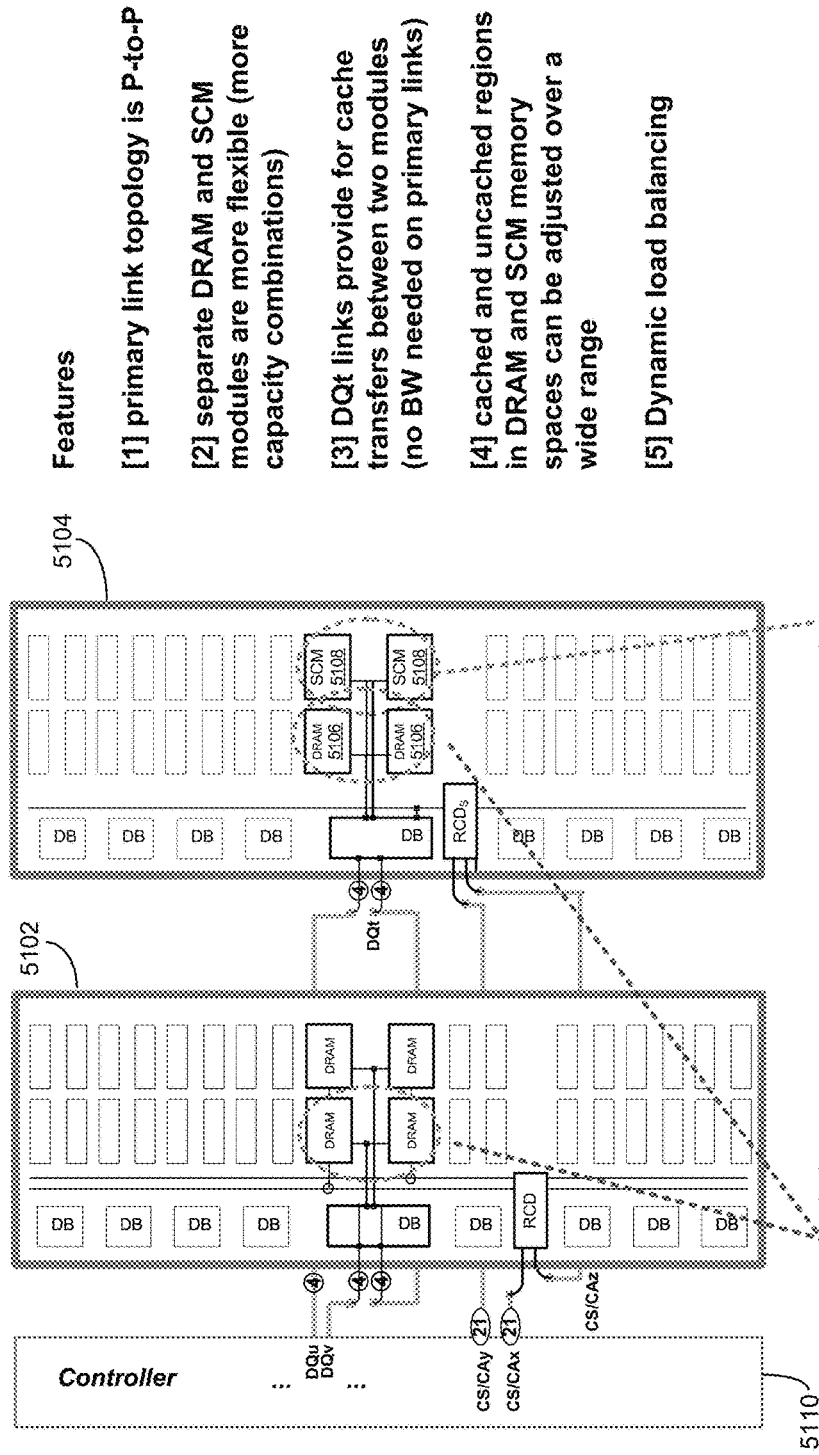
FIG. 51 illustrates a further system embodiment.

FIG. 51 illustrates a further system embodiment that employs a first DRAM memory module 5102, and a second memory module 5104 including both DRAM and SCM memory components 5106 and 5108. Similar to various other memory system configurations described herein, the memory modules 5102 and 5104 connect to a memory controller 5110 via point-to-point links, and connect to each other via a backchannel link DQt to provide for cache transfers between modules. This shows the FC2 system, first described in FIG. 2E.

Figure 52:
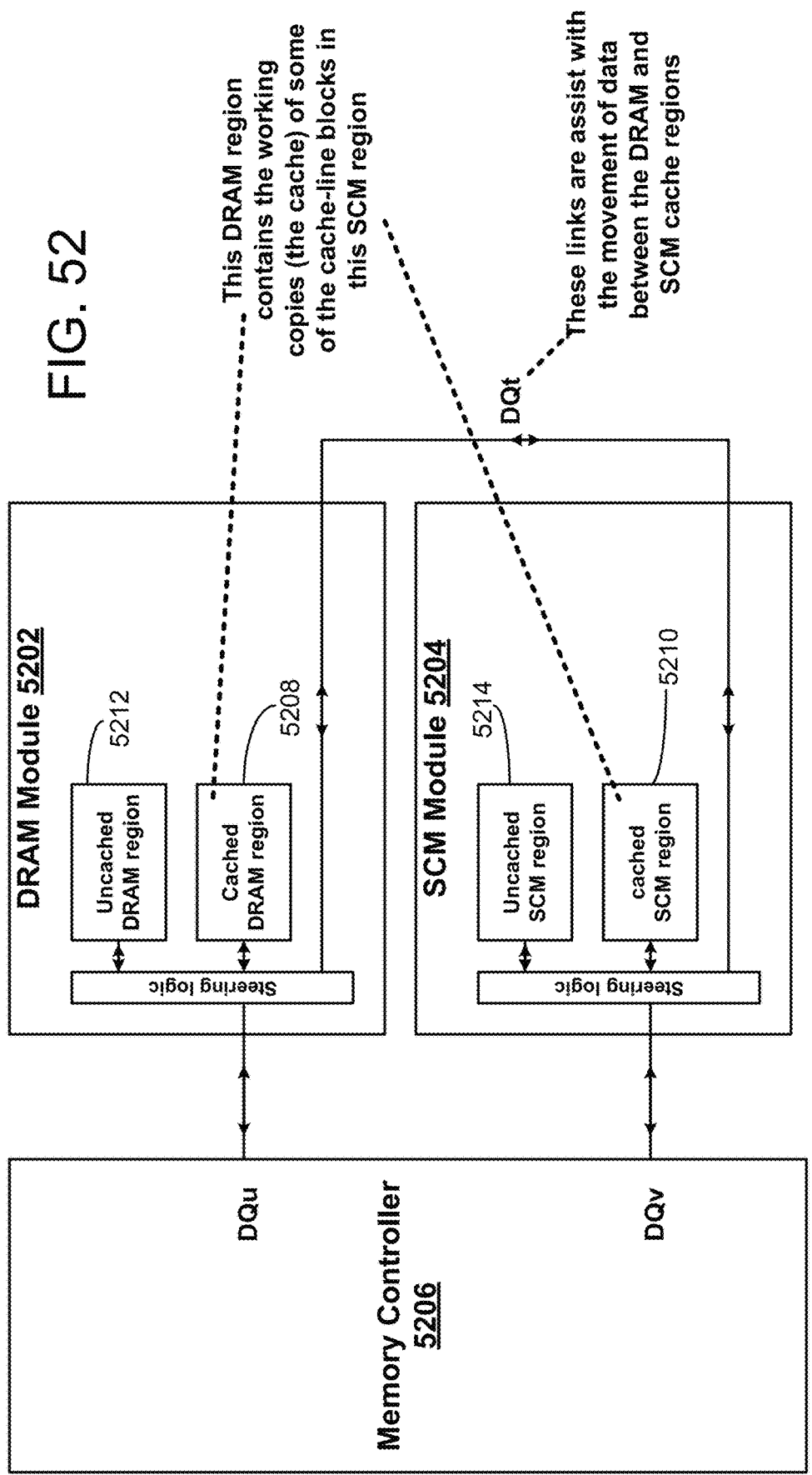
FIG. 52 illustrates a high-level system embodiment.

FIG. 52 illustrates a further high-level system embodiment similar to that shown in FIG. 43. This figure is applicable to all the previously discussed systems which employ DRAM and SCM memory regions. In this example there is one DRAM module 5202 and one SCM module 5204. Each module can be used by a memory controller 5206 with both a cached region such as at 5208 and 5210, and an uncached region, such as at 5212 and 5214. The region size can be set by a control register (not shown) at initialization. Accesses to the uncached region may generally involve an access to a single memory type. Accesses to the cached region of the SCM memory may generally involve accesses to the cached DRAM region, as described in the previous examples.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory module, comprising:
   memory including at least one memory component;
   buffer circuitry, the buffer circuitry configured to buffer operations between the memory and a memory controller, the buffer circuitry including:
   a primary interface for communicating directly with the memory controller;
   a secondary interface for communicating with the at least one memory component;
   a backchannel interface for establishing a backchannel link between the memory module and a second memory module; and
   wherein the memory module receives data for writing to the at least one memory component from the second memory module via the backchannel link.

2. The memory module of claim 1, wherein the buffer circuitry includes:
   data buffer circuitry; and
   wherein the backchannel interface includes backchannel data interface circuitry to transfer data between the data buffer circuitry and the second memory module.

3. The memory module of claim 1, wherein the buffer circuitry includes:
   address buffer circuitry; and
   wherein the backchannel interface includes backchannel address interface circuitry to transfer command/address (C/A) information between the address buffer circuitry and the second memory module.

4. The memory module of claim 1, wherein:
   the primary interface is to communicate directly with the memory controller via a point-to-point link.

5. The memory module of claim 1, wherein:
   at least a portion of the memory is allocated as cache for operations involving the second memory module; and
   wherein the backchannel interface is to carry out cache transfers between the memory module and the second memory module.

6. The memory module of claim 2, wherein:
   the backchannel interface is to transfer data between the memory controller and the memory module via the second memory module.

7. The memory module of claim 6, wherein:
   for a full transfer bandwidth configuration, all data transfer associated with the memory controller are directed to the memory module.

8. A buffer circuit for use on a memory module to buffer operations between memory disposed on the memory module and a memory controller, the buffer circuit comprising:
   a primary interface including a primary input/output (I/O) circuit for communicating with the memory controller over a primary signaling path;

a secondary interface including a secondary I/O circuit for communicating with the at least one memory component of the memory over a secondary signaling path;

backchannel interface circuitry for establishing a backchannel link between the memory module and a second memory module; and wherein the backchannel interface circuitry receives data for writing to the at least one memory component from the second memory module.

9. The buffer circuit of claim 8, wherein:

the primary interface comprises a primary data interface;

the secondary interface comprises a secondary data interface; and wherein the primary data interface, the secondary data interface, and the backchannel interface circuitry are formed on at least one data buffer integrated circuit (IC) chip.

10. The buffer circuit of claim 8, wherein:

the primary interface comprises a primary command/address (C/A) interface;

the secondary interface comprises a secondary C/A interface; and wherein the primary C/A interface, the secondary C/A interface, and the backchannel interface circuitry are formed on at least one address buffer integrated circuit (IC) chip.

11. The buffer circuit of claim 8, wherein:

the primary interface is to communicate directly with the memory controller via a point-to-point link.

12. The buffer circuit of claim 8, wherein:

the backchannel interface circuitry is to cache transfers between the memory module and the second memory module.

13. The buffer circuit of claim 8, wherein:

the backchannel interface circuitry is to transfer data between the memory controller and the memory module the second memory module.

14. The buffer circuit of claim 8, wherein:

the backchannel interface circuitry is to balance electrical loading between (1) the memory controller and the memory module, and (2) the memory controller and the second memory module.

15. A method of operating a buffer circuit, the method comprising:

communicating with a memory controller via a primary interface;

communicating with at least one memory component of a memory over a secondary interface; and establishing a backchannel link between a first memory module and a second memory module via a backchannel interface; and receiving data for writing to the at least one memory component from the second memory module via the backchannel interface.

16. The method of claim 15, wherein:

the communicating with a memory controller via a primary interface includes transferring data via a primary data path; and the communicating with at least one memory component of a memory over a secondary interface includes transferring the data via a secondary data path.

17. The method of claim 15, wherein:

the communicating with a memory controller via a primary interface includes transferring command/address (C/A) information via a primary C/A path; and the communicating with at least one memory component of a memory over a secondary interface includes transferring the C/A information via a secondary C/A path.

18. The method of claim 15, wherein the communicating with the memory controller comprises:

configuring the primary interface to communicate with the memory controller via a point-to-point link.

19. The method of claim 15, wherein establishing the backchannel link further comprises:

transacting cache transfers between the memory module and the second memory module.

20. The method of claim 15, wherein establishing the backchannel link further comprises:

balancing electrical loading between (1) the memory controller and the memory module, and (2) the memory controller and the second memory module.

* * * * *